(12) United States Patent
Fujii et al.

(10) Patent No.: US 7,582,904 B2
(45) Date of Patent: Sep. 1, 2009

(54) SEMICONDUCTOR DEVICE, DISPLAY DEVICE AND METHOD FOR MANUFACTURING THEREOF, AND TELEVISION DEVICE

(75) Inventors: Gen Fujii, Kanagawa (JP); Masafumi Morisue, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 610 days.

(21) Appl. No.: 11/271,800

(22) Filed: Nov. 14, 2005

(65) Prior Publication Data

US 2006/0113894 A1 Jun. 1, 2006

(30) Foreign Application Priority Data

Nov. 26, 2004 (JP) .............................. 2004-341400

(51) Int. Cl.
*H01L 33/00* (2006.01)
(52) U.S. Cl. .................................. 257/72; 257/E29.151
(58) Field of Classification Search .................. 257/40, 257/59, 359, 72, E29.151; 349/43
See application file for complete search history.

(56) References Cited

U.S. PATENT DOCUMENTS

| | | | |
|---|---|---|---|
| 6,426,787 B1 | 7/2002 | Satake et al. | |
| 6,433,487 B1 | 8/2002 | Yamazaki | |
| 6,555,969 B2 | 4/2003 | Yamazaki | |
| 6,707,521 B2 | 3/2004 | Satake et al. | |
| 6,858,865 B2 * | 2/2005 | Ahn et al. ..................... | 257/43 |
| 2003/0083203 A1 | 5/2003 | Hashimoto et al. | |
| 2003/0183019 A1* | 10/2003 | Chae ..................... | 73/862.624 |
| 2004/0000865 A1 | 1/2004 | Yamazaki | |
| 2004/0147113 A1 | 7/2004 | Yamazaki et al. | |
| 2004/0166790 A1* | 8/2004 | Balijepalli et al. ........ | 451/526 |
| 2005/0121675 A1 | 6/2005 | Maekawa et al. | |
| 2005/0217722 A1* | 10/2005 | Komatsu et al. ............ | 136/263 |
| 2006/0115983 A1* | 6/2006 | Fujii et al. .................. | 438/640 |
| 2006/0125133 A1* | 6/2006 | Huh et al. .................... | 264/41 |
| 2006/0194075 A1* | 8/2006 | Miyamoto et al. .......... | 428/690 |
| 2007/0090346 A1* | 4/2007 | Jeong et al. .................. | 257/40 |
| 2008/0008822 A1* | 1/2008 | Kowalski et al. ............ | 427/58 |

FOREIGN PATENT DOCUMENTS

JP 11-251259 9/1999

\* cited by examiner

*Primary Examiner*—Nathan W Ha
(74) *Attorney, Agent, or Firm*—Nixon Peabody LLP; Jeffrey L. Costellia

(57) ABSTRACT

The purpose of the present invention is to provide a semiconductor device or a display device that can be manufactured by improving the use efficiency of a material as well as simplifying the manufacturing process, and a manufacturing technique of those devices. Also, another purpose of the present invention is to provide a technique for forming a pattern of wirings, etc., constituting the semiconductor device or the display device, in a desired shape and with good adhesiveness. The adhesiveness between first and second conductive layers is increased by forming a conductive buffer layer including at least one pore between them. The second conductive layer is formed by filling the pores of the buffer layer including at least one pore with a particle shaped conductive material which is solidified by baking. The conductive layer solidified in the pores functions like a wedge, and the second conductive layer is formed over the first conductive layer with good adhesiveness and stability.

17 Claims, 29 Drawing Sheets

117

117

100 μm

90

91

97

93

94

95

96

SEMICONDUCTOR DEVICE, DISPLAY DEVICE AND METHOD FOR MANUFACTURING THEREOF, AND TELEVISION DEVICE

BACKGROUND OF THE INVENTION

1. Field of Invention

The present invention relates to a semiconductor device, a display device and a method for manufacturing thereof, and a television device.

2. Description of the Related Art

A thin film transistor (hereinafter also referred to as a "TFT") and an electric circuit using the thin film transistor are formed by stacking various kinds of thin films such as a semiconductor, an insulator and a conductor over a substrate, and appropriately patterning into a predetermined shape using photolithography technique. Photolithography technique is a technique in which a pattern of a circuit or the like, which is formed on a transparent plane plate called a photomask using a non-light-transmitting material, is transferred to an intended substrate by utilizing light. The photolithography technique is widely used in a process of manufacturing a semiconductor integrated circuit, and the like.

The conventional manufacturing process using photolithography technique requires multiple steps such as exposure, development, baking and peeling only for treating a mask pattern, which is formed by using a photosensitive organic resin material which is referred to as a photoresist. Therefore, the manufacturing cost is inevitably increased with the increase of the number of photolithography steps. In order to solve this problem, it has been attempted to manufacture TFTs by reducing the number of photolithography steps (For example, Japanese Patent Application Laid-Open No. H 11-251259).

SUMMARY OF THE INVENTION

It is an object of the present invention to provide a technique for manufacturing a TFT, an electronic circuit using the TFT and a display device formed using the TFT, even over a large substrate having 1 m or more on a side at low cost and with high yield by reducing the number of photolithography steps and simplifying the manufacturing process.

Further, another object of the invention is to provide a technique for forming a component such as a wiring constituting a part of such a semiconductor device and a display device to have a desired shape with good adhesiveness.

In the present invention, the adhesiveness between a first conductive layer and a second conductive layer is increased by forming a buffer layer including at least one pore between them. A pore contained in the buffer layer including at least one pore is filled with a particle shaped conductive material, and is solidified by baking, and then a second conductive layer is formed. The second conductive layer is formed with good adhesiveness and stability with the first conductive layer by anchoring effect (also referred to as anchor effect), in which the conductive layer solidified in the pore has a function like a needle or a wedge.

Note that a semiconductor device in this specification means a device which can function by using semiconductor properties. A semiconductor device such as a multilayer wiring layer or a chip including a processor circuit (hereinafter also referred to as a processor chip) can be manufactured by using the present invention.

The present invention can also be applied to a display device having display function. A display device using the present invention includes a light emitting display device including a TFT connected to a light emitting element in which an organic substance producing luminescence called electroluminescence (hereinafter also referred to as an "EL") or a layer including a mixture of an organic substance and an inorganic substance is interposed between electrodes, or a liquid crystal display device in which a liquid crystal element having a liquid crystal material is used as a display element, and the like.

One feature of the present invention is a semiconductor device including a first conductive layer; a second conductive layer; and a conductive buffer layer including at least one pore provided between the first and the second conductive layers, wherein the inside of the pore of the buffer layer including at least one pore is filled by a portion of the second conductive layer.

One feature of the present invention is a semiconductor device including a semiconductor layer including a source region and a drain region; source and drain electrode layers; a conductive buffer layer including at least one pore provided between the semiconductor layer and the source and drain electrode layers, wherein the inside of the pore of the buffer layer including at least one pore is filled by a portion of the source and drain electrode layers.

One feature of the present invention is a semiconductor device including a gate electrode layer; a gate insulating layer; a semiconductor layer; a semiconductor layer having one conductivity; a source electrode layer and a drain electrode layer; a conductive buffer layer including at least one pore provided between the semiconductor layer having one conductivity and the source and drain electrode layers, wherein the inside of the pore of the buffer layer including at least one pore is filled by a portion of the source and drain electrode layers.

One feature of the present invention is a display device including a semiconductor layer including a source region and a drain region; a source electrode layer and a drain electrode layer; a conductive buffer layer including at least one pore provided between the semiconductor layer and the source and drain electrode layers; a pixel electrode layer electrically connected to the source or the drain electrode layer; wherein the inside of the pore of the buffer layer including at least one pore is filled by a portion of the source and drain electrode layers.

One feature of the present invention is a display device including a gate electrode layer; a gate insulating layer; a semiconductor layer; a semiconductor layer having one conductivity; a source electrode layer and a drain electrode layer; a conductive buffer layer including at least one pore provided between the semiconductor layer having one conductivity and the source and drain electrode layers; a pixel electrode layer electrically connected to the source or the drain electrode, wherein the inside of the pore of the buffer layer including at least one pore is filled by a portion of the source and drain electrode layers.

One feature of the present invention is a display device including a semiconductor layer including a source region and a drain region; a source electrode layer and a drain electrode layer; a conductive buffer layer including at least one pore provided between the semiconductor layer and the source and drain electrode layers; a first electrode layer electrically connected to the source or the drain electrode layer; an electroluminescent layer; a second electrode layer, wherein the inside of the pore of the buffer layer including at least one pore is filled by a portion of the source and drain electrode layers.

One feature of the present invention is a display device including a gate electrode layer; a gate insulating layer; a semiconductor layer; a semiconductor layer having one conductivity; a source electrode layer and a drain electrode layer; a conductive buffer layer including at least one pore provided between the semiconductor layer having one conductivity and the source and drain electrode layers; a first electrode layer electrically connected to the source or the drain electrode layer; an electroluminescent layer; a second electrode layer, wherein the inside of the pore of the buffer layer including at least one pore is filled by a portion of the source and drain electrode layers.

One feature of the present invention is a television device including a display screen having a display device including a semiconductor layer including a source region and a drain region; a source electrode layer and a drain electrode layer; a conductive buffer layer including at least one pore provided between the semiconductor layer and the source and drain electrode layers; a pixel electrode layer electrically connected to the source or the drain electrode layer, wherein the inside of the pore of the buffer layer including at least one pore is filled by a portion of the source and drain electrode layers.

One feature of the present invention is a television device including a display screen having a display device including a gate electrode layer; gate insulating layer; a semiconductor layer; a semiconductor layer having one conductivity; a source electrode layer and a drain electrode layer; a conductive buffer layer including at least one pore provided between the semiconductor layer and the source and drain electrode layers; a pixel electrode layer electrically connected to the source or the drain electrode layer, wherein the inside of the pore of the buffer layer including at least one pore is filled by a portion of the source and drain electrode layers.

One feature of the present invention is a television device including a display screen having a display device including a semiconductor layer including a source region and a drain region; a source electrode layer and a drain electrode layer; a conductive buffer layer including at least one pore provided between the semiconductor layer and the source and drain electrode layers; a first electrode layer electrically connected to the source or the drain electrode layer; an electroluminescent layer; a second electrode layer, wherein the inside of the pore of the buffer layer including at least one pore is filled by a portion of the source and drain electrode layers.

One feature of the present invention is a television device including a display screen having a display device including a gate electrode layer; a gate insulating layer; a semiconductor layer; a semiconductor layer having one conductivity; a source electrode layer and a drain electrode layer; a conductive buffer layer including at least one pore provided between the semiconductor layer having one conductivity and the source and drain electrode layers; a first electrode layer electrically connected to the source or the drain electrode layer; an electroluminescent layer; a second electrode layer, wherein the inside of the pore of the buffer layer including at least one pore is filled by a portion of the source and drain electrode layers.

One feature of the present invention is a method for manufacturing a semiconductor device including the steps of forming a first conductive layer; forming a conductive buffer layer including at least one pore over the first conductive layer; and filling inside of the pore of the buffer layer including at least one pore with a composition containing a conductive material and forming a second conductive layer on the buffer layer including at least one pore.

One feature of the present invention is a method for manufacturing a semiconductor device including the steps of forming a first conductive layer; forming a conductive buffer layer including at least one pore over the first conductive layer; and filling inside of the pore of the buffer layer including at least one pore with a composition containing a conductive material, solidifying the composition, and forming a second conductive layer on the buffer layer including at least one pore.

One feature of the present invention is a method for manufacturing a semiconductor device including the steps of forming a semiconductor layer including source and drain regions; forming a conductive buffer layer including at least one pore over the source and drain regions; and filling inside of the pore of the buffer layer including at least one pore with a composition containing a conductive material and forming a source electrode layer and a drain electrode layer on the buffer layer including at least one pore.

One feature of the present invention is a method for manufacturing a semiconductor device including the steps of forming a semiconductor layer including source and drain regions; forming a conductive buffer layer including at least one pore over the source and drain regions; and filling inside of the pore of the buffer layer including at least one pore with a composition containing a conductive material, solidifying a composition, and forming a source electrode layer and a drain electrode layer on the buffer layer including at least one pore.

One feature of the present invention is a method for manufacturing a semiconductor device including the steps of forming a semiconductor layer including source and drain regions; forming a conductive buffer layer including at least one pore over the source and drain regions; filling inside of the pore of the buffer layer including at least one pore with a composition containing a conductive material, and forming a source electrode layer and a drain electrode layer on the buffer layer including at least one pore; and forming a pixel electrode layer electrically connected to the source or the drain electrode layer.

One feature of the present invention is a method for manufacturing a semiconductor device including the steps of forming a semiconductor layer including source and drain regions; forming a conductive buffer layer including at least one pore over the source and drain regions; filling inside of the pore of the buffer layer including at least one pore with a composition containing a conductive material, solidifying the composition, and forming a source electrode layer and a drain electrode layer on the buffer layer including at least one pore; and forming a pixel electrode layer electrically connected to the source or the drain electrode layer.

One feature of the present invention is a method for manufacturing a semiconductor device including the steps of forming a semiconductor layer including source and drain regions; forming a conductive buffer layer including at least one pore over the source and drain regions; filling inside of the pore of the buffer layer including at least one pore with a composition containing a conductive material, and forming a source electrode layer and a drain electrode layer on the buffer layer including at least one pore; forming a first electrode layer electrically connected to the source or drain electrode layer; forming an electroluminescent layer over the first electrode layer; and forming a second electrode layer over the electroluminescent layer.

One feature of the present invention is a method for manufacturing a semiconductor device including the steps of forming a semiconductor layer including source and drain regions; forming a conductive buffer layer including at least one pore over the source and drain regions; filling inside of the pore of the buffer layer including at least one pore with a composition containing a conductive material, solidifying the composition, and forming a source electrode layer and a drain electrode layer on the buffer layer including at least one pore; forming a first electrode layer electrically connected to the source or the drain electrode layer; forming an electroluminescent layer over the first electrode layer; and forming a second electrode layer over the electroluminescent layer.

The present invention enables conductive films to be formed with good adhesiveness to each other. In addition, material loss and costs can be reduced. Therefore, a semiconductor device and a display device having high performance and high reliability can be manufactured with high yield.

DETAILED DESCRIPTION OF THE INVENTION

BEST MODE FOR CARRYING OUT THE INVENTION

Figure 1A:
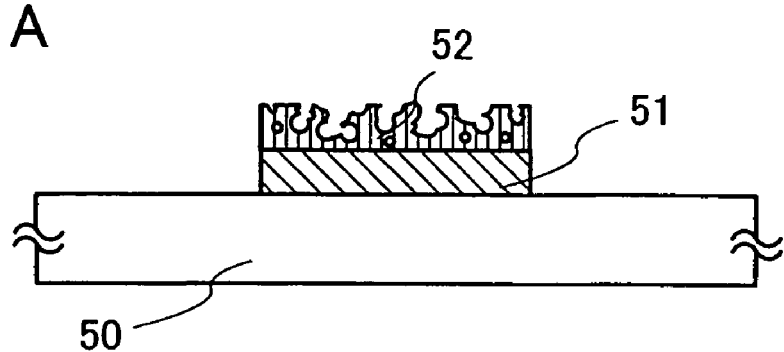
FIGS. 1A to 1C are schematic diagrams describing the present invention.

Embodiment Modes of the present invention will be described in detail with reference to the accompanying drawings. However, the present invention is not limited to the following description, and it is easily understood by those skilled in the art that various changes and modifications are possible, unless such changes and modifications depart from the spirit and the scope of the present invention. Therefore, the present invention is to be interpreted without limitation to the following description in Embodiment Modes. In addition, in structures of the present invention described hereinafter, the same reference numerals denote the same portions or portions having similar functions in different drawings, and the explanation will not be repeated.

Embodiment Mode 1

Embodiment Mode of the present invention will be described with reference to FIGS. 1A to 1C and FIGS. 2A to 2D.

The characteristic of the present invention is that, to manufacture a semiconductor device or a display device, at least one or more of the components necessary for manufacturing the semiconductor device or the display device, such as a conductive layer forming a wiring layer or an electrode, and a mask layer for forming a predetermined pattern, is formed by a method in which such components can be selectively formed in a desired shape. In the present invention, a component (also referred to as a pattern) means a conductive layer such as a wiring layer, a gate electrode layer, a source electrode layer, a drain electrode layer; a semiconductor layer; a mask layer; an insulating layer, and the like constituting a thin film transistor or a display device, and all component elements formed in a predetermined shape are included. As a method for forming a formation in a desired pattern selectively, a droplet discharge (jet) method (also referred to as an ink jet method depending on its method) in which a droplet of a composition prepared for a specific purpose is discharged (jetted) selectively and a conductive layer, an insulating layer, or the like with a predetermined pattern can be formed is used. In addition, a method in which a component can be transferred or written to a desired pattern, for example, various kinds of printing methods (for example, a screen (pore plate) printing, an offset (planography) printing, a relief printing, a gravure (copperplate) printing, and the like in which a component can be formed in a desired shape), a selective coating method and the like can be used.

A method in which a composition containing a component forming material that is fluid is discharged (jetted) as a droplet to form a desired pattern is used in this embodiment mode. A droplet containing a component forming material is discharged in a formation region of the component, baked, and solidified by drying, etc. to form a component in a desired pattern.

Figure 3:
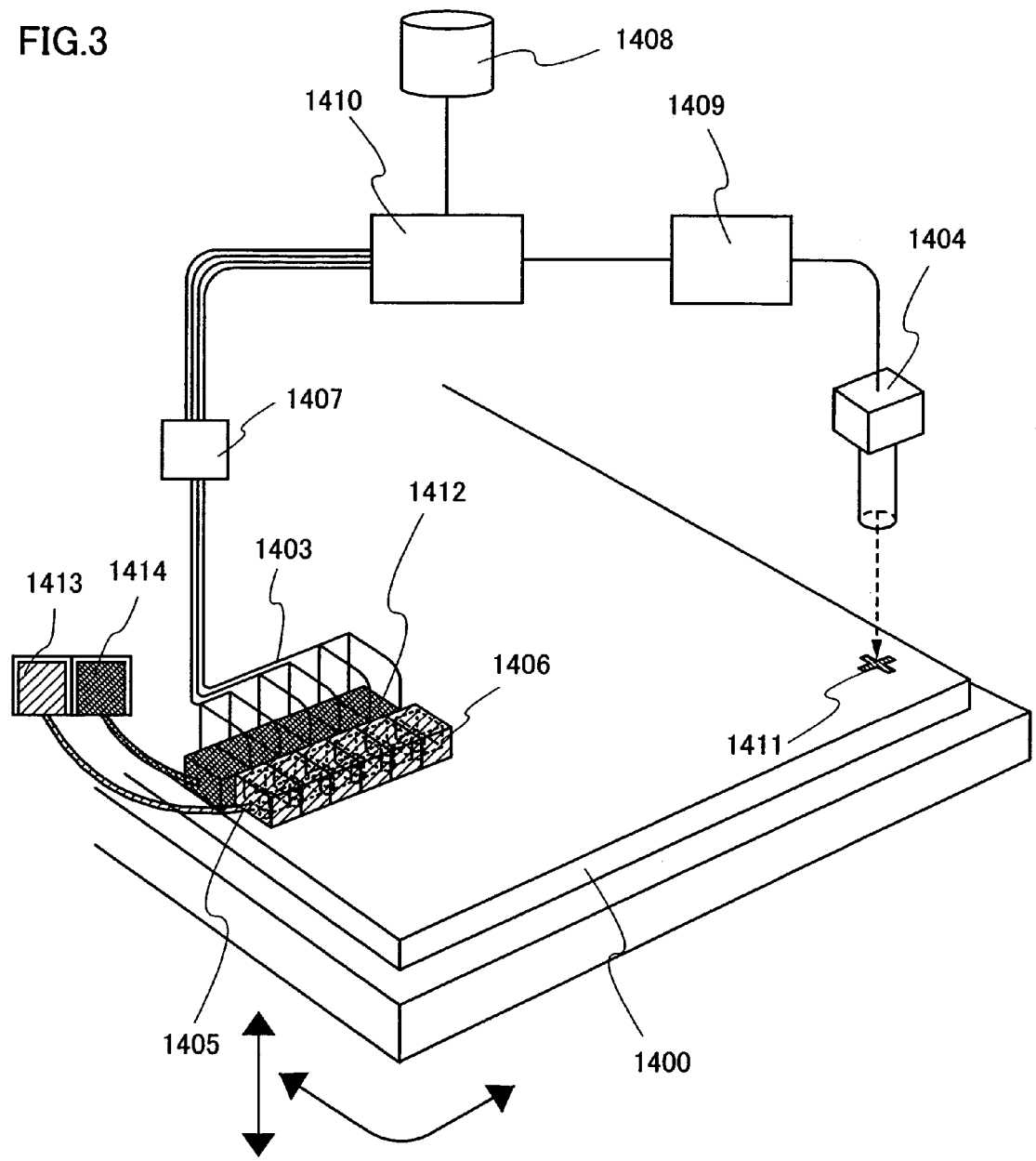
FIG. 3 is a diagram describing a structure of a droplet discharging device which can be applied to the present invention.

One mode of a droplet discharging device used for a droplet discharge method is shown in FIG. 3. Each head 1405 and 1412 of a droplet discharging device 1403 are connected to a controlling means 1407. By controlling the respective heads using a computer 1410, a pattern that has been programmed by the computer in advance can be written. The alignment of writing is, for example, may be determined in accordance with a marker 1411 formed over a substrate 1400. Alternatively, the edge of the substrate 1400 may be used as a reference point to determine the alignment of writing. The reference point is detected by an imaging means 1404, and converted into a digital signal by an image processing means 1409. When the digital signal is recognized by the computer 1410, a control signal is generated and sent to the controlling means 1407. As the imaging means 1404, an image sensor or the like utilizing a charge-coupled device (CCD) or a complementary metal oxide semiconductor can be used. It is needless to say that information of the pattern to be formed over the substrate 1400 is stored in a recording medium 1408. The control signal is sent to the controlling means 1407 based on the information of the pattern so that each head 1405 and 1412 of the droplet discharging means 1403 can be controlled individually. A material to be discharged is supplied to the heads 1405, 1412 from material supply sources 1413, 1414 through a piping.

In the head 1405, there are a space filled with a liquid material, as shown by dotted lines 1406, and a nozzle that is a discharging opening. Although not shown in the drawings, the head 1412 has the same inner structure as the head 1405. Different materials can be written to have different widths at the same time, by providing the nozzles of the heads 1405 and 1412 in different sizes. A conductive material, an organic material, an inorganic material, and the like can be discharged individually through one head to write a pattern. When a pattern is written in a large area such as an interlayer film, a same material can be discharged at the same time through a plurality of nozzles so that throughput can be improved. In a case of using a large substrate, the heads 1405 and 1412 can scan freely over the substrate in the direction of arrows, and therefore, the area to be written can be set freely. Accordingly, a plurality of same patterns can be written over one substrate.

A concept of Embodiment Mode of the present invention will be described with reference to FIGS. 1A to 1C and FIGS. 2A and 2D, using a formation method of a wiring layer.

In a case of forming a conductive layer by a droplet discharge method, a conductive layer is formed as follows: a composition containing a particle shaped conductive material is discharged, and fused or welded and joined by baking to solidify the composition. Since the composition containing a conductive material is attached to a formation region by discharging, the composition is formed including a solvent and a conductive particle to have fluid. As for a conductive layer formed by discharging a composition containing a conductive material and baking it, the conductive layer is not dense, has a defect, and adhesion to an insulating surface that is a subject object (a formation substance) is poor on occasions. In addition, it is necessary that a conductive layer has enough conductivity with the subject object and is electrically connected to the subject object, for example, a connection between a semiconductor layer and a conductive layer, a connection between electrode layers, a wiring layer electrically connected among conductive layers through a contact hole.

Such defects in adhesiveness cause electric defects and reduction in reliability of a thin film transistor, a display device, or the like to be manufactured. As a method for improving its reliability, a buffer layer having an effect to improve the adhesiveness is formed in the present invention.

A buffer layer used in the present invention is formed between a first conductive layer and a second conductive layer that are electrically connected to each other. The buffer layer improves the adhesiveness between the first conductive layer and the second conducive layer. Therefore, the buffer layer has conductivity, and has pores (air hole) inside its layer or on its surface. The pores existing on the surface and inside of the buffer layer can fix a conductive material that is solidified after a particle shaped conductive material attached on the surface enters, fills, and is baked. In this specification, a space in which a conductive material is included on the surface or inside of such a buffer layer and the solidified conductive layer is held and fixed, is generally called a pore. The size of the pore of the buffer layer may be big enough that a particle of a conductive material discharged to the buffer layer can enter. An effect that a conductive material is firmly fixed on the surface of the buffer layer by the pore (also referred to as adhesion force, fixing strength) may be occurred. Therefore, the size of the pore depends on the size of an opening portion of the pore and a particle of the conductive material to be discharged, and the size of the opening portion may be bigger than the size of the particle contained in the conductive material. In addition, the pore does not have a specific shape, and a shape having a curvature and a sharp-pointed shape like a needle may be used as long as there are one or more opening portions through which the conductive material passes. The number of pores included in the buffer layer including at least one pore may be single or multiple, and a portion of the pore or all of the pores may be connected to each other to be integrated. A shape, in which a particle of the conductive material filling the pore is solidified, depends on the shape of the pore. Therefore, the shape of at least one or more portions of the pore is preferably bigger toward the lower (inner) part of the layer so that the solidified conductive layer functions like a wedge or an anchor to the buffer layer and that the improvement of the adhesiveness can be obtained. The conductive layer can be fixed more firmly and can be prevented from being peeled or removed when the pore has a complicated shape such as constriction or polygon having a plurality of planes.

The buffer layer preferably has a large number of pores since it enables an ability to adhere a conductive material to increase and also the adhesiveness to improve. Such a property having a large number of pores (air hole) is referred to as porousness, and a material having a large number of pores is referred to as porous substance. The porous substance is characterized by a ratio of pores in the substance (porosity), distribution of a pore size, and the shape of a pore. The size of a pore is different depending on the substance, and a pore is classified into three types: micropore having a size of 2 nm or less, mesopore having a size of from 2 to 50 nm, and a macropore having a size of 50 nm or more. The size of a pore may be selected to be bigger than a particle attached to the conductive material so that a particle of a conductive material can enter a pore. In addition, the porous substance has some types, from micropore substance to porous substance, depending on the porosity. However, in the present invention, any layers (films) having a pore and a function to keep a solidified conductive layer can be used as a buffer layer regardless of its porosity.

A conductive material enters pores included in the buffer layer in several ways, for example, a way that the conductive material enters the pores in the buffer layer by a capillary phenomenon, or a way to absorb a discharged material depending on the electric state of the surface of the buffer layer. However, the present invention is not limited to the ways.

Figure 1B:
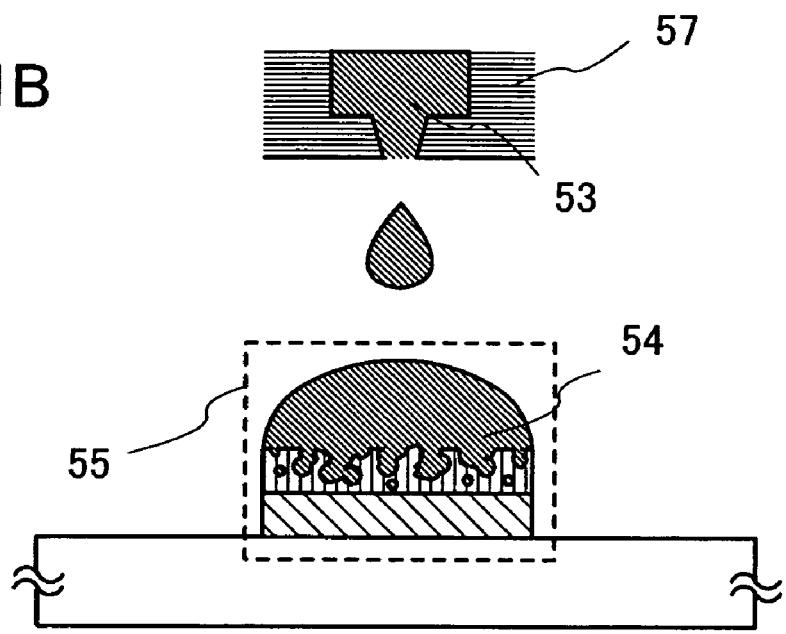
Figure 1C:
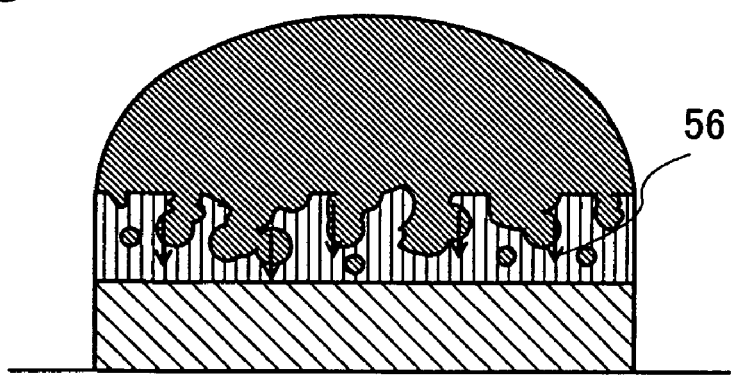

As shown in FIGS. 1A to 1C, a first conductive layer 51 and a buffer layer 52 are formed over a substrate 50. As shown in FIG. 1A, the buffer layer 52 includes various types of pores, and is conductive. A conductive material filling a droplet discharging device 57 is processed minutely into a particle shape, and is mixed into a solvent to be liquid. Such a composition 53 containing a liquid conductive material is discharged (jetted) from the droplet discharging device 57, and then is attached to the buffer layer 52. Then, a second conductive layer 54 is formed by drying and baking (FIG. 1B).

FIG. 1C is an enlarged view of a stacked layer 55 in which the first conductive layer 51, the buffer layer 52 and the second conductive layer 54 are formed over the substrate 50 are shown. Particles of the conductive material included in the composition 53 containing the liquid conductive material fill the inside of a plurality of pores of the buffer layer 52. The conductive material filling the pores is dissolved, cohered inside the pores and is solidified in the shape of the pores in the later steps of drying and baking. A conductive layer formed by being solidified has an ability to hold the second conductive layer within the pores, as shown by an arrow 56, and the conductive layer in the pores functions like a wedge or an anchor for the entire second conductive layer. Thus, the second conductive layer 54 is firmly attached to the buffer layer 52. Since a material for the buffer layer 52 can be freely selected as long as it is a conductive material, a material having good adhesiveness to the first conductive layer 51, may be selected. By the present invention, the first conductive layer 51 and the second conductive layer 54 can be formed with good adhesiveness and stability by interposing the buffer layer 52 therebetween, even if the adhesiveness between the first conductive layer 51 and the second conductive layer 54 is poor. In addition, the buffer layer 52 has conductivity; therefore the conductivity between the first conductive layer 51 and the second conductive layer 54 can be generated, and can be electrically connected to each other.

In this embodiment mode, the second conductive layer 54 is formed with a droplet discharge means. In addition, in this embodiment mode, a droplet discharge method is used to selectively form the first conductive layer 51 and the buffer layer 52. It is needless to say that the first conductive layer 51 and the buffer layer 52 can be formed to have a desired shape by etching. The droplet discharge means refers to all means discharging a droplet, such as a nozzle having a discharging opening for a composition, or a head having one or a plurality of nozzles. The diameter of the nozzle included in the droplet discharge means is set to be 0.02 to 100 µm (preferably 30 µm or less), and the discharge amount of a composition discharged from the nozzle is set to be 0.001 to 100 pl (preferably 0.1 pl or more to 40 pl or less, more preferably 10 pl or less). The discharge amount is increased in proportion to the size of the diameter of the nozzle. In addition, the distance between an object and the discharging opening of the nozzle is preferably as small as possible, so that a droplet can be discharged to a desired position, preferably approximately 0.1 to 3 mm (more preferably 1 mm or less).

As for the composition to be discharged from the discharging opening, a conductive material dissolved or dispersed in a solvent is used. The conductive material may be fine particles or dispersed nanoparticles of a metal such as Ag, Au, Cu, Ni, Pt, Pd, Ir, Rh W, or Al; sulfide of a metal such as Cd or Zn; an oxide of Fe, Ti, Si, Ge, Zr, Ba, or the like; or silver halide. The conductive material may be indium tin oxide (ITO), ITSO including indium tin oxide and silicon oxide, organic indium, organotin, zinc oxide, titanium nitride, or the like, which is used for a transparent conductive film. As for the conductive material, particles of a single element or a plurality of elements can be mixed to be used. However, as for the composition to be discharged from the discharging opening, it is preferable to use any one of the materials of gold, silver, and copper, which is dissolved or dispersed into a solvent, in view of the resistance value. It is more preferable to use silver or copper having a low resistance value. When silver or copper is used, a barrier film may be additionally provided as a countermeasure against impurities. As the barrier film, a silicon nitride film or nickel boron (NiB) can be used.

In addition, a particle in which a conductive material is surrounded by another conductive material to form a plurality of layers may be used. For example, a three-layer structure particle in which the surrounding copper is coated with nickel boron (NiB) and is further coated with silver may be used. As for the solvent, esters such as butyl acetate and ethyl acetate; alcohols such as isopropyl alcohol and ethyl alcohol; organic solvents such as methyl ethyl ketone and acetone; or water is used. The viscosity of the composition is preferably 20 mPa·s or less. This prevents the composition from being dried, or enables the composition to be smoothly discharged from the discharging opening. The surface tension of the composition is preferably 40 mN/m or less. The viscosity or the like of the composition may be appropriately adjusted depending on a solvent to be used and a use application. For example, the viscosity of a composition in which ITO, organic indium, or organotin is dissolved or dispersed in the solvent may be set from 5 to 20 mPa·s, the viscosity of a composition in which silver is dissolved or dispersed in the solvent may be set from 5 to 20 mPa·s, and the viscosity of a composition in which gold is dissolved or dispersed in a solvent may be set from 5 to 20 mPa·s.

The conductive layer may be formed by stacking a plurality of conductive materials. First, the conductive layer may be formed using silver as a conductive material by a droplet discharge method, and then it may be plated with copper or the like. Plating may be performed by an electroplating or a chemical (electroless) plating method. Plating may be performed by soaking a substrate surface into a container filled with a solution containing a plating material. The solution containing a plating material may be applied so that the solution flows over the substrate surface with the substrate placed obliquely (or vertically). When the plating is performed by applying a solution with the substrate placed vertically, there is an advantage that a device used in a process can be smaller even in a case of using a large substrate.

The diameter of a particle of a conductive material is preferably as small as possible for the purpose of preventing nozzles from being clogged and manufacturing a fine pattern, although it depends on the diameter of each nozzle, a desired pattern, and the like. Preferably, the diameter of the particle of the conductive material is 0.1 µm or less. The composition is formed by a known method, such as an electrolyzing method, an atomizing method or a wet reduction method, and the particle size to be obtained is typically about from 0.01 to 10

µm. However, when a gas evaporation method is employed, nanoparticles protected by a dispersant are minute, about 7 nm. Further, when the surface of each particle is covered with a coating agent, the nanoparticles do not aggregate in the solvent and are uniformly dispersed in the solvent at room temperature, and behaves similarly to liquid. Accordingly, it is preferable to use a coating agent.

In the present invention, when the composition is processed to have a desired pattern by utilizing the difference in wettability between the fluid composition and the periphery of a formation region, it is necessary that the composition has fluidity even after being attached to the object. However, a step of discharging a composition may be performed under reduced pressure as long as fluidity is not lost. In addition, when the step is performed under reduced pressure, an oxide film or the like is not formed over the surface of the conductive material, which is preferable. After discharging the composition, either or both steps of drying and baking is performed. Each step of drying and baking is carried out by a heat treatment. For example, drying is performed for 3 minutes at a temperature of 100° C. and baking is performed for 15 minutes to 60 minutes at a temperature of from 200 to 550° C., each of which has a different purpose, temperature, and time. The steps of drying and baking are performed at normal pressure or under reduced pressure by laser irradiation, rapid thermal annealing, heating using a heating furnace, or the like. Note that the timing of the heat treatment and the number thereof are not especially limited. The substrate may be heated to favorably perform the steps of drying and baking. The temperature of the substrate at the time depends on the quality of the material of the substrate or the like, but it is typically from 100 to 800° C. (preferably, from 200 to 550° C.). With the steps, nanoparticles are made in contact with each other, and fusion and welding are accelerated by hardening and shrinking a peripheral resin as well as evaporating the solvent in the composition or chemically removing the dispersant.

Gas laser or solid-state laser of continuous wave or pulsed wave may be used for laser light irradiation. As the gas laser, an excimer laser, a YAG laser, or the like can be used. As the solid-state laser, a laser using a crystal of YAG, $YVO_4$, $GdVO_4$, or the like which is doped with a crystal of Cr, Nd, or the like can be used. Note that it is preferable to use a continuous wave laser in relation to the absorptance of laser light. Moreover, a laser irradiation method, in which pulsed and continuous wave lasers are combined, may be used. However, it is preferable that a heat treatment by laser light irradiation is instantaneously performed within several microseconds to several tens of seconds so as not to damage the substrate, depending on heat resistance of the substrate. Rapid thermal annealing (RTA) is carried out by raising the temperature rapidly and heating instantaneously for several microseconds to several minutes using an infrared lamp or a halogen lamp that emits light of from ultraviolet to infrared in an inert gas atmosphere. Since the treatment is performed instantaneously, only a thin film on a top surface can be substantially heated and the lower layer film is not affected. Accordingly, even a substrate having low heat resistance such as a plastic substrate is not affected.

After forming a gate electrode layer and the like by discharging a composition by a droplet discharge method, the surface thereof may be planarized by pressing with pressure to enhance the planarity. As a pressing method, unevenness may be smoothed by moving a roller-shaped object over the surface, or the surface may be vertically pressed with a flat plate-shaped object. A heating step may be performed when the pressing is performed. Alternatively, unevenness on the surface may be eliminated with an air knife after softening or melting the surface with a solvent or the like. A CMP method may also be used for polishing the surface. This step can be applied for planarizing a surface when unevenness is caused through a droplet discharge method.

In FIGS. 1A to 1C, a droplet discharge method by which the first conductive layer 51 and the buffer layer 52 are selectively formed is used, however etching can also be used to form the first conductive layer 51 and the buffer layer 52 in a desired shape as shown in FIG. 2A to 2D. FIGS. 2A to 2D show another example of the method for forming the buffer layer and a conductive layer formed over the buffer layer.

Figure 2A:
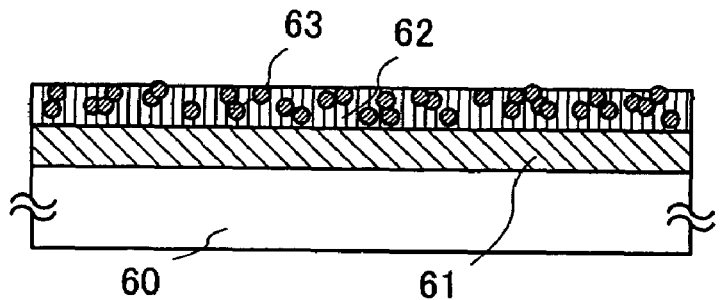
FIGS. 2A to 2D are schematic diagrams describing the present invention.

A conductive film 61 is formed over a substrate 60 as shown in FIG. 2A. A conductive film 62 having good adhesiveness to the conductive film 61 is formed. The conductive film 62 may have certain conductivity, and a conductive material such as a metal, semiconductor material or the like may be used. An organic material, an inorganic material, a mixed material thereof, or the like can be selected in view of the resistance value and the like of the material. The material may contain multiple kinds of materials such as alloy, compound and mixture. For example, an element selected from Ag, Au, Ni, Pt, Pd, Ir, Rh, Ta, W, Ti, Mo, Al, Cu or an alloy material or a compound material mainly containing the element, may be used. As a material for the semiconductor material, a polycrystal silicon film doped with an impurity element such as phosphorus, can be used.

In this embodiment mode, a conductive film containing pores is formed by forming a conductive film containing particles and removing the particles by etching. However, the present invention is not limited to this method. A conductive film including the above described conductive material may be formed, and then pores may be formed in the conductive film. The pores may be formed in the conductive film by putting physical force to the conductive film or having an impact on the conductive film; a chemical treatment (a corrosion of a surface by solution with corrosion effect); partially deforming by heating (partially dissolving or the like). In addition, a particle shaped substance may be attached to the surface of the conductive film so that the conductive film has pores in the surface of the conductive film.

In this embodiment mode, indium tin oxide (ITO) is used as the conductive film 62. A silicon oxide particle 63 is contained in the conductive film 62. The silicon oxide particle 63 is removed in a later step, and a pore (space, hole) is formed in the conductive film 62. In this embodiment mode, an ITO solution to which a silicon oxide particle (grain diameter at most 50 nm) is added, is applied over the conductive film 61, dried, and baked to form the conductive film 62 containing the silicon oxide particle 63. A material mixed into the conductive film may have any shapes such as particle shape, columnar shape, needle shape, or planar shape. Further, the materials may be aggregated to form an aggregation as a unit. Since the pore is formed depending on the shape of the particle, it is preferable to make the size of the particle bigger than a particle of the conductive material that enters or fills a pore, and to make it smaller than a line width of the second conductive layer to be formed. Therefore, the material is appropriately selected in consideration of a material or a shape of the second conductive layer formed over the buffer layer including at least one pore.

Figure 2B:
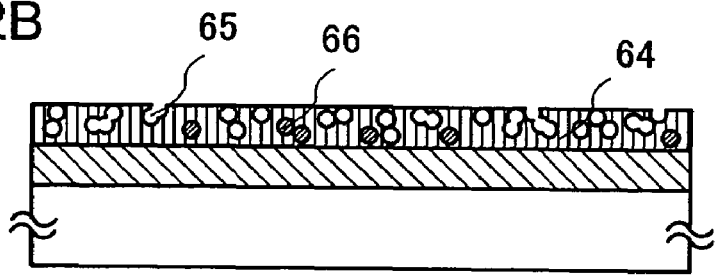

Then, the silicon oxide particle 63 included in the conductive film 62 is removed. In this embodiment mode, the silicon oxide particle 63 is dissolved and is removed by hydrofluoric acid treatment. It is necessary to remove the silicon oxide particle 63 with a condition in which an etching selectivity with respect to the conductive film 62 is high, so that only the particle included in the film is removed. When the silicon oxide particle 63 is removed, a portion in which the particle is removed becomes a space (cavity), and then a pore 65 and a buffer layer including at least one pore 64 are formed (FIG. 2B). In this embodiment mode, the silicon oxide particle 63 is removed by wet etching using hydrofluoric acid solution as an etchant. Some of the silicon oxide particles remain in the buffer layer including at least one pore 64 without touching the etchant and dissolving like particles 66, depending on the dispersion state of the silicon oxide particle 63 in the conductive film 62. Even in such a case, the buffer layer including at least one pore 64 has a pore 65 and still functions as a buffer layer including at least one pore.

Figure 2C:
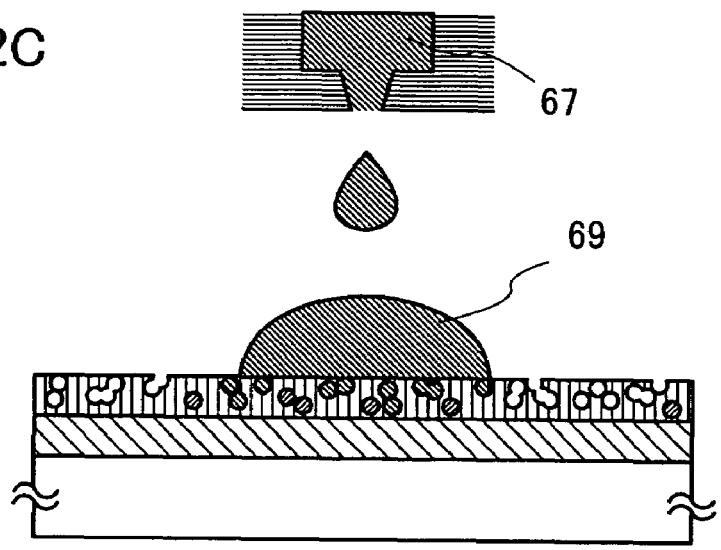
Figure 2D:
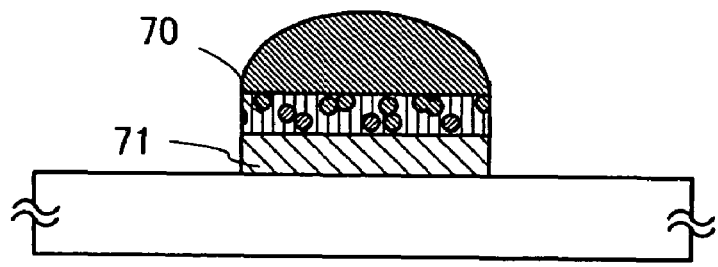

A composition 67 containing a liquid conductive material is discharged into the buffer layer including at least one pore 64. A particle shaped conductive material enters the buffer layer including at least one pore 64 and fills it, and is solidified in a pore by drying, baking steps, and then a second conductive layer 69 is formed. The adhesiveness of the second conductive layer is improved by anchoring effect of the conductive layer solidified in the pore, and the second conductive layer can be formed stably. As shown in FIG. 2C, since a plurality of pores exist on the surface or inside of the buffer layer including at least one pore 64, the conductive layer in the buffer layer including at least one pore 64 is larger (or smaller) than the conductive layer attached on the surface of the buffer layer including at least one pore 64, in some cases.

When a composition containing a conductive material is discharged, as a pretreatment, a treatment may be performed so that wettability of a formation region of a liquid composition with respect to the composition is different from wettability of a non-formation region, which is peripheral to the formation region, with respect to the composition. For example, when a substance having low wettability with respect to the composition is formed only in a non-formation region to form a region having low wettability (hereinafter also referred to as a lower wettability region), a formation region relatively becomes a region having high wettability (hereinafter also referred to as a high wettability region). A discharged composition containing a liquid conductive material is not wet well in the low wettability region and is shed, thus, it is formed only in the formation region in a self-aligning manner with good controllability.

Regions having different wettabilities are regions having different contact angles of the composition containing the conductive material. A region having a larger contact angle of the composition containing the conductive material is a region having low wettability, and a region having a smaller contact angle of the composition containing the conductive material is a region having high wettability. This is because when a contact angle is large, a liquid composition having fluidity does not spread over the surface of the region and repelled, and the surface is not wetted; and when a contact angle is small, a composition having fluidity spreads over the surface, and the surface is wetted well. Accordingly, the regions having different wettabilities have different surface energy. The surface energy of the low wettability region is low, and the surface energy of the high wettability region is high.

In this manner, when the conductive layer or the insulating layer is formed by attaching a liquid substance, the conductive layer, an insulating layer or the like can be formed with more correct pattern by controlling wettability with respect to the liquid substance near the formation region. Then, the conductive film 61 and the buffer layer including at least one pore 64 are processed into a desired shape to form a conductive layer 71 and a buffer layer including at least one pore 70.

By the steps described above, the first conductive layer 71 and the second conductive layer 69 are electrically connected to each other with good adhesiveness and stability through the buffer layer including at least one pore 64.

A treatment for enhancing wettability is carried out to make the strength of holding a droplet discharged over the region (also referred to as adhesion force or fixing strength) stronger than that of the periphery thereof, which is equivalent to enhancing the adhesiveness with the droplet by modifying the region. The wettability is necessary only on a surface which is in contact with a droplet and holds the droplet, and the whole film does not necessarily have the similar properties.

By combining a droplet discharge method, material loss can be prevented and cost reduction can be achieved, in comparison with the entire surface coating formation by spin coating or the like. By the present invention, a wiring or the like can be formed with a favorable shape with good adhesiveness and coverage, and reliability can be improved even if the wiring is aggregated and arranged intricately by downsizing or thinning.

By the present invention, a component can be formed in a desired pattern and with good adhesiveness. Further, the material loss and costs can be reduced. Therefore, a thin film transistor and a display device with high performance and high reliability can be manufactured with high yield.

Embodiment Mode 2

Figure 25A:
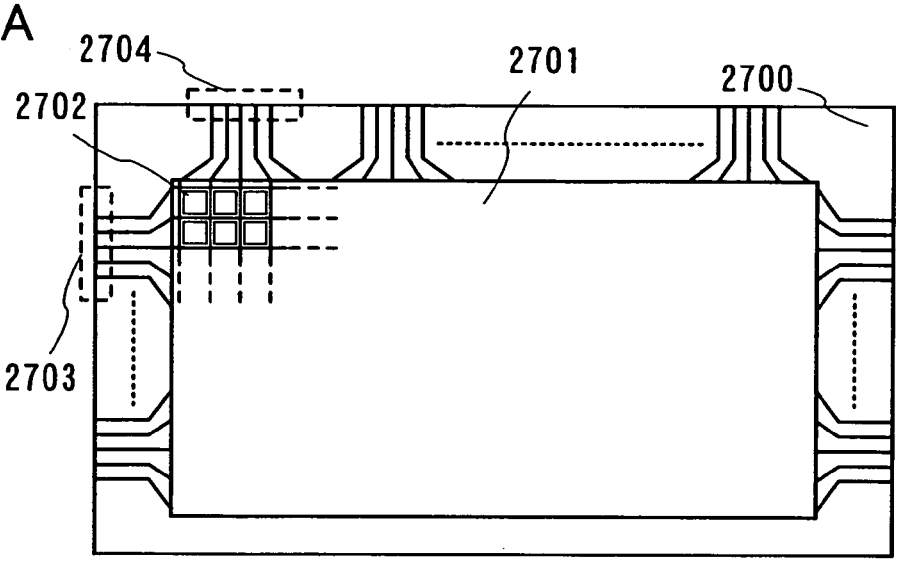
FIGS. 25A to 25C are top views of display devices of the present invention.

FIG. 25A is a top view showing a structure of a display panel according to the present invention, wherein a pixel portion 2701 in which pixels 2702 are arranged in matrix form, a scanning line input terminal 2703, and a signal line input terminal 2704 are formed over a substrate 2700 having an insulated surface. The number of pixels may be determined in accordance with various standards. The number of pixels for XGA for full color display using RGB may be 1,024× 768×3 (RGB), and that for UXGA for full color display using RGB may be 1,600×1,200×3 (RGB). In a case of forming a display panel corresponding to a full-spec high vision for full color display using RGB, the number of pixels may be 1,920× 1,080×3 (RGB).

The pixels 2702 are arranged in matrix form by intersecting scanning lines extending from the scanning line input terminal 2703 with signal lines extending from the signal line input terminal 2704. Each pixel 2702 includes a switching element and a pixel electrode connected to the switching element. A TFT can be cited as a representative example of the switching element. Connecting a gate electrode side of the TFT to a scanning line and connecting a source or drain side thereof to a signal line enables independent control of respective pixels by a signal input from an external portion.

Figure 22A:
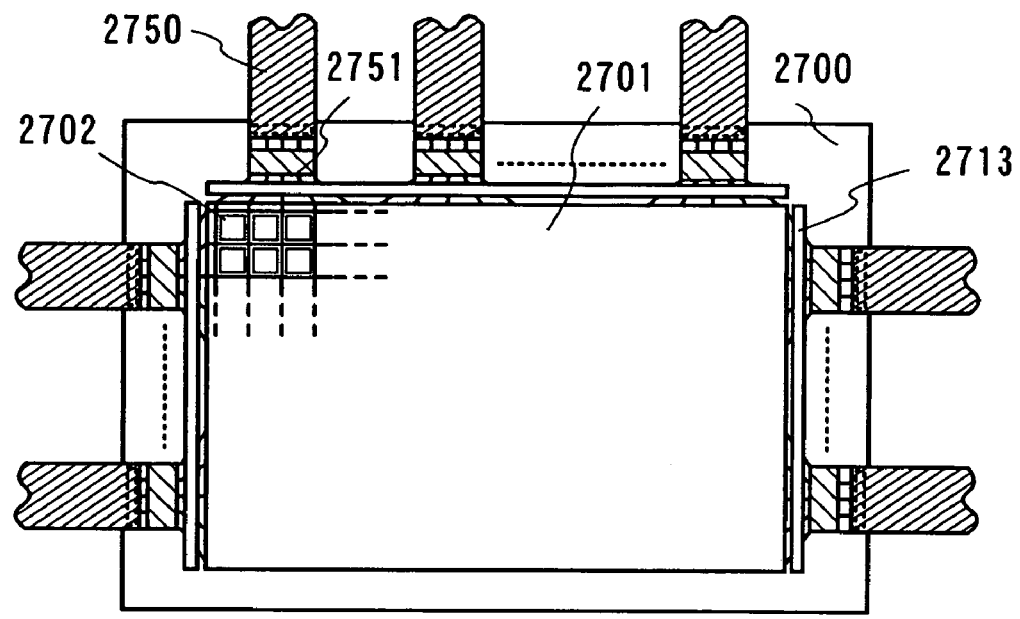
FIGS. 22A and 22B are top views of a display device according to the present invention.
Figure 22B:
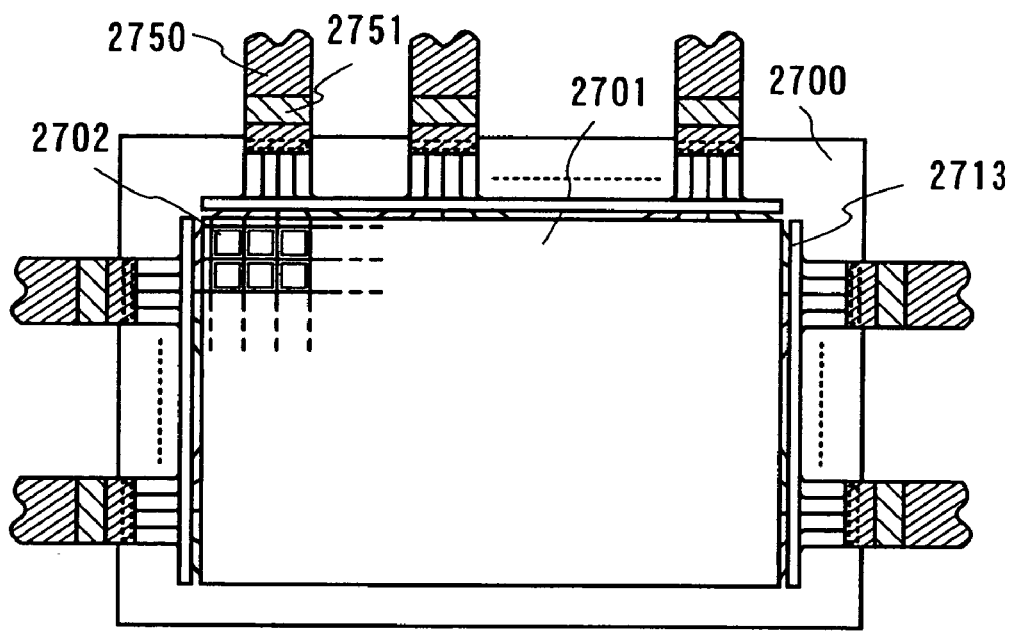

FIG. 25A shows a structure of a display panel in which signals inputted into the scanning line and the signal line are controlled by an external driver circuit. As shown in FIG. 22A, driver ICs 2751 may be mounted on a substrate 2700 by the COG (Chip on Glass) mode. As shown in FIG. 22B, a TAB (Tape Automated Bonding) mode may be used as another mounting mode. The driver ICs may be formed on a single crystal semiconductor substrate or with a circuit formed over a glass substrate using a TFT. In FIGS. 22A and 22B, the driver ICs 2751 are connected to FPCs 2750.

Figure 25B:
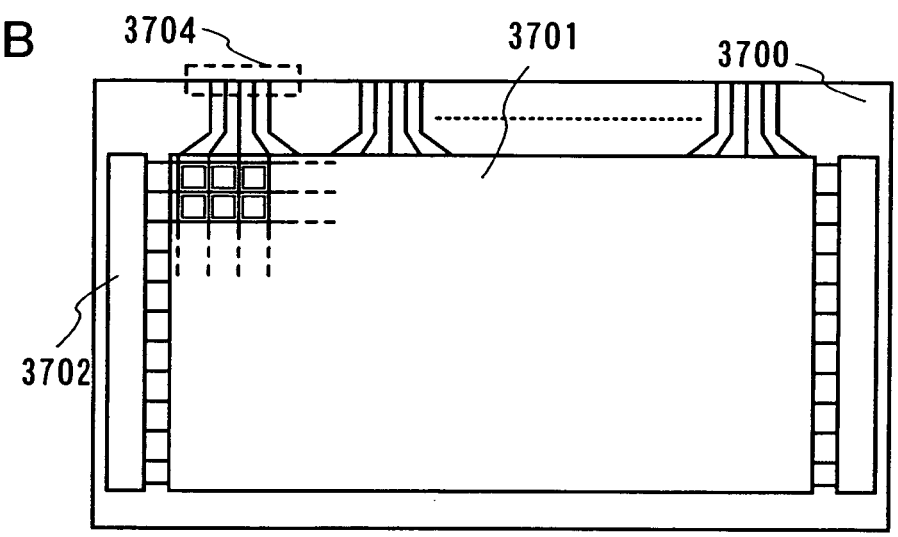
Figure 25C:
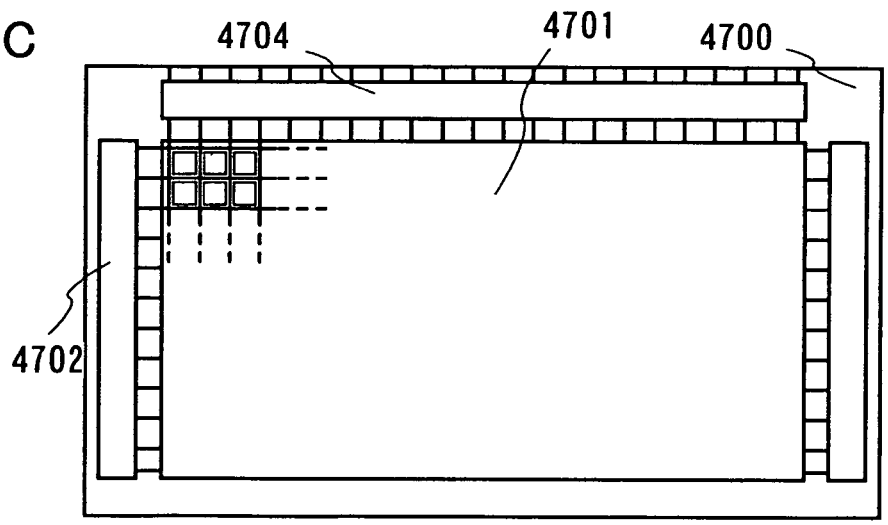

In a case where a TFT that is formed in a pixel is made with a polycrystalline (microcrystalline) semiconductor having high crystallinity, a scanning line driver circuit 3702 can be integrated over a substrate 3700, as shown in FIG. 25B. In FIG. 25B, the reference numeral 3701 indicates a pixel portion and the reference numeral 3704 indicates a signal line input terminal, and a signal line driver circuit is controlled by an external driver circuit in the same manner as FIG. 25A. When a TFT formed in each pixel is made with a polycrystalline (microcrystalline) semiconductor, a single crystalline semiconductor or the like having high mobility, a scanning line driver circuit 4702 and a signal line driver circuit 4704 can be integrated with a pixel portion 4701 over a glass substrate 4700 as shown in FIG. 25C, like a TFT formed by the present invention.

Figure 8A:
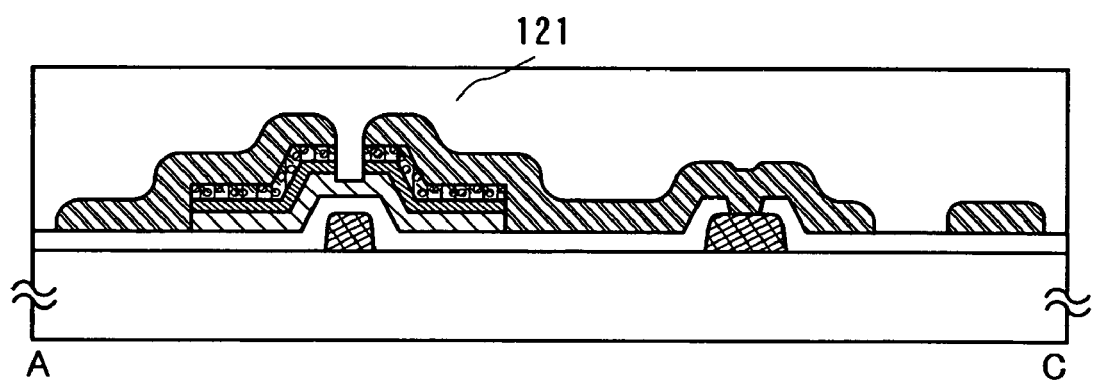
FIGS. 8A and 8B are diagrams describing a method for manufacturing a display device according to the present invention.
Figure 8B:
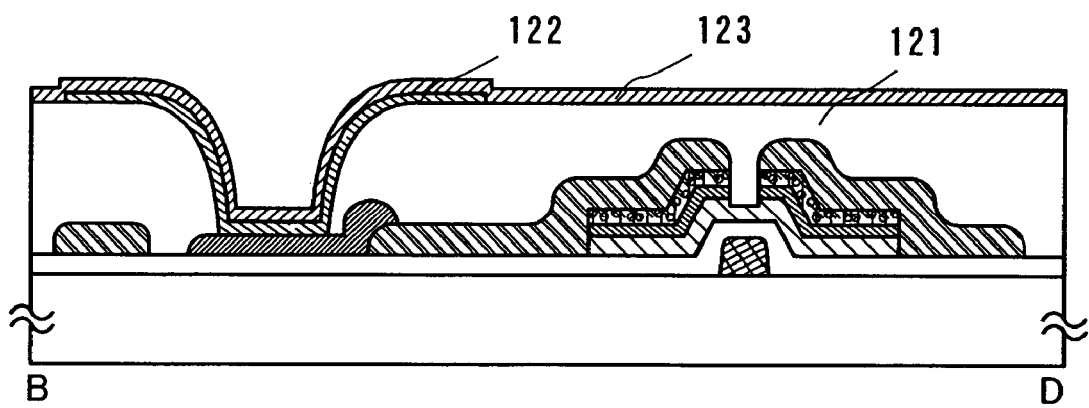
Figure 9A:
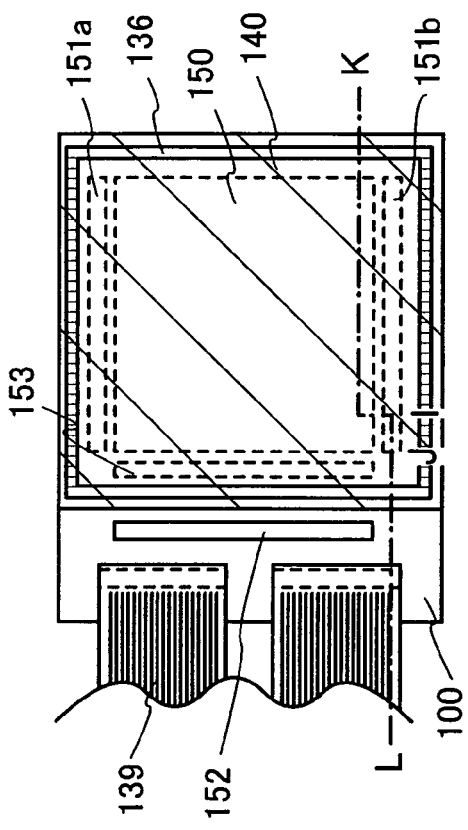
FIGS. 9A and 9B are diagrams describing a display device according to the present invention.
Figure 9B:
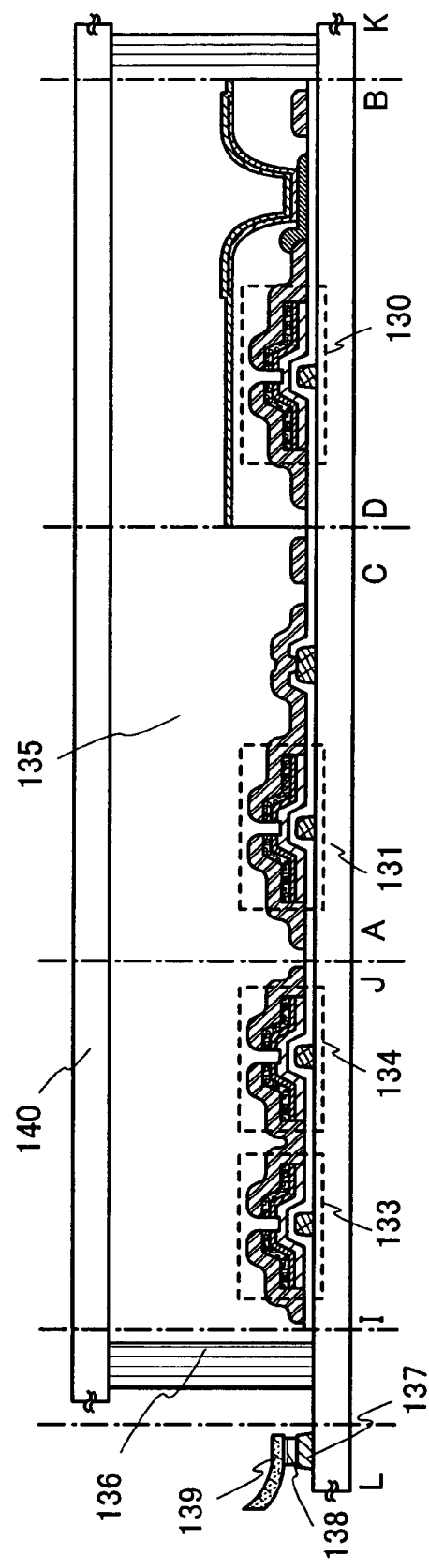

Embodiment Mode of the present invention will be described with reference to FIGS. 4 to 9. Specifically, a method for manufacturing a display device having an inversely staggered thin film transistor to which the present invention is applied will be described. FIGS. 4A, 5A, 6A, 7A are top views of a pixel portion of the display device; FIGS. 4B, 5B, 6B, 7B are cross-sectional views taken along lines A-C of FIGS. 4A, 5A, 6A, 7A; FIGS. 4C, 5C, 6C, 7C are cross-sectional views taken along lines B-D of FIGS. 4A, 5A, 6A, 7A. FIGS. 8A and 8B are cross-sectional views of the display device. FIG. 9A is a top view of the display device, and FIG. 9B is a cross-sectional view taken along lines L-K (including I-J) of FIG. 9A.

As a substrate 100, a glass substrate such as a barium borosilicate glass, an alumino borosilicate glass; a quartz substrate; a metal substrate; or a heat-resistant plastic substrate that can withstand a processing temperature of the manufacturing process can be used. The surface of the substrate 100 may be polished by a CMP method or the like so as to be planarized. An insulating layer may be formed on the substrate 100. The insulating layer is formed of an oxide material containing silicon or a nitride material containing silicon by a known method such as CVD, plasma CVD, sputtering and spin coating so as to have a single layer or a stacked layer. This insulating layer may not necessarily be formed. However, the insulating layer can prevent contaminants from penetrating through the substrate 100.

Gate electrode layers 103 and 104 are formed over the substrate 100. The gate electrode layers 103 and 104 can be formed by a CVD method, a sputtering method, a droplet discharge method, or the like. The gate electrode layers 103 and 104 may be formed with an element selected from Ag, Au, Ni, Pt, Pd, Ir, Rh, Ta, W, Ti, Mo, Al, and Cu, an alloy material or a compound material mainly containing the element. Alternatively, a semiconductor film typified by a polycrystalline silicon film doped with an impurity element such as phosphorus, or AgPdCu alloy may also be used. Either a single layer structure or a stacked layer structure may be used. For example, a two-layer structure of a tungsten nitride (WN) film and a molybdenum (Mo) film, or a three-layer structure in which a 50-nm-thick tungsten film, a 500-nm-thick alloy (Al—Si) film of aluminum and silicon, and a 30-nm-thick titanium nitride film are stacked in this order. Further, in a case of a three-layer structure, tungsten nitride may be used instead of tungsten as the first conductive film; an alloy (Al—Ti) film of aluminum and titanium may be used instead of the alloy (Al—Si) film of silicon and aluminum as the second conductive film; and a titanium film may be used instead of the titanium nitride film as the third conductive film.

In a case where the shape of the gate electrode layers 103 and 104 are required to be processed, the gate electrode layers 103 and 104 are processed into a desired shape by dry etching or wet etching after forming a mask. The electrode layers can be etched to have a tapered shape by appropriately controlling the etching condition (the amount of electric power applied to a coiled electrode, the amount of electric power applied to an electrode of a substrate side, the temperature of the electrode of the substrate side, or the like) by ICP (Inductively Coupled Plasma) etching. Note that as the etching gas, a chlorine-based gas typified by $Cl_2$, $BCl_3$, $SiCl_4$, or $CCl_4$; a fluorine-based gas typified by $CF_4$, $SF_6$, or $NF_3$; or $O_2$ can be appropriately used.

The mask for processing into a desired shape can be formed by selectively discharging a composition. The steps for processing into a desired shape can be simplified by forming a mask selectively. A resin material such as epoxy resin, phenol resin, novolac resin, acrylic resin, melamine resin, or urethane resin is used as the mask. In addition, the mask may be formed by a droplet discharge method using an organic material such as benzocyclobutene, parylene, flare, or polyimide having transmissivity; a compound material made by the polymerization, such as a siloxane-based polymer; a composition material containing a water-soluble homopolymer and a water-soluble copolymer; or the like. Alternatively, a commercial resist material containing a photosensitizer may also be used. For example, a typical positive type resist such as a novolac resin and a naphthoquinone diazide compound that is a photosensitizer; or a negative type resist such as a base resin, diphenylsilanediol and an acid generator, may be used. In using any material, the surface tension and the viscosity are appropriately controlled by controlling the concentration of a solvent or adding a surfactant or the like.

In this embodiment mode, when a mask for a process for forming a desired shape is formed by a droplet discharge method, regions having different wettabilities may be formed in the vicinity of a subject region as a pretreatment. In the present invention, when a droplet is discharged by a droplet discharge method to form a component such as a conductive layer, an insulating layer, or a buffer layer including at least one pore, the shape of a formation can be controlled by forming a low wettability region and a high wettability region with respect to the material in a formation region of a component. By performing the treatment in the formation region of the composition, the difference in the wettability is occurred, thus, a droplet is held only in the formation region having a high wettability, and the formation can be formed to have a desired shape with high controllability. This process can be applied to a pretreatment of any formations (such as an insulating layer, a conductive layer, a mask layer, and a wiring layer).

Figure 4A:
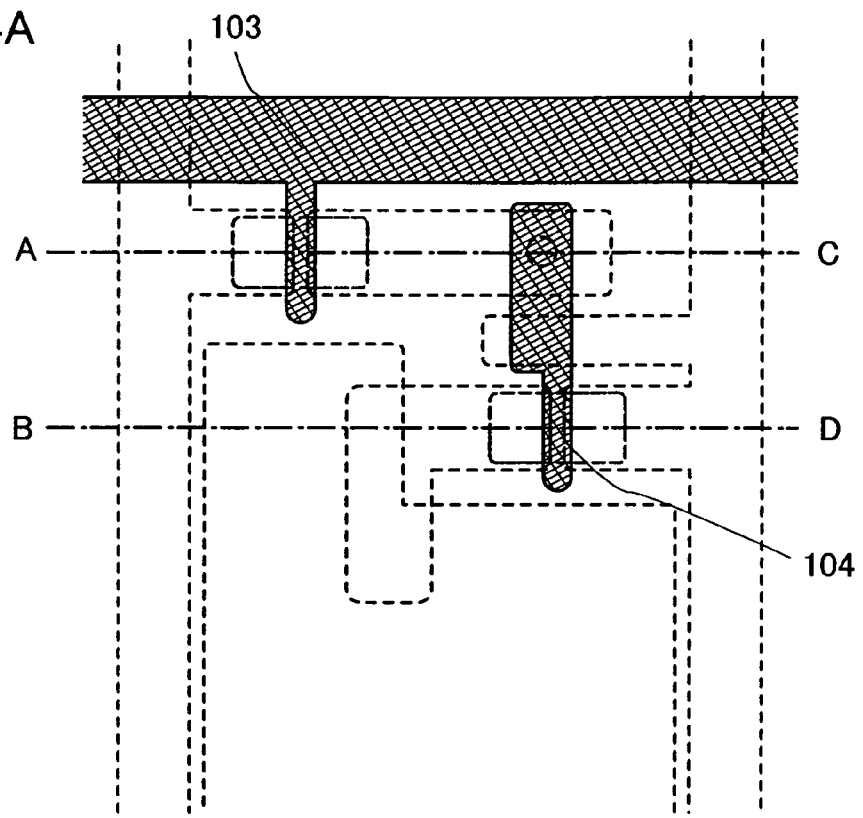
FIGS. 4A to 4C are diagrams describing a method for manufacturing a display device according to the present invention.
Figure 4B:
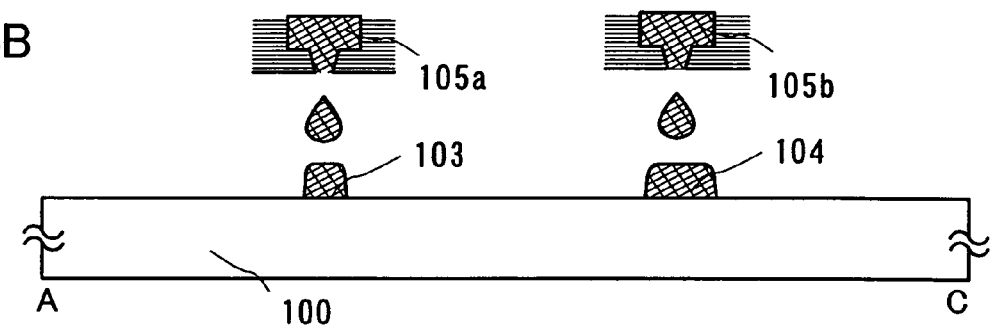
Figure 4C:
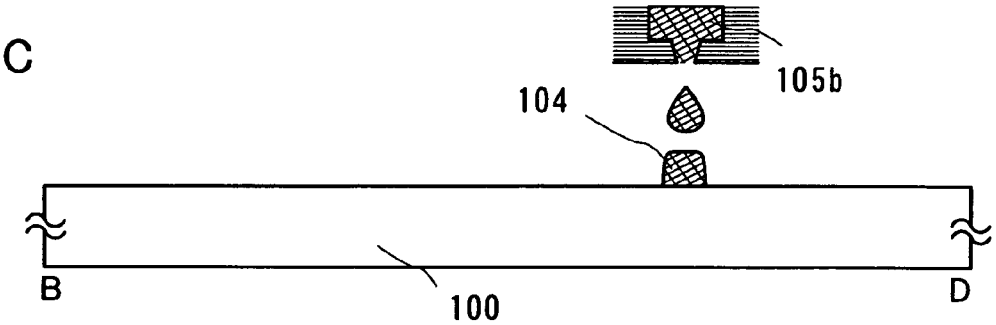

In this embodiment mode, the gate electrode layer 103 and the gate electrode layer 104 are formed by droplet discharging devices 105a and 105b by using a droplet discharge means (FIGS. 4A to 4C).

Subsequently, a gate insulating layer 106 is formed over the gate electrode layers 103 and 104. The gate insulating layer 106 may be formed of a known material such as an oxide material or nitride material of silicon, and may be a single layer or a stacked layer thereof. In this embodiment mode, a two-layer structure of a silicon nitride film, and a silicon oxide film is used. Alternatively, a single layer of a silicon oxynitride film, or a stacked layer formed with three layers may be used. A silicon nitride film having dense film quality may be preferably used. In a case of using silver, copper, or the like as the conductive layer formed by a droplet discharge method, when forming a silicon nitride film or a NiB film thereover as a barrier film, the silicon nitride film or the NiB film is effective in preventing impurities from diffusing and in planarizing the surface. Note that a rare gas element such as argon is preferably included in a reactive gas, and is preferably mixed into the insulating film to be formed in order to form a dense insulating film with little gate leak current at a low film-formation temperature.

Next, a semiconductor layer is formed. A semiconductor layer having one conductivity type may be formed, if necessary. Alternatively, an NMOS structure of an n-channel TFT in which an n-type semiconductor layer is formed, a PMOS structure of a p-channel TFT in which a p-type semiconductor layer is formed, and a CMOS structure of the n-channel TFT and the p-channel TFT, can be manufactured. In order to impart conductivity, an element imparting conductivity is added to a semiconductor layer by doping and an impurity region is formed in the semiconductor layer so that an n-channel TFT and a p-channel TFT can be formed. Conductivity may be imparted to a semiconductor layer by performing a plasma treatment using $PH_3$ gas, instead of forming an n-type semiconductor layer.

As a material of the semiconductor layer, an amorphous semiconductor (hereinafter, "AS") manufactured by a vapor growth method using a semiconductor material gas typified by silane or germanium or a sputtering method; a polycrystalline semiconductor that is formed by crystallizing the amorphous semiconductor by utilizing light energy or heat energy; a semiamorphous semiconductor (also referred to as a microcrystalline semiconductor, hereinafter, "SAS" or microcrystal) or the like can be used. The semiconductor layer can be formed by using a known method (such as sputtering, LPCVD and plasma CVD).

The SAS has an intermediate structure between an amorphous structure and a crystalline structure (including a single crystalline structure and a polycrystalline structure), and has a third condition that is stable in terms of free energy. The SAS includes a crystalline region having a short range order with lattice distortion. A crystal region with a size of 0.5 to 20 nm can be observed in at least a portion of the film. In a case of containing silicon as its main component, Raman spectrum is shifted toward wavenumbers lower than 520 $cm^{-1}$. The diffraction peaks of (111) and (220), which are believed to be derived from silicon crystal lattice, are observed by X-ray diffraction. The SAS contains hydrogen or halogen of at least 1 atom % or more for terminating dangling bonds. The SAS is formed by glow discharge decomposition (plasma CVD) with silicon source gas. As for the silicon source gas, $SiH_4$, $Si_2H_6$, $SiH_2Cl_2$, $SiHCl_3$, $SiCl_4$, $SiF_4$ and the like can be used. In addition, $F_2$ or $GeF_4$ may be mixed in the silicon source gas. The silicon source gas may also be diluted with $H_2$, or $H_2$ and one or more of rare gas elements selected from He, Ar, Kr and Ne. The dilution ratio is set to be in the range of 2 to 1000. The pressure is set to be approximately in the range of 0.1 to 133 Pa. The frequency of the power supply is set to be 1 to 120 MHz, preferably, 13 to 60 MHz. Preferably, the substrate heating temperature may be set to be 300° C. or less, more preferably, 100 to 200° C. As impurity elements contained when forming the film, each concentration of impurities of atmospheric constituents such as oxygen, nitrogen and carbon is preferably set to be $1×10^{20}$ $cm^{-3}$ or less. In particular, the oxygen concentration is set to be $5×10^{19}$ $cm^{-3}$ or less, preferably, $1×10^{19}$ $cm^{-3}$ or less. In addition, when the lattice distortion is further promoted by adding a rare gas element such as helium, argon, krypton and neon, a favorable SAS having an increased stability can be obtained. In addition, an SAS layer formed with hydrogen gas as a semiconductor layer may be stacked on an SAS layer formed with fluorine gas.

A hydrogenated amorphous silicon can be typically cited as the amorphous semiconductor, while a polysilicon or the like can be typically cited as a crystalline semiconductor layer. The polysilicon (polycrystalline silicon) includes a so-called high-temperature polysilicon mainly containing a polysilicon that is formed at a process temperature of 800° C. or more; a so-called low-temperature polysilicon mainly containing a polysilicon that is formed at a process temperature of 600° C. or less; a polysilicon that is crystallized by being added with an element that promotes crystallization; and the like. As described above, a semiamorphous semiconductor or a semiconductor containing a crystal phase in a portion of the semiconductor layer can also be used.

When a crystalline semiconductor layer is used as the semiconductor layer, the crystalline semiconductor layer may be formed by a known method (for example, laser crystallization, thermal crystallization, thermal crystallization using an element that promotes crystallization such as nickel, and the like). Also, a microcrystalline semiconductor, which is an SAS, can be crystallized by laser irradiation to increase its crystallinity. When the element which promotes crystallization is not introduced, prior to emitting laser light to an amorphous silicon film, the amorphous silicon film is heated at 500° C. for one hour under a nitrogen atmosphere so that the concentration of hydrogen contained in the amorphous silicon film is released to become $1×10^{20}$ $atoms/cm^3$ or less. This is because the amorphous silicon film is destroyed when the amorphous silicon film containing a high amount of hydrogen is irradiated with laser light.

A method for introducing a metal element into an amorphous semiconductor layer is not especially limited as long as it is a method capable of providing the metal element on a surface or inside of the amorphous semiconductor layer. For example, sputtering, CVD, plasma processing (including plasma CVD), absorption, a method for applying a solution of metal salt, and the like can be used. Among the above described methods, the method using a solution is convenient and has an advantage of easily adjusting the concentration of a metal element. In addition, in order to improve the wettability of the surface of the amorphous semiconductor layer to spread an aqueous solution on the entire surface of the amorphous semiconductor layer, an oxide film is preferably formed by UV light irradiation in an oxygen atmosphere, thermal oxidation, treatment using ozone water containing hydroxy radical or hydrogen peroxide solution, or the like.

The amorphous semiconductor layer may be crystallized by using a combination of a heat treatment and laser light irradiation. The heat treatment or the laser light irradiation may be carried out several times, individually.

Also, a crystalline semiconductor layer may be directly formed over a substrate by a linear plasma method. Alternatively, the crystalline semiconductor layer may be selectively formed over a substrate by the linear plasma method.

A semiconductor may be formed using an organic semiconductor material by a printing method, a spraying method, a spin coating method, a droplet discharge method, or the like. In this case, since the above described etching step is not required, the number of steps can be reduced. As an organic semiconductor, a low molecular weight material, a high molecular weight material, an organic pigment, a conductive high molecular weight material and the like can be used. Preferably, a π-conjugated system high molecular weight material with skeleton including conjugated double bonds is used as the organic semiconductor material used in the present invention. Typically, a soluble high molecular weight material such as polythiophene, polyfluorene, poly(3-alkyl thiophene), polythiophene derivatives and pentacene, can be used.

As another organic semiconductor material that can be used in the present invention, there is a material that can form a semiconductor layer by forming a soluble precursor and processing the soluble precursor. For example, polyethylene vinylene, poly (2,5-thienylene vinylene), polyacetylene, polyacetylene derivatives, polyarylene vinylene and the like, can be cited as the organic semiconductor material.

When converting the precursor into an organic semiconductor, a reactive catalyst such as hydrochloric gas is added to the precursor, in addition to the heat treatment. As a typical solvent for dissolving such a soluble organic semiconductor material, toluene, xylene, chlorobenzene, dichlorobenzene, anisole, chloroform, dichloromethane, γ butyl lactone, butyl cellsolve, cyclohexane, NMP (N-methyl-2-pyrrolidone), cyclohexanone, 2-butanone, dioxane, dimethylformamide (DMF), THF (tetrahydrofuran), or the like can be applied.

Semiconductor layers 107 and 108 are formed over the gate insulating layer 106. In this embodiment mode, an amorphous semiconductor layer is crystallized to form a crystalline semiconductor layer as the semiconductor layers 107 and 108. In a crystallization process, an element that promotes crystallization (also referred to as a catalytic element or a metal element) is added to an amorphous semiconductor layer, and the crystallization is performed by a heat treatment (at a temperature of 550 to 750° C., for 3 minutes to 24 hours). As the element promoting crystallization, one or a plurality of kinds selected from iron (Fe), nickel (Ni), cobalt (Co), ruthenium (Ru), rhodium (Rh), palladium (Pd), osmium (Os), iridium (Ir), platinum (Pt), cupper (Cu), and gold (Au) can be used. Nickel is used in this embodiment mode.

In order to remove or reduce the element promoting crystallization from the crystalline semiconductor layer, a semiconductor layer containing an impurity element being in contact with the crystalline semiconductor layer is formed to function as a gettering sink. As the impurity element, an n-type impurity element, a p-type impurity element, a rare gas element, and the like can be used. For example, one or a plurality of kinds selected from phosphorus (P), nitrogen (N), arsenic (As), antimony (Sb), bismuth (Bi), boron (B), helium (He), neon (Ne), argon (Ar), krypton (Kr), xenon (Xe) can be used. In this embodiment mode, a semiconductor layer containing argon is formed as the semiconductor layer containing the impurity element functioning as the gettering sink. The semiconductor layer containing argon is formed over the crystalline semiconductor layer containing the element promoting crystallization, and a heat treatment (at a temperature of 550 to 750° C., for 3 minutes to 24 hours) is performed. The element promoting crystallization contained in the crystalline semiconductor layer moves into the semiconductor layer containing argon, and the element promoting crystallization contained in the crystalline semiconductor layer is removed or reduced. After that, the semiconductor layer containing argon serving as the gettering sink is removed. An n-type semiconductor layer containing phosphorus that is an n-type impurity element is formed over the semiconductor layer. The n-type semiconductor layer functions as a source region and a drain region. In this embodiment mode, the n-type semiconductor layer is formed with a semiamorphous semiconductor.

A buffer layer including at least one pore is formed over the n-type semiconductor layer. The buffer layer including at least one pore may be formed in the same manner as the Embodiment Mode 1. The buffer layer including at least one pore has good adhesiveness to the n-type semiconductor layer and has conductivity. The buffer layer including at least one pore may have a certain conductivity, and a conductive material such as a metal, or the like, a semiconductor material, or the like may be used. An organic material, an inorganic material, a mixed material thereof, or the like can be selected in view of the resistance value and the like of the material. A compound of an alloy, a conductive oxide or a mixture material containing a plurality of kinds of material can also be used as the material. For example, an element selected from Ag, Au, Ni, Pt, Pd, Ir, Rh, Ta, W, Ti, Mo, Al, Cu or an alloy material or a compound material mainly containing the element may be used. As the semiconductor material, a polycrystal silicon film doped with an impurity element such as phosphorus, and the like can be used.

In this embodiment mode, a conductive film containing pores is formed by forming a conductive film containing particles and removing the particles by etching. However, the present invention is not limited to this method. A conductive film containing the above described conductive material is formed, and then pores may be formed in the conductive film. The pores may be formed in the conductive film by putting physical force to the conductive film or having an impact on the conductive film; a chemical treatment (such as a corrosion of a surface by solution with corrosion effect); or partially deforming by heating (partially dissolving or the like). In addition, a particle shaped substance may be attached to the surface of the conductive film so that the conductive film has the pores on the surface of the conductive film.

Figure 5A:
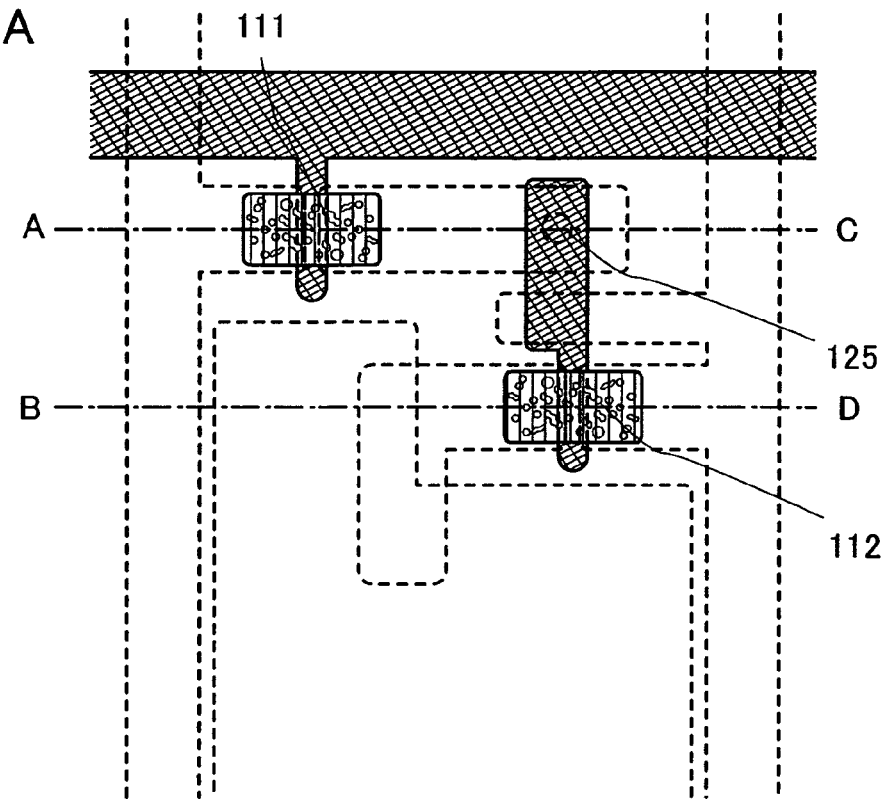
FIGS. 5A to 5C are diagrams describing a method for manufacturing a display device according to the present invention.
Figure 5B:
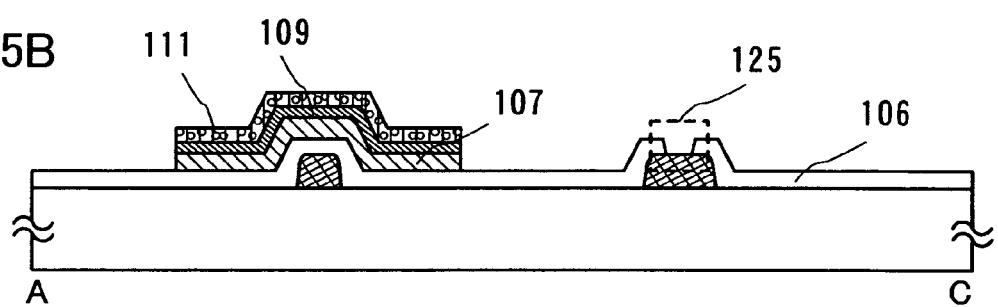
Figure 5C:
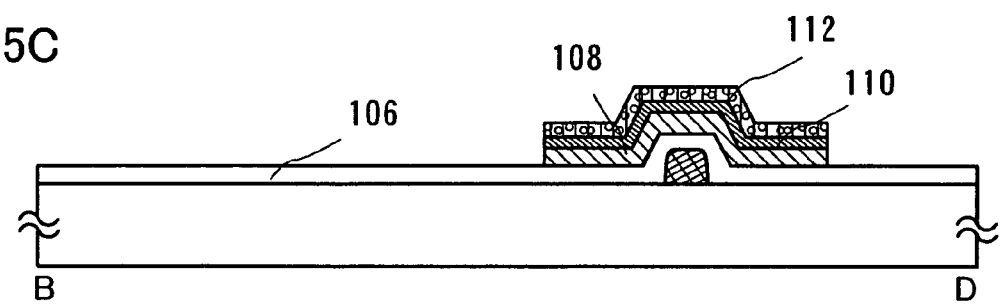

In this embodiment mode, ITO is used as the buffer layer including at least one pore. Other conductive oxides, such as ZnO or SnO may also be used as the buffer layer including at least one pore. In this embodiment mode, an ITO solution to which a silicon oxide particle (grain diameter to 50 nm) is added is applied, dried, and baked (in this embodiment mode, 500° C.) to form a conductive layer containing the silicon oxide particle. In this embodiment mode, the silicon oxide particle is dissolved and is removed by hydrofluoric acid treatment. When the silicon oxide particle is removed, a portion in which the particle is removed becomes a space (cavity) and then a pore and a buffer layer including at least one pore are formed. In this embodiment mode, the silicon oxide particle is removed by wet etching using hydrofluoric acid solution as an etchant. The semiconductor layer, the n-type semiconductor layer and the buffer layer including at least one pore that are formed through the steps are each processed into a desired shape, and thus, the semiconductor layers 107, 108, n-type semiconductor layers 109, 110 and buffer layers 111, 112 (each including at least one pore) are formed (FIGS. 5A and 5B).

A mask made from an insulating material such as resist or polyimide is formed by a droplet discharge method. By utilizing the mask, a through hole 125 is formed in a portion of the gate insulating layer 106 by etching to expose a portion of the gate electrode layer 104 existing at the lower part of the gate insulating layer (FIGS. 5A and 5B). Either plasma etching (dry etching) or wet etching may be used for the etching. When a large substrate is processed by etching, the plasma etching is preferable. As an etching gas, a gas containing fluorine or chlorine such as $CF_4$, $NF_3$, $Cl_2$, or $BCl_3$ is used, and an inert gas such as He or Ar may be appropriately added thereto. When the etching is performed by an atmospheric pressure discharge, electric discharging can be performed locally, and therefore, a mask layer is not necessary to be formed over an entire surface of a substrate.

Figure 6A:
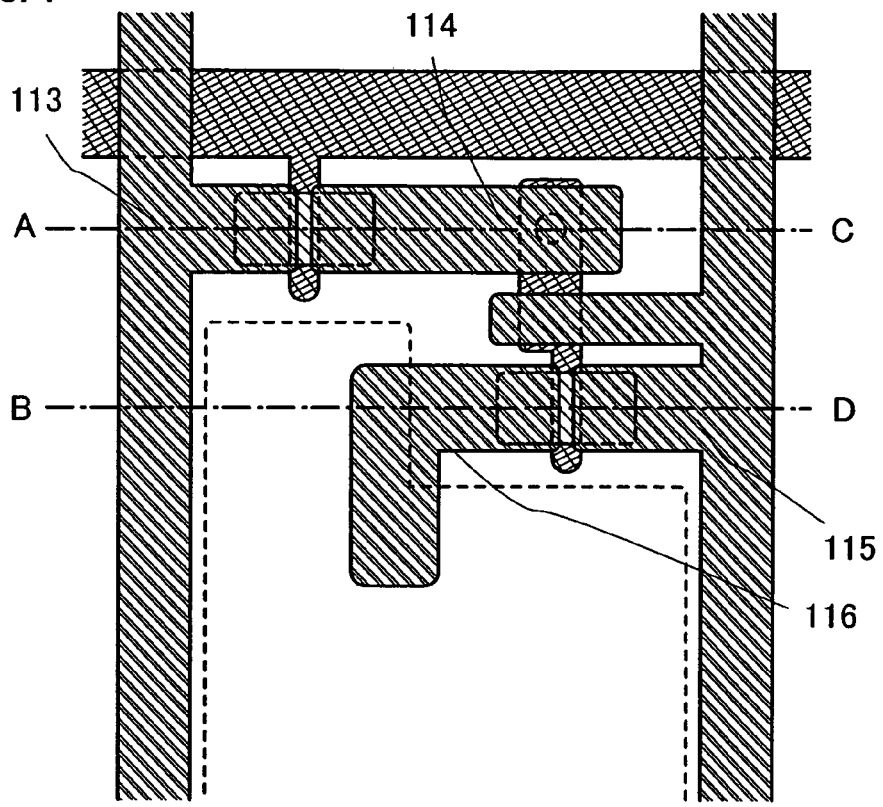
FIGS. 6A to 6C are diagrams describing a method for manufacturing a display device according to the present invention.
Figure 6B:
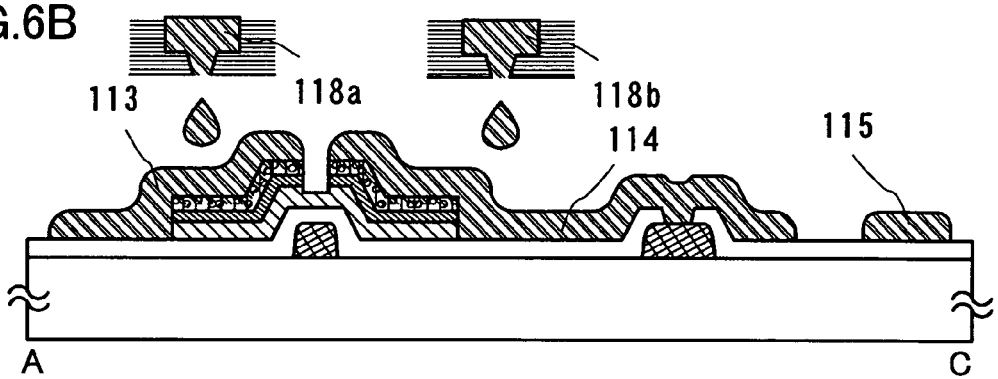
Figure 6C:
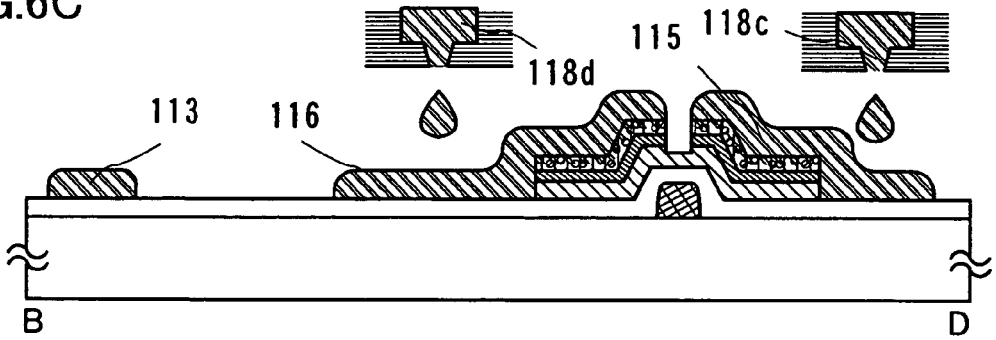

A composition containing a liquid conductive material is discharged from droplet discharging devices 118a, 118b, 118c, and 118d over the buffer layers 111 and 112 (each including at least one pore). A particle shaped conductive material is used to fill the pores in the buffer layers 111 and 112 (each including at least one pore), and is solidified in the pore by drying, baking steps to form source or drain electrode layers 113, 114, 115 and 116 (FIG. 6A to 6C). By the anchoring effect of the conductive layer solidified in the pores, the adhesiveness of the source or drain electrode layers 113, 114, 115 and 116 is improved and can be formed stably. By the above described process, the n-type semiconductor layers 109, 110 and the source or drain electrode layers 113, 114, 115 and 116 are formed with good adhesiveness and stability to each other to be electrically connected to each other through the buffer layers 111 and 112 (each including at least one pore).

The source or drain electrode layer 113 also functions as a source wiring layer, and the source or drain electrode layer 115 also functions as a power supply line. After the source or drain electrode layers 113, 114, 115 and 116 are formed, the semiconductor layers 107 and 108, the n-type semiconductor layers 109 and 110, the buffer layers 111 and 112 (each including at least one pore) are processed into desired shapes. In this embodiment mode, a mask is formed by a droplet discharge method to process them. However, the semiconductor layers, the n-type semiconductor layers and the buffer layers (each including at least one pore) may be processed by etching and using the source and the drain electrode layers as masks.

The step of forming the source or drain electrode layers 113, 114, 115 and 116 can be carried out in the same manner as the above described steps for forming the gate electrode layers 103 and 104.

As a conductive material for forming the source or drain electrode layers 113, 114, 115 and 116, a composition mainly containing a metal particle, such as Ag (silver), Au (gold), Cu (copper), W (tungsten) and Al (aluminum) can be used. Additionally, a combination of indium tin oxide (ITO) having light transmissivity, ITSO including indium tin oxide and silicon oxide, organic indium, organic tin, zinc oxide, titanium nitride, and the like may be used.

In the through hole 125 formed in the gate insulating layer 106, the source or drain electrode layer 114 and the gate electrode layer 104 are electrically connected to each other. A portion of the source or drain electrode layer constitutes a capacitor element. The gate electrode layer 104 and the source or drain electrode layer 114 may be connected to each other through the buffer layer including at least one pore. The buffer layer including at least one pore formed in this embodiment mode has conductivity, thus the adhesiveness can be improved without electrical defects.

By combining a droplet discharge method, material loss can be prevented and cost reduction can be achieved in comparison with the entire surface coating formation by a spin coating method, or the like. By the present invention, a wiring or the like can be formed with good adhesiveness and stability even if the wiring or the like is aggregated by downsizing or thinning and arranged intricately.

As a pretreatment, an organic material based substance functioning as an adhesive agent may be formed to improve the adhesiveness to a conductive layer or an insulating layer by a droplet discharge method. In this case, a treatment for forming a region having a different wettability over the substance may be performed. An organic material (organic resin material) (for example, polyimide and acrylic) or a siloxane resin may also be used. Further, the siloxane material corresponds to a resin containing Si—O—Si bonds. The siloxane has a skeleton formed by the bond of silicon (Si) and oxygen (O). An organic group containing at least hydrogen (for example, alkyl group or aromatic hydrocarbon) is used as a substituent of the siloxane. A fluoro group may also be used as a substituent. In addition, an organic group containing at least hydrogen and a fluoro group may be used as a substituent.

Figure 7A:
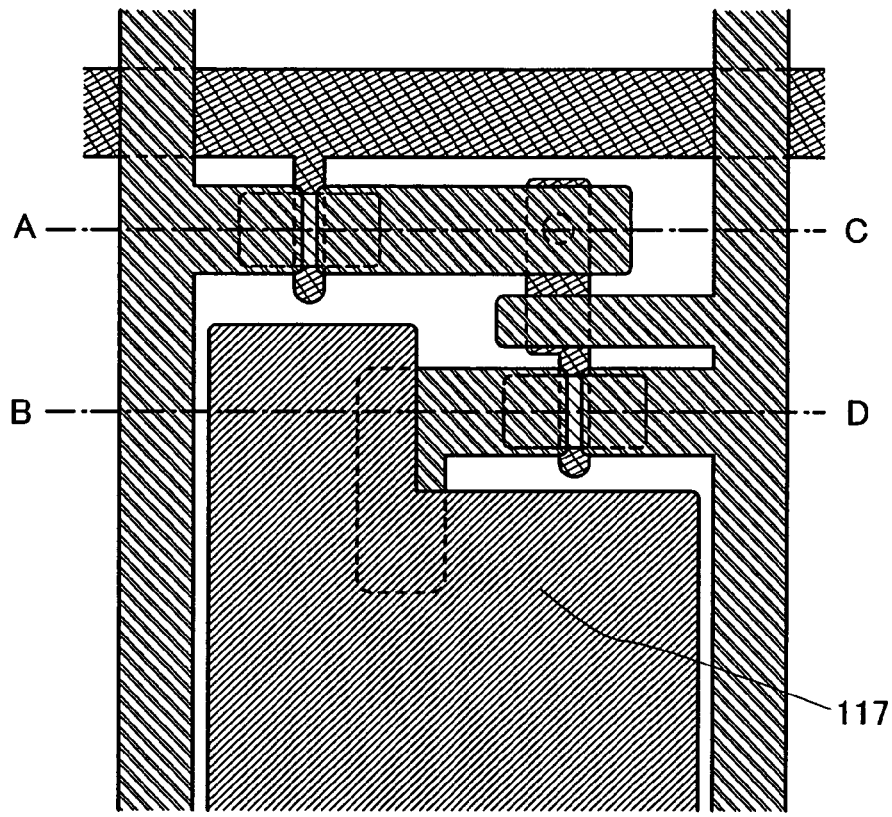
FIGS. 7A to 7C are diagrams describing a method for manufacturing a display device according to the present invention.
Figure 7B:
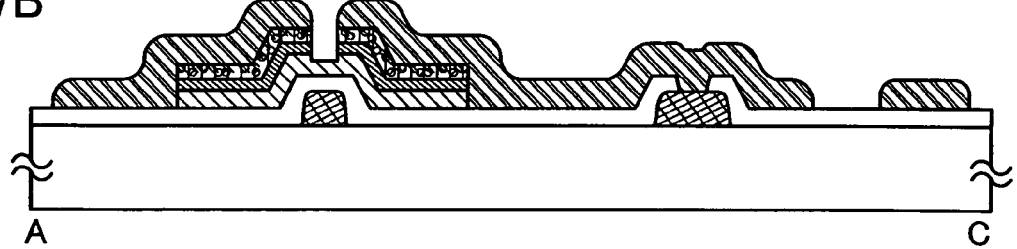
Figure 7C:
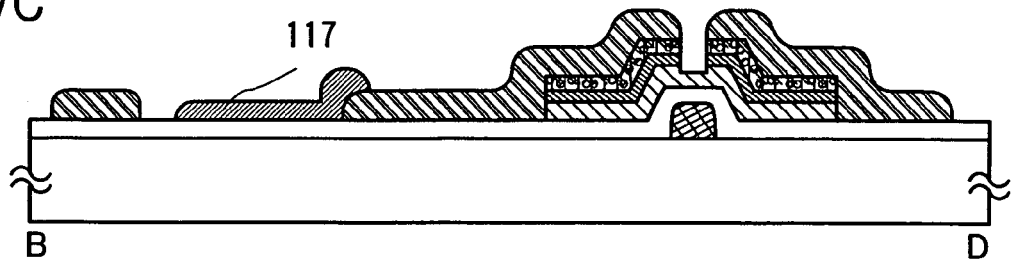

Subsequently, a composition containing a conductive material is selectively discharged on the gate insulating layer 106 to form a first electrode layer 117 (FIGS. 7A to 7C). It is needless to say that the buffer layer including at least one pore may be formed between the first electrode layer 117 and the source or drain electrode layer 116. In a case where light is emitted through the substrate 100, the first electrode layer 117 may be formed into a predetermined pattern using a composition including indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), and the like, and then baked.

Also, the first electrode layer 117 is preferably formed using indium tin oxide (ITO), indium tin oxide containing silicon oxide (ITSO), zinc oxide (ZnO) or the like by sputtering. More preferably, the first electrode layer 117 is made from indium tin oxide containing silicon oxide by sputtering with use of a target containing silicon oxide of 2 to 10 weight %. In addition, a conductive material in which zinc oxide (ZnO) is doped with gallium (Ga) or indium zinc oxide (IZO), which is a conductive oxide material, containing silicon oxide, and containing indium oxide mixed with zinc oxide (ZnO) of 2 to 20 weight %, may be used. After forming the first electrode layer 117 by sputtering, a mask layer is formed by a droplet discharge method, and then the first electrode layer may be etched into a desired pattern. In this embodiment mode, the first electrode layer 117 is formed using a conductive material having light transmissivity by a droplet discharge method. Concretely, the first electrode layer 117 is made from indium tin oxide or ITSO including ITO and silicon oxide.

The first electrode layer 117 can be selectively formed over the gate insulating layer 106 prior to forming the source or drain electrode layer 116. In this case, as for the connection structure between the source or drain electrode layer 116 and the first electrode layer 117, in this embodiment, the source or drain electrode 116 is stacked on the first electrode layer 117. When the first electrode layer 117 is formed prior to forming the source or drain electrode layer 116, the first electrode layer 117 can be formed on a flat formation region with good coverage. Accordingly, a polishing treatment such as CMP can be performed sufficiently, thereby forming the first electrode layer 117 with good flatness.

Alternatively, it is possible to use a structure in which an insulating layer which is to be an interlayer insulating layer, is formed over the source or drain electrode layer 116, and the source or drain electrode layer 116 is electrically connected to the first electrode layer 117 by a wiring layer. In this case, a substance having low wettability with respect to the insulating layer is formed over the source or drain electrode layer 116 without forming an opening portion (contact hole) by removing the insulating layer. Thereafter, a composition containing the insulating layer is applied by coating so that the insulating layers are formed in a region the substance having low wettability is not formed.

The insulating layer is solidified by heating, drying and the like, and then the substance having low wettability is removed to form an opening portion. A wiring layer is formed to fill the opening portion, and the first electrode layer 117 is formed to be in contact with this wiring layer. By using this method, since the opening portion is not necessary to be formed by etching, the process can be simplified.

Moreover, in a case where generated light is emitted to an opposite side of the substrate 100 side, a top emission type EL display panel is manufactured, a composition mainly containing a metal particle such as Ag (silver), Au (gold), Cu (copper), W (tungsten) and Al (aluminum) can be used. As another method, a transparent conductive film or a light reflective conductive film is formed by sputtering, a mask pattern is formed by a droplet discharge method, and the conductive film may be etched to form the first electrode layer 117.

The surface of the first electrode layer 117 may be polished by a CMP method or polished by using a polyvinyl alcohol type porous body, so that the surface thereof is planarized. Alternatively, after polishing the surface of the first electrode layer 117 by CMP, the surface thereof may be subjected to an ultraviolet light irradiation treatment, an oxygen plasma treatment, or the like.

By the above described steps, a TFT substrate for a display panel in which a bottom gate type TFT and the first electrode layer are connected over the substrate 100, is completed. The TFT in this embodiment mode is an inversely staggered TFT.

Next, an insulating layer 121 (also referred to as a partition wall or a bank) is selectively formed. The insulating layer 121 is formed to have an opening portion, over the first electrode layer 117. In this embodiment mode, the insulating layer 121 is formed over the entire surface, and processed by etching utilizing a mask made of resist or the like. When the insulating layer 121 is formed by a droplet discharge method, a printing method, or the like that can form a pattern directly and selectively, the processing step by etching is not necessarily required. Also, the insulating layer 121 can be formed into a desired shape by the pretreatment of the present invention.

The insulating layer 121 may be made from silicon oxide, silicon nitride, silicon oxynitride, aluminum oxide, aluminum nitride, aluminum oxynitride, or another inorganic insulating material; acrylic acid, methacrylic acid and derivatives thereof; a heat-resistant high molecular weight material such as polyimide, aromatic polyamide or polybenzimidazole; or a siloxane insulating material. The insulating layer 121 may also be made from a photosensitive or nonphotosensitive material such as acrylic or polyimide. The insulating layer 121 is preferably formed to have a shape in which a radius of curvature is varied continuously so as to increase the coverage of an electroluminescent layer 122 and a second electrode layer 123 that are formed thereover.

After forming the insulating layer 121 by discharging the composition by a droplet discharge method, the surface of the insulating layer 121 may be pressed with pressure so that the surface is planarized. As a method for pressing the surface of the insulating layer 121, a roller-like object may be scanned on the surface thereof to reduce the unevenness, or the surface thereof may be vertically pressed with a flat plate or the like. Alternatively, the surface of the insulating layer 121 may be softened or dissolved by using a solvent or the like and the unevenness on the surface thereof may be removed by using an air knife. Further, the surface of the insulating layer 121 may be polished by CMP. This step can be applied to a case where unevenness is formed on the surface by the droplet discharge method, and the surface is necessary to be planarized. When the surface is planarized by this step, display unevenness of a display panel or the like can be prevented so that a high-definition image can be displayed on the display panel.

A light emitting element is formed over the substrate 100, which is a TFT substrate for a display panel (FIGS. 8A and 8B).

Before forming the electroluminescent layer 122, a heat treatment is performed at 200° C. under atmospheric pressure to eliminate moisture absorbed inside of or on the surface of the first electrode 117 and the insulating layer 121. In addition, a heat treatment is performed at 200 to 400° C., preferably 250 to 350° C., under reduced pressure and the electroluminescent layer 122 is preferably formed by a vacuum evaporation method or by a droplet discharge method under reduced pressure without exposing the electroluminescent layer to an atmosphere.

Materials exhibiting light emission of red (R), green (G) and blue (B) are each selectively formed by evaporation using an evaporation mask, or the like as the electroluminescent layer 122. The material exhibiting light emission of red (R), green (G) and blue (B) (for example, a low molecular weight material or a high molecular weight material) can be formed by a droplet discharge method, as well as a color filter. Since the materials exhibiting light emission of the R, G and B can be individually applied without using a mask, the droplet discharge method is preferably used. The second electrode layer 123 is stacked over the electroluminescent layer 122 so that a display device using the light emitting element with a display function can be completed.

Although not shown in the drawings, it is effective to form a passivation film so as to cover the second electrode layer 123. A protective film for constituting a display device may have a single layer structure or multi-layer structure. The passivation film can be made of an insulating film including silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) in which the nitrogen content is higher than the oxygen content, aluminum oxide, diamond like carbon (DLC) or a carbon nitride ($CN_x$) film. The passivation film can be formed of a single layer of the insulating film or a stacked layer combining the insulating films. For example, a stacked structure of a carbon nitride ($CN_x$) film and silicon nitride (SiN) film can be used. In addition, an organic material can be used. A stacked layer of high molecular weight materials such as styrene polymer may be used. Also, a siloxane material may be used.

In this case, a film with excellent coverage is preferably used as the passivation film. A carbon film, in particular, a DLC film is effectively used. Since the DLC film can be formed within a temperature range of room temperature to 100° C., it can be formed easily over the electroluminescent layer having a low heat resistant property. The DLC film can be formed by plasma CVD (typically, RF plasma CVD, microwave CVD, electron cyclotron resonance (ECR) CVD, heat filament CVD, or the like), combustion flame, sputtering, ion beam evaporation, laser evaporation, or the like. Hydrogen gas and a gas containing hydrocarbon (for example $CH_4$, $C_2H_2$, $C_6H_6$, or the like) are used as reactive gases which are used for forming the film. The reactive gases are ionized by glow discharge. The ions are accelerated to collide with a negatively self-biased cathode. A CN film may be formed using $C_2H_4$ gas and $N_2$ gas as a reactive gas. The DLC film has a high blocking property with respect to oxygen and can prevent the electroluminescent layer from being oxidized. Accordingly, the DLC film can prevent the electroluminescent layer from being oxidized during a subsequent sealing step.

As shown in FIG. 9B, a sealing material 136 is formed, and sealing is carried out using a sealing substrate 140. After that, a flexible wiring substrate may be connected to the gate wiring layer that is formed being electrically connected to the gate electrode layer 103, so as to be electrically connected to an outside portion. This is similar to the source wiring layer that is formed being electrically connected to the source or drain electrode layer 113.

The substrate 100 having an element and the sealing substrate 140 are sealed by encapsulating a filling agent 135. A dropping method can be used for encapsulating the filling agent, as well as a liquid crystal material. An inert gas such as nitrogen can be used instead of the filling agent 135. Degradation due to water of the light emitting element can be prevented by providing a drying agent in a display device. The drying agent may be provided on either the sealing substrate 140 side or the substrate 100 side. The drying agent may also be provided in a region where the sealing material 136 is provided by forming a concave portion in the substrate. When the drying agent is provided in a place corresponding to a region on which display is not performed, such as a driver circuit region or a wiring region of the sealing substrate 140, an aperture ratio is not decreased even if the drying agent is not transparent. The filling agent 135 may be formed to contain a hydroscopic material so that the filling agent 135 has a function of the drying agent. Therefore, a display device having a display function using the light emitting element is completed (FIGS. 9A and 9B).

In addition, an FPC 139 is adhered to a terminal electrode layer 137 for electrically connecting inside and outside of the display device by using an anisotropic conductive film 138, and thus, the terminal electrode layer 137 is electrically connected to the FPC 139.

FIG. 9A shows a top view of a display device. As shown in FIG. 9A, a pixel portion 150, a scanning line driver region 151a, a scanning line driver region 151b and a connection region 153 are sealed between the substrate 100 and the sealing substrate 140 by the sealing material, and a signal line driver circuit 152 including an IC driver is provided over the substrate 100. Thin film transistors 133 and 134 are provided in the driver circuit region, and thin film transistors 130 and 131 are provided in the pixel portion.

In this embodiment, a case of sealing a light-emitting element using a glass substrate is explained. A sealing treatment is a treatment for protecting a light-emitting element against moisture. As a method for sealing treatment, any one of a method of sealing mechanically using a cover material, a method of sealing using thermo-setting resin or ultraviolet curing resin, or a method of sealing using a thin film having a high barrier property, such as metal oxides or nitrides is used. As the cover material, glass, ceramics, plastic, or metals can be used. In a case that light is emitted through the cover material, the cover material is required to have light-transmitting property. The cover material and a substrate provided with the above described light-emitting element are pasted to each other by the sealing material, such as thermo-setting resin or ultraviolet curing resin, and an enclosed space is formed by curing a resin using a heat treatment or an ultraviolet light irradiation treatment. It is also effective to provide absorbent as typified by barium oxide in the enclosed space formed by the cover material and the substrate. The absorbent may be provided on the sealing material, or over a bank or the periphery thereof so as not to prevent light from the light-emitting element. The space formed by the cover material and the substrate, on which a light emitting element is formed, can be filled with thermo-setting resin or ultraviolet curing resin. In this case, it is effective to add absorbent, typified by barium oxide into thermo-setting resin or ultraviolet curing resin.

In this embodiment mode, a switching TFT has a single gate structure. Alternatively, the switching TFT may have a multi gate structure, such as a double gate structure. In a case that a semiconductor is manufactured by an SAS or a crystalline semiconductor, an impurity region can be formed by adding an impurity imparting one conductivity type. In this case, the semiconductor layer may have an impurity region having different concentration. For example, a region that is overlapped with the vicinity of a channel region of the semiconductor layer and the gate electrode layer may be formed to be a low concentration impurity region, whereas the outer region of the region may be formed to be a high concentration impurity region.

As described above, a manufacturing process can be simplified by not using a light exposure process utilizing a photomask in this embodiment mode. In addition, even in a case of using a glass substrate of the fifth generation or later having a side of 1000 mm or more, a display panel can be easily manufactured by forming various patterns directly over the substrate by a droplet discharge method.

The present invention enables a desired pattern to be formed with good adhesiveness. In addition, material loss and costs can be reduced. Therefore, a display device having high performance and high reliability can be manufactured with high yield.

Embodiment Mode 3

Figure 11A:
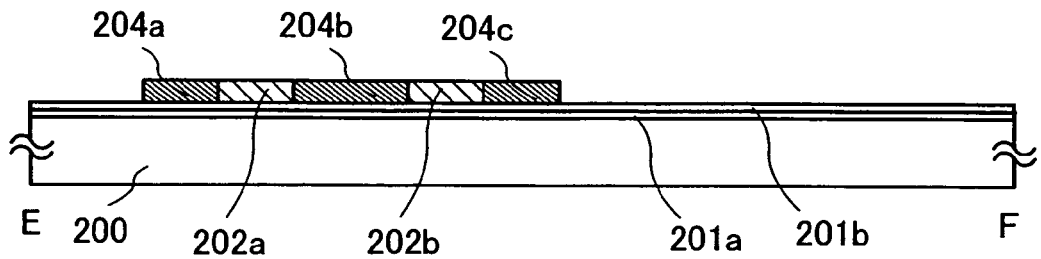
FIGS. 11A to 11D are diagrams describing a method for manufacturing a display device according to the present invention.

Embodiment Modes of the present invention will be described with reference to FIGS. 11 to 13. The details thereof will be described using a method for manufacturing a display device having a thin film transistor of a top gate planar structure obtained by applying the present invention. FIG. 12A is a top view of a pixel portion of the display device. FIGS. 11A to 11D and 12B are cross-sectional views of the pixel portion of the display device taken along line E-F in each process. FIG. 13A is also a top view of the display device, and FIG. 13B is a cross-sectional view taken along line O-P (including U-W) of FIG. 13A. An example of a liquid crystal display device using a liquid crystal material as a display element is shown. Therefore, a description of the same part or a part having a similar function will be omitted.

Over a substrate 200 having an insulated surface, a base film 201a is formed using a silicon nitride oxide (SiNO) film to have a film thickness of 10 to 200 nm (preferably 50 to 100 nm) by a sputtering method, a physical vapor deposition (PVD) method, a reduced-pressure method (LPCVD), or a chemical vapor deposition (CVD) method such as a plasma CVD method, and a base film 201b using a silicon oxynitride (SiON) film and having a film thickness of 50 to 200 nm (preferably, from 100 to 150 nm) is stacked thereon. In this embodiment mode, the base films 201a and 201b are formed by a plasma CVD method.

As the base film, silicon oxide, silicon nitride, silicon oxynitride, silicon nitride oxide or the like can be used, and a single layer structure or a stacked layer structure, such as two-layer or 3-layer may be used. In this specification, silicon oxynitride means a substance containing more oxygen than nitrogen, and it can also be referred to as silicon oxide containing nitrogen. In the same way, silicon nitride oxide means a substance containing more nitrogen than oxygen, and it can also be referred to as silicon nitride containing oxygen. In this embodiment mode, a silicon nitride oxide film is formed over a substrate to have a film thickness of 50 nm by using $SiH_4$, $NH_3$, $N_2O$, $N_2$ and $H_2$ as reactive gases, and a silicon oxynitride film is also formed over the substrate to have a thickness of 100 nm by using $SiH_4$ and $N_2O$ as the reactive gases. In addition, the thickness of the silicon nitride oxide film may be 140 nm and the thickness of the silicon oxynitride film to be stacked on the silicon nitride oxide film may be 100 nm.

A semiconductor layer is formed over the base film 201b. In this embodiment mode, a crystalline semiconductor layer is formed as the semiconductor layer. First, an amorphous semiconductor film is formed, then a metal film containing a metal element (in this embodiment mode, nickel (Ni)) which promotes crystallization, is formed and stacked thereon. Then, the amorphous semiconductor film is crystallized by a heat treatment to form a crystalline semiconductor film.

As a gettering layer which getters the metal element contained in the crystalline semiconductor film and which is contained for the purpose of promoting crystallization, a semiconductor film containing an rare gas element as an impurity element is formed to be in contact with the crystalline semiconductor film. For the rare gas element, helium, argon, xenon, krypton or the like can be used, and in this embodiment mode, a semiconductor film containing argon as the impurity element is formed. Then, by a heating treatment, the metal element contained in the crystalline semiconductor film moves and is captured within the semiconductor film. By this step, a crystalline semiconductor film with reduced metal content is formed. Then, the semiconductor film containing the metal element for promoting crystallization which became a gettering sink, and an oxide film formed over the crystalline semiconductor film are removed by hydrofluoric acid, and a crystalline semiconductor film in which the metal element is reduced or removed, can be obtained. In this embodiment mode, the semiconductor film serving as the gettering sink is removed with TMAH (tetramethyl ammonium hydroxide).

The crystalline semiconductor film is processed into a desired shape to form a mask over channel formation regions 202a and 202b of the semiconductor layer. By using the mask, an n-type impurity element (in this embodiment mode, phosphorus (P) is used) is added to the semiconductor layer to form n-type impurity regions 204a, 204b, and 204c, in the semiconductor layer as a source region or a drain region (FIG. 11A).

Figure 11B:
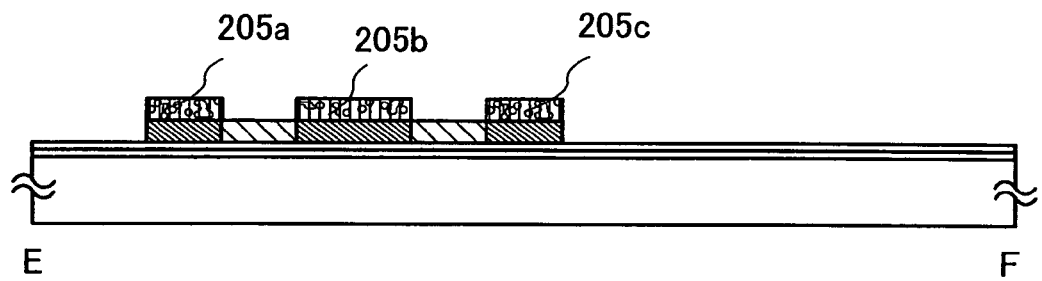
Figure 12A:
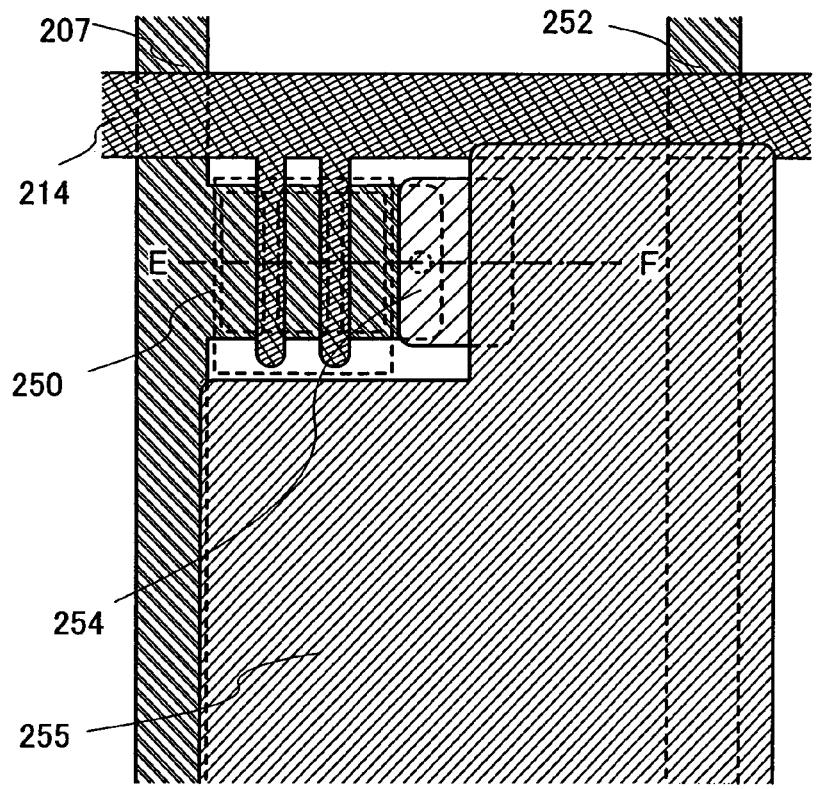
FIGS. 12A and 12B are diagrams describing a method for manufacturing a display device according to the present invention.

Buffer layers 205a, 205b, 205c (each including at least one pore) are selectively formed over the n-type impurity regions 204a, 204b, 204c (FIG. 11B). In this embodiment mode, the buffer layers 205a, 205b, 205c (each including at least one pore) are selectively formed by a droplet discharge method in the same manner as in Embodiment Mode 1, where the buffer layer including at least one pore is formed by using ITO. The buffer layers 205a, 205b, 205c (each including at least one pore) adhere well to the semiconductor layer having the n-type impurity regions 204a, 204b, 204c, and have conductivity. The buffer layers 205a, 205b, 205c (each including at least one pore) are fine as long as they have certain conductivity, and a conductive material such as metal, a semiconductor material, or the like may be used. Taking into consideration the resistance value, etc., an organic material, an inorganic material, a mixed material thereof, or the like can be selected. Furthermore, a material containing a plurality of materials can be used, such as an alloy, a compound, and a mixture.

Figure 11C:
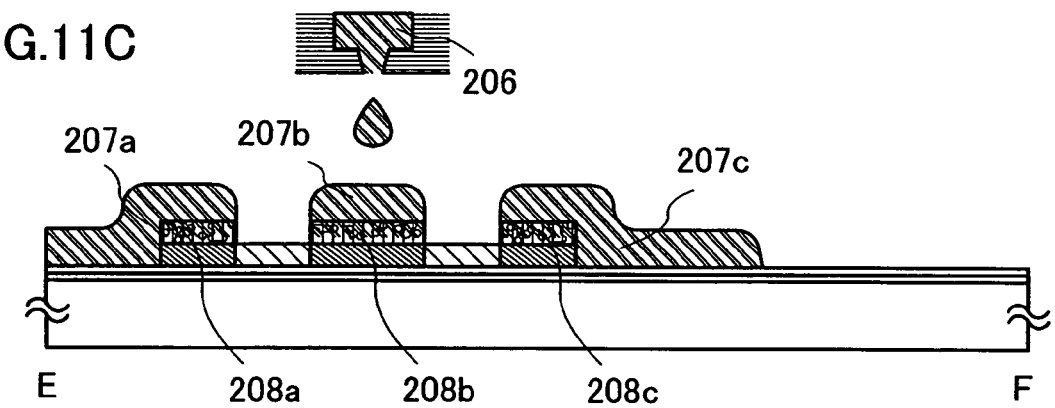

A composition containing a liquid conductive material is discharged from a droplet discharging device 206 over the buffer layers 205a, 205b, 205c (each including at least one pore). A particle shaped conductive material fills the pores of the buffer layers 205a, 205b, 205c (each including at least one pore), and is solidified in the pores by drying, and baking, to form source or drain electrode layers 207a, 207b, 207c (FIG. 11C). By the anchoring effect of the conductive layers solidified in the pores 208a, 208b, 208c, the adhesiveness of the source or drain electrode layers 207a, 207b, 207c is improved and can be formed with good stability. By the above described steps, the semiconductor layer having the n-type impurity regions 204a, 204b, 204c and the source or drain electrode layers 207a, 207b, 207c are formed to have good stability and adhesiveness to each other, and be electrically connected to each other through the buffer layers 205a, 205b, 205c (each including at least one pore).

Subsequently, a gate insulating layer 212 is formed over the source electrode layer, the drain electrode layer and the semiconductor layer. A known material such as a silicon oxide material or a silicon nitride material may be used as the gate insulating layer 212, and may be of a stacked layer or a single layer. In this embodiment mode, a stacked layer of a silicon oxide film and a silicon nitride film is used.

Figure 11D:
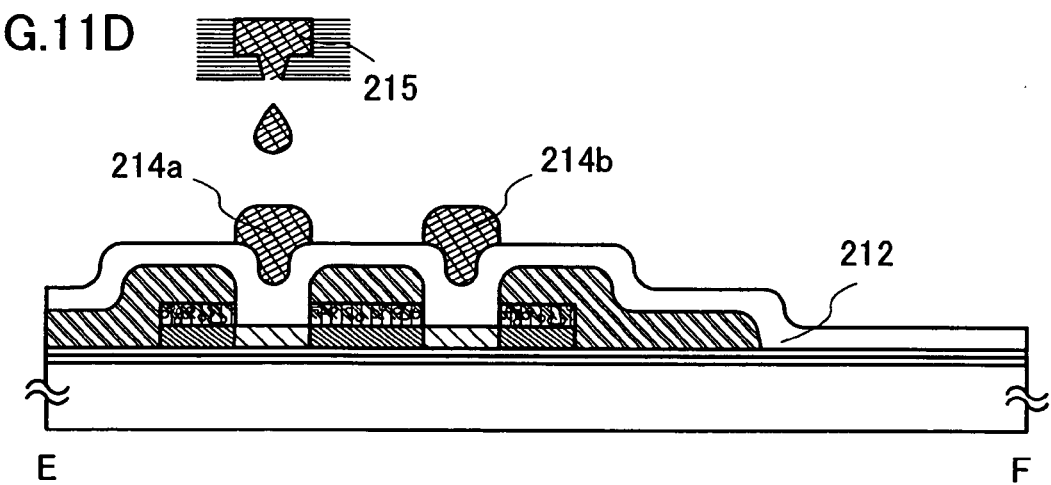

Gate electrode layers 214a, 214b are selectively formed over the gate insulating layer 212 with a droplet discharging device 215 (FIG. 11D). The gate electrode layers may be formed with the same material and the same steps as Embodiment Mode 1. In this embodiment mode, the gate electrode layers are formed using Ag. By the above described steps, a thin film transistor 250 having a top gate planar structure is formed.

An insulating film 259 and an insulating layer 260 are formed as an interlayer insulating layer so as to cover the thin film transistor 250. An opening portion reaching the source or drain electrode layer 207c is formed in the gate insulating layer 212, the gate insulating film 259 and the gate insulating layer 260, and a wiring layer 254 is formed in the opening portion.

Figure 12B:
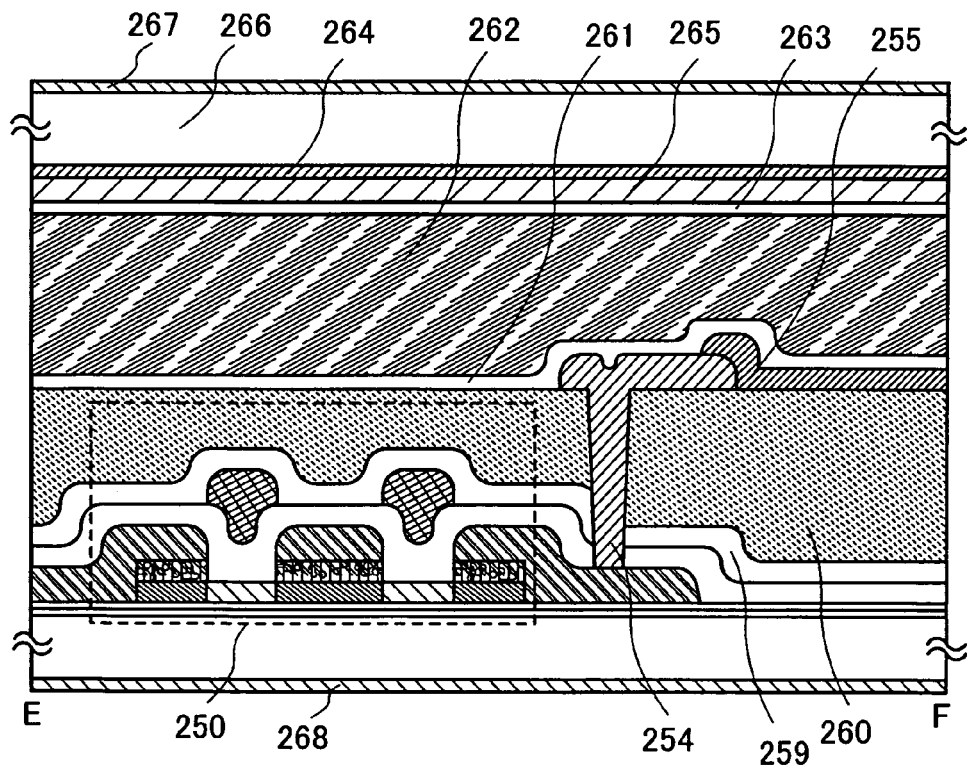
Figures 13A, 13B:
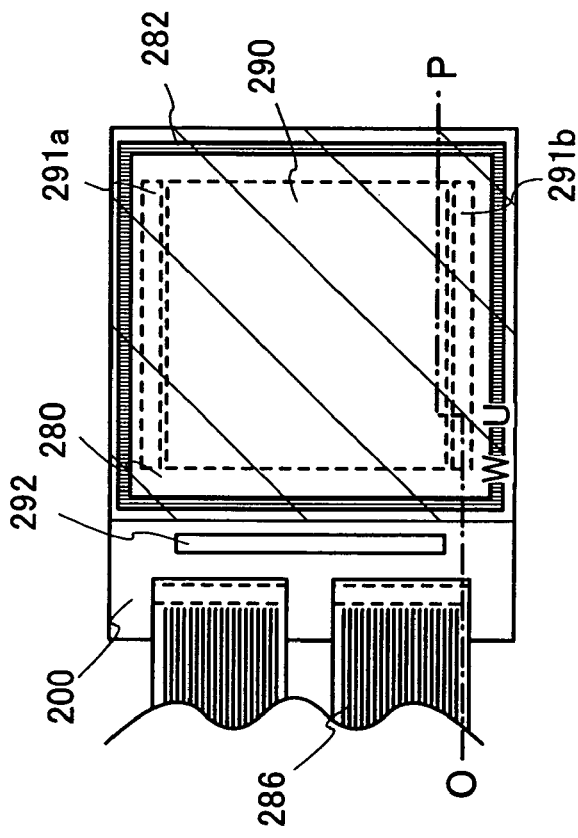
FIGS. 13A and 13B are diagrams describing a display device according to the present invention.

A composition containing a conductive material is selectively discharged, and a pixel electrode layer 255 in contact with the wiring layer 254 is formed to be electrically connected to the source or drain electrode layer 207c (FIG. 12B). The pixel electrode layer 255 can be formed with the same material as the first electrode layer 117. In a case of manufacturing a transparent liquid crystal display panel, the pixel electrode layer 255 may be formed in a predetermined pattern with a composition containing indium tin oxide (ITO), indium tin oxide containing slicon oxide (ITSO), zinc oxide (ZnO), tin oxide (SnO$_2$) or the like, by baking. It is needless to say that the above described material may be formed by a evaporation method (PVD method, CVD method), a sputtering method or the like. In this embodiment mode, indium tin oxide (ITO) is used as the pixel electrode layer 255.

FIG. 12A is a top view of a pixel portion of a display device and FIG. 12B is a cross-sectional view taken along line E-F of FIG. 12A. In the pixel portion, a thin film transistor 250 with a top gate type planar structure of the present invention, the source or drain electrode layer 207 which is also a source wiring layer, a capacitor wiring layer 252, the gate electrode layer 214 which is also a gate wiring layer, the wiring layer 254, the pixel electrode layer 255, the insulating film 259 and the insulating layer 260 are provided. The thin film transistor 250 has a multi gate structure, and the source or drain electrode layer of the thin film transistor 250 and the pixel electrode layer 255 are electrically connected to each other by the wiring layer 254.

Then, an insulating layer 261 called an alignment film is formed so as to cover the pixel electrode layer 255 and the thin film transistor 250, by a printing method or a spin coating method. Note that the insulating layer 261 can be selectively formed if a screen printing method or an offset printing method is used. Then, rubbing is performed. Subsequently, a sealing material 282 is formed by a droplet discharge method in the periphery of the region where the pixel is formed.

Subsequently, an insulating layer 263 functioning as an alignment film, a coloring layer 264 functioning as a color filter, a conductive layer 265 functioning as a counter electrode, and the counter substrate 266 provided with a polarizing plate 267 are attached to the substrate 200 having a TFT, with a spacer 281 therebetween, and by providing the space with a liquid crystal layer 262; a liquid crystal display device can be manufactured (FIGS. 13A and 13B). Furthermore, a polarizing plate 268 is also formed on the side of the substrate 200 that does not have a TFT. A sealing material may have a filling agent mixed in it, and further, the counter substrate 266 may be provided with a shielding film (a black matrix), or the like. Note that a dip method (a pumping method) by which a liquid crystal is injected utilizing the capillary phenomenon after attaching the counter substrate 266 or a dispensing method (a dropping method) can be used as a method for forming the liquid crystal layer.

Figure 23:
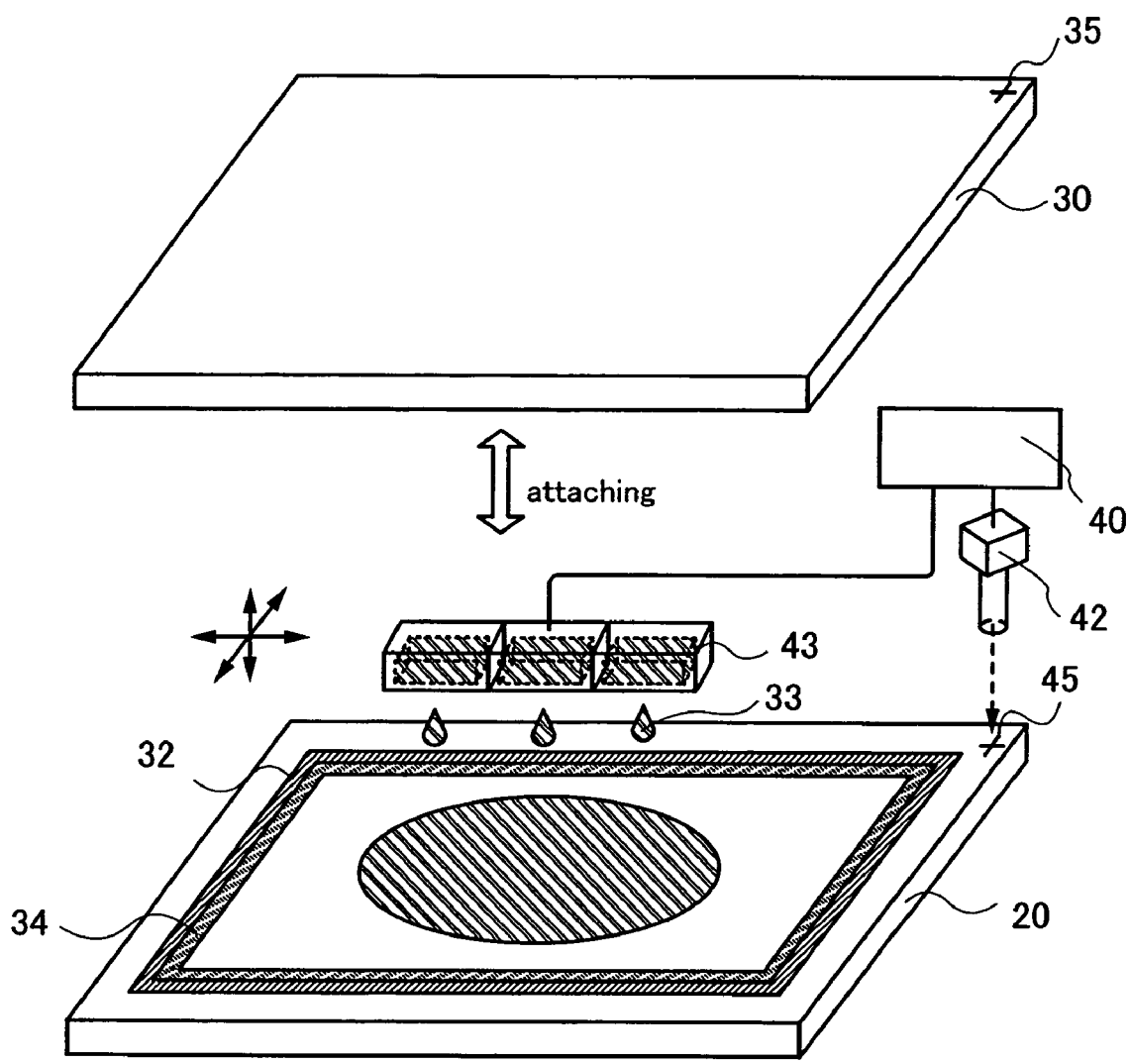
FIG. 23 is a diagram describing a structure of a droplet dropping device which can be applied to the present invention.

A liquid crystal drop injection method employing a dispenser method will be described with reference to FIG. 23. A liquid crystal drop injection method shown in FIG. 23 includes a control device 40, an imaging means 42, a head 43, a liquid crystal 33, markers 35 and 45, a barrier layer 34, a sealing material 32, a TFT substrate 30, and a counter substrate 20. A closed loop is formed by the sealing material 32, and the liquid crystal 33 is dropped once or multiple times therein from the head 43. Because a head 43 is equipped with a plurality of nozzles, and a large amount of the liquid crystal material can be dropped at once, throughput can be improved. When the liquid crystal material has a high viscosity, the liquid crystal material is continuously discharged and adheres to a liquid crystal formation region without a break. On the other hand, when the liquid crystal material has a low viscosity, the liquid crystal material is intermittently discharged and a droplet is dropped. To prevent the sealing material 32 and the liquid crystal 33 from reacting with each other, at this time, the barrier layer 34 is provided. Subsequently, the substrates are attached in vacuum, and then, ultraviolet curing is performed thereafter to make the space filled with the liquid crystal. In addition, the sealing material may be formed on the TFT substrate side, and the liquid crystal may be dropped.

The spacer may be formed by applying a particle of several μm, however in this embodiment mode, after a resin film is formed over the entire substrate, the resin film was processed into a desired shape to form the spacer. After such a material for the spacer is applied by a spinner, it is formed into a predetermined pattern by exposure and a development step. Further, the material is hardened by heating using a clean oven or the like at 150 to 200° C. The spacer formed in this manner can have different shapes depending on the condition of the exposure and development step. The shape of the spacer is preferably to be columnar and the top flat, so that the mechanical strength as a liquid crystal display device can be secured when the counter substrate and the TFT substrate are put together. The shape of the spacer can be conical, pyramidal, etc., and there is no specific limitation.

A connection portion is formed to connect the interior portion of the display device formed by the above described steps and an external wiring substrate. The insulating layer in the connection portion is removed by an ashing treatment using oxygen gas under atmospheric pressure or pressure close to the atmospheric pressure. This treatment is performed by using oxygen gas, and one or more gases selected from hydrogen, $CF_4$, $NF_3$, $H_2O$, and $CHF_3$. In this step, the ashing treatment is performed after sealing using the counter substrate to prevent damage or destruction due to static, however, the timing does not matter in performing the ashing treatment as long as there are few effects of static.

Subsequently, an FPC 286 which is a wiring substrate for connection, is provided to a terminal electrode 287 electrically connected to the pixel portion through an anisotropic conductive layer 285 (FIG. 13B). The FPC 286 functions to transmit a signal and potential from an exterior portion. Through the above described steps, the liquid crystal display device having a display function can be manufactured.

FIG. 13A is a top view of the liquid crystal display device. As shown in FIG. 13A, a pixel portion 290, scanning line driver regions 291a, 291b are sealed between the substrate 200 and the counter substrate 280 by the sealing material 282, and the signal line driver circuit 292 formed by an IC driver is provided over the substrate 200. In a driver region, a driver circuit having thin film transistors 283 and 284 are formed.

The thin film transistors 283 and 284 in this embodiment mode are n-channel thin film transistors in a peripheral driver circuit, therefore an NMOS circuit including the thin film transistors 283 and 284 are provided.

In this embodiment mode, a driver circuit region functions as an inverter using the NMOS structure, in the peripheral driver circuit. In a case of only a PMOS structure or only the NMOS structure, a portion of the gate electrode layer of the TFT is connected to the source or drain electrode layer.

Even though in this embodiment mode, a switching TFT having a double gate structure is described, a single gate structure or a multi gate structure may also be employed. When a semiconductor is manufactured with the use of a SAS or a crystalline semiconductor, an impurity region can be formed by adding an impurity having one conductivity type. In this case, the semiconductor layer may have impurity regions having different concentrations. For example, the periphery of a channel region of the semiconductor layer, and a region stacked with a gate electrode layer may be low concentration impurity regions, and the outer regions thereof may be high concentration impurity regions.

As described above, in this embodiment mode, the process can be simplified. In addition, even in a case of using a glass substrate of the fifth generation or later having a side of 1000 mm or more, a display panel can be easily manufactured by forming various components (pattern) directly on the substrate by a droplet discharge method.

The present invention enables a component constituting a display device to be formed in a desired pattern with good adhesiveness. In addition, material loss and costs can be reduced. Therefore, a display device having high performance and high reliability can be manufactured with high yield.

Embodiment Mode 4

A thin film transistor can be formed by applying the present invention, and a display device can be formed using the thin film transistor. When a light emitting element is used and an n-channel transistor is used as a transistor for driving the light emitting element, light emitted from the light emitting element is of a bottom emission, a top emission, or a dual emission. Here, a stacked structure of a light emitting element corresponding to each emission will be described with reference to FIGS. 16A to 16C.

Further, in this embodiment mode, channel protective type thin film transistors 461, 471, and 481 to which the present invention is applied, are used. The thin film transistor 481 is provided over a substrate 480 having light transmissivity and includes a gate electrode layer 493, a gate insulating film 497, a semiconductor layer 494, n-type semiconductor layers 492a, 492b, source or drain electrode layers 487a, 487b, a channel protective layer 496, and buffer layers 490a and 490b (each including at least one pore). The n-type semiconductor layer 492a and the source or drain electrode layer 487a, the n-type semiconductor layer 492b and the source or drain electrode layer 487b are formed to have good adhesiveness to each other by the buffer layers 490a and 490b (each including at least one pore). In this embodiment mode, a crystalline semiconductor layer is used as a semiconductor layer, and an n-type semiconductor layer is used as a semiconductor layer having one conductivity type. Instead of forming an n-type semiconductor layer, a semiconductor layer may be given conductivity by a plasma treatment using $PH_3$ gas. The semiconductor layer is not limited to that in this embodiment mode, and an amourphous semiconductor layer can also be used as shown in Embodiment Mode 1. In a case of using a crystalline semiconductor layer of polysilicon, or the like as in this embodiment mode, an impurity region having one conductivity type may be formed by introducing (adding) impurities into the crystalline semiconductor layer without forming the one conductivity type semiconductor layer. Further, an organic semiconductor such as pentacene can be used. When an organic semiconductor is selectively formed by a droplet discharge method, the steps for processing into a desired shape can be simplified.

In this embodiment mode, an amorphous semiconductor layer is crystallized to form a crystalline semiconductor layer as the semiconductor layer 494. In a crystallization process, an element (also referred to as a catalytic element or a metal element) that promotes crystallization is added to an amorphous semiconductor layer, and the crystallization is performed by a heat treatment (at a temperature of 550 to 750° C., for 3 minutes to 24 hours). As an element for promoting crystallization, one or a plurality of kinds selected from iron (Fe), nickel (Ni), cobalt (Co), ruthenium (Ru), rhodium (Rh), palladium (Pd), osmium (Os), iridium (Ir), platinum (Pt), cupper (Cu), and gold (Au) can be used. In this embodiment mode, nickel is used.

In order to remove or reduce the element promoting crystallization from the crystalline semiconductor layer, a semiconductor layer containing an impurity element is formed so as to be in contact with the crystalline semiconductor layer to function as a gettering sink. As the impurity element, an n-type impurity element, a p-type impurity element, a rare gas element or the like can be used. For example, one or a plurality of kinds selected from phosphorus (P), nitrogen (N), arsenic (As), antimony (Sb), bismuth (Bi), boron (B), helium (He), neon (Ne), argon (Ar), krypton (Kr), and xenon (Xe) can be used. In this embodiment mode, as a semiconductor layer containing an impurity element functioning as a gettering sink, an n-type semiconductor layer containing phosphorus (P) which is an n-type impurity element is formed. The semiconductor layer having n-type is formed as crystalline semiconductor layer containing the element promoting crystallization, and a heat treatment (at a temperature of 550 to 750° C., for 3 minutes to 24 hours) is performed. The element promoting crystallization contained in the crystalline semiconductor layer moves into the n-type semiconductor layer, and the element promoting the crystallization contained in the crystalline semiconductor layer is removed or reduced, and a semiconductor layer 494 is formed. On the other hand, the n-type semiconductor layer becomes an n-type semiconductor layer 492a, 492b containing a metal element promoting crystallization. In this manner, the n-type semiconductor layer 492a, 492b functions as a gettering sink of the semiconductor layer 494 and also functions as a source region and a drain region.

In this embodiment mode, the crystallization process and the gettering process of the semiconductor layer are performed by multiple heat treatments, however, the crystallization process and the gettering process can be performed by one heat treatment. In this case, a heat treatment may be performed after the amorphous semiconductor layer is formed, an element promoting crystallization is added, and the semiconductor layer which becomes the gettering sink is formed.

In this embodiment mode, a gate insulating layer is formed of a stacked layer. As a gate insulating film 497, a silicon nitride oxide film and a silicon oxynitride film are formed over the gate electrode layer 493 to form a two-layer structure. The insulating layers to be staked may be continuously formed by changing reactive gases without breaking the vacuum in the same chamber at the same temperature. When the insulating layers are formed continuously without breaking the vacuum, the films to be stacked can be prevented from being contaminated.

A channel protective layer 496 may be formed by dropping polyimide, polyvinyl alcohol, or the like by a droplet discharge method. As a result, an exposure process can be omitted. The channel protective layer may be formed from one kind of an inorganic material (such as silicon oxide, silicon nitride, silicon oxynitride, or silicon nitride oxide), a photosensitive or non-photosensitive organic material (an organic resin material) (polyimide, acrylic, polyamide, polyimide amide, a resist, benzocyclobutene, etc.), a low-dielectric constant material, and the like; a film made from a plurality of kinds thereof; a stacked layer of such films; or the like. A siloxane material may also be used. As a manufacturing method, a vapor phase growth method such as a plasma CVD method or a thermal CVD method, or a sputtering method can be used. A droplet discharge method or a printing method (a method for forming a pattern, such as screen printing or offset printing) can also be used. A coating film, etc. obtained by a coating method can also be used.

First, a case where light is emitted through the substrate 480, in other words, bottom emission is performed, will be described with reference to FIG. 16A. In this case, a first electrode layer 484, an electroluminescent layer 485, and a second electrode layer 486 are sequentially stacked to be in contact with the source or drain electrode layer 487b so as to be electrically connected to the thin film transistor 481. The substrate 480 through which light is transmitted is required to have light transmissivity with respect to at least light in a visible region. A case where light is emitted to the side opposite to a substrate 460, in other words, top emission is performed, will be described with reference to FIG. 16B. A thin film transistor 461 can be formed in a similar manner to the above described thin film transistor.

A source or drain electrode layer 462 which is electrically connected to the thin film transistor 461, is in contact with and to be electrically connected to a first electrode layer 463. The first electrode layer 463, an electroluminescent layer 464, a second electrode layer 465 are stacked in this order. The source or drain electrode layer 462 is a metal layer having reflexivity, and light emitted from a light emitting element is reflected in a direction shown by an arrow. Since the first electrode layer 463 is stacked over the source or drain electrode layer 462, even if light is transmitted though the first electrode layer 463 formed using a material having light transmissivity, the light is reflected at the source or drain electrode layer 462, and the light is emitted to the side opposite to the substrate 460. The first electrode layer 463 may be formed of a metal film having reflexivity. Since light emitted from a light emitting element is emitted through the second electrode layer 465, the second electrode layer 465 is formed of a material having light transmissivity with respect to at least light in a visible region. Finally, a case where light is emitted to both the substrate 470 and the opposite side thereto, in other words, dual emission is performed, will be described with reference to FIG. 16C. A thin film transistor 471 is also a channel protective thin film transistor. A first electrode layer 472 is electrically connected to a source or drain electrode layer 477 which is electrically connected to a semiconductor layer of the thin film transistor 471. A first electrode layer 472, an electroluminescent layer 473 and a second electrode layer 474 are stacked in this order. At this time, when both the first electrode layer 472 and the second electrode layer 474 are formed of materials having light transmissivity with respect to at least light in a visible region or formed to be thin enough to transmit light, dual emission is realized. In this case, the insulating layer and the substrate 470 through which light is transmitted, are also required to have light transmissivity with respect to at least light in a visible region.

Modes of a light emitting element which can be applied to this embodiment mode, is shown in FIGS. 18A to 18D. The light emitting element has a structure in which an electroluminescent layer 860 is provided between a first electrode layer 870 and a second electrode layer 850. The materials of the first electrode layer and the second electrode layer are required to be selected considering its work function. The first electrode layer and the second electrode layer each can be either an anode or a cathode depending on the pixel structure. In this embodiment mode, a driving TFT has n-type conductivity, and thus, it is preferable that the first electrode layer serves as a cathode and the second electrode layer serves as an anode. In a case where the driving TFT has p-channel conductivity, it is preferable that the first electrode layer serves as an anode and the second electrode layer serves as a cathode.

Figure 18A:
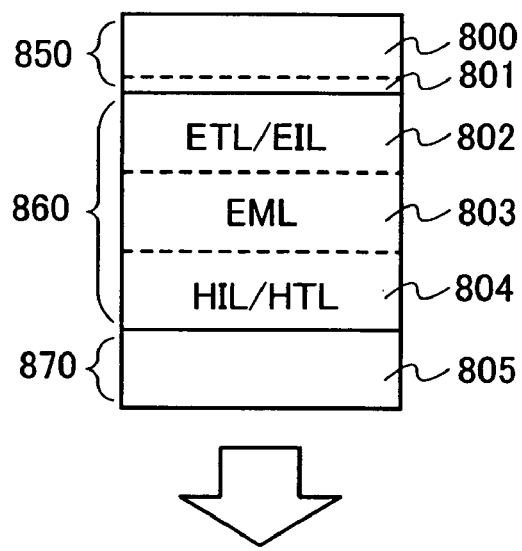
FIGS. 18A to 18D are diagrams describing a structure of a light emitting element which can be applied to the present invention.
Figure 18B:
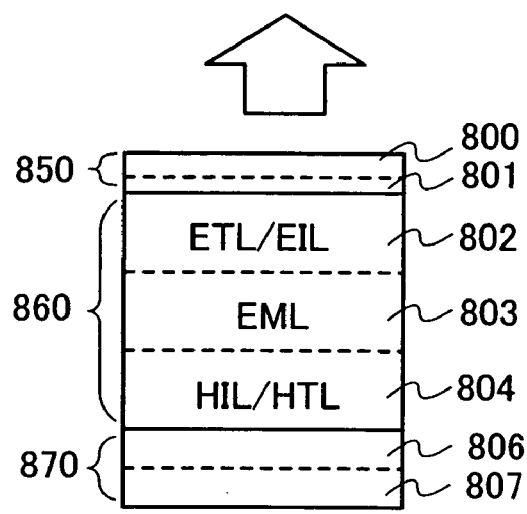

FIGS. 18A and 18B show the case where the first electrode layer 870 is an anode and the second electrode layer 850 is a cathode. The electroluminescent layer 860 preferably has a structure in which an HIL (hole injection layer) or an HTL (hole transport layer) 804, an EML (light emitting layer) 803, an ETL (electron transport layer) or an EIL (electron injection layer) 802, and the second electrode layer 850 are stacked in this order over the first electrode layer 870. FIG. 18A shows a structure in which light is emitted through the first electrode layer 870. The first electrode layer 870 is constituted by an electrode layer 805 containing a conductive oxide material having light transmissivity, and the second electrode layer is constituted by an electrode layer 801 containing an alkali metal or an alkaline earth metal such as LiF or MgAg and an electrode layer 800 made of a metal material such as aluminum from the electroluminescent layer 860 side. FIG. 18B shows a structure in which light is emitted from the second electrode layer 850. The first electrode layer is constituted by an electrode layer 807 formed of a metal material containing a metal such as aluminum or titanium, or a metal material containing such a metal and nitrogen of concentration in stoichiometric proportion or less and a second electrode layer 806 formed of a conductive oxide material containing silicon oxide in a concentration of 1 to 15 atomic %. The second electrode layer is constituted by an electrode layer 801 containing an alkali metal or an alkaline earth metal such as LiF or MgAg, and an electrode layer 800 formed of a metal material such as aluminum from the electroluminescent layer 860 side. Each layer is formed to have a thickness of 100 nm or less so that light can be transmitted, and thus, the light can be emitted through the second electrode layer 850.

Figure 18C:
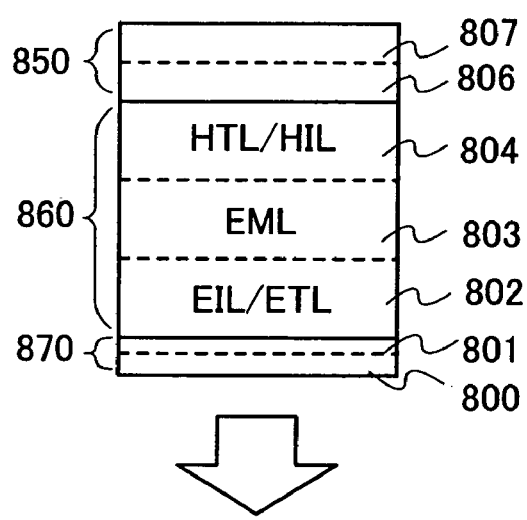
Figure 18D:
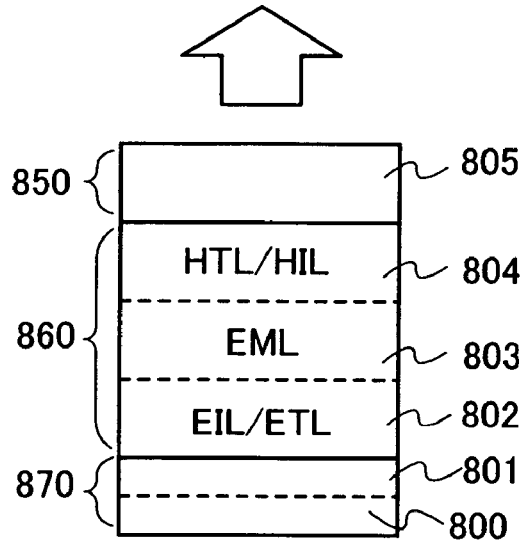

FIGS. 18C and 18D show the case where the first electrode layer 870 is a cathode and the second electrode layer 850 is an anode. The electroluminescent layer 860 preferably has a structure in which an EIL (electron injection layer) or an ETL (electron transport layer) 802, an EML (light emitting layer) 803, an HTL (hole transport layer) or HIL (hole injection layer) 804, and the second electrode layer 850 which is an anode are stacked in this order over the cathode side. FIG. 18C shows a structure in which light is emitted through the first electrode layer 870. The first electrode layer 870 is constituted by an electrode layer 801 containing an alkali metal or an alkaline earth metal such as LiF or MgAg, and an electrode layer 800 formed of a metal material such as aluminum from the electroluminescent layer 860 side. Each layer is formed to have a thickness of 100 nm or less to transmit light, and thus, the light can be emitted through the first electrode layer 870. The second electrode layer is constituted by the second electrode layer 806 formed of a conductive oxide material containing silicon oxide at a concentration of 1 to 15 atomic % and an electrode layer 807 formed of a metal such as aluminum or titanium, or a metal material containing such metal and nitrogen of concentration in stoichiometric proportion or less, from the electroluminescent layer 860 side. FIG. 18D shows a structure in which light is emitted through the second electrode layer 850. The first electrode layer 870 is constituted by an electrode layer 801 containing an alkali metal or an alkaline earth metal such as LiF or MgAg, and an electrode layer 800 formed of a metal material such as aluminum from the electroluminescent layer 860 side; the first electrode layer 870 is formed to be thick enough to reflect light produced in the electroluminescent layer 860. The second electrode layer 850 is constituted by an electrode layer 805 formed of a conductive oxide material having light transmissivity with respect to at least light in a visible region. Note that the electroluminescent layer may have a single layer structure or a mixed structure in addition to a stacked layer structure.

As the electroluminescent layer, materials exhibiting luminescence of red (R), green (G), and blue (B) are selectively formed by an evaporation method using each evaporation mask, or the like. The materials (low molecular weight materials or high molecular weight materials or the like) exhibiting luminescence of red (R), green (G), and blue (B) can be formed by a droplet discharge method in the same manner as a color filter, and this case is preferable since materials RGB can be individually formed without using a mask.

In a case of a top emission type, when ITO or ITSO having light transmissivity are used for the second electrode layer, BzOs-Li in which Li is added to benzoxazole derivatives (BzOs), or the like can be used. For example, $Alq_3$ doped with a dopant corresponding to each luminescent color of R, G, and B (DCM or the like for R, and DMQD or the like for G) may be used for the EML.

Note that the electroluminescent layer is not limited to the above described materials. For example, hole injection property can be improved by co-evaporating an oxide such as molybdenum oxide ($MoO_x$: x=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer. A material forming a light emitting element will be described below in detail.

As a substance having high electron transport property among charge injection transport materials, for example, a metal complex having a quinoline skeleton or a benzoquinoline skeleton such as tris(8-quinolinolato)aluminum ($Alq_3$), tris(5-methyl-8-quinolinolato)aluminum ($Almq_3$), bis(10-hydroxybenzo[h]-quinolinato)beryllium ($BeBq_2$), bis(2-methyl-8-quinolinolato)-4-phenylphenolato-aluminum (BAlq), can be given. As a substance having high hole transport property, for example, an aromatic amine compound (in other words, a compound having a bond of benzene ring-nitrogen) such as 4,4'-bis[N-(1-naphthyl)-N-phenyl-amino]-biphenyl (α-NPD), 4,4'-bis[N-(3-methylphenyl)-N-phenyl-amino]-biphenyl (TPD), 4,4',4"-tris(N,N-diphenyl-amino)-triphenylamine (TDATA), or 4,4',4"-tris[N-(3-methylphenyl)-N-phenyl-amino]-triphenylamine (MTDATA), can be given.

As a substance having high electron injection property among charge injection transport material, a compound of an alkali metal or an alkaline earth metal, such as lithium fluoride (LiF), cesium fluoride (CsF), or calcium fluoride ($CaF_2$), can be given. In addition, it may be a mixture of a substance having high electron transport property, such as $Alq_3$ and an alkaline earth metal such as magnesium (Mg).

As a substance having high hole injection property among charge injection transport material, for example, metal oxides such as molybdenum oxide (MoOx), vanadium oxide (VOx), ruthenium oxide (RuOx), tungsten oxide (WOx), manganese oxide (MnOx), are given. In addition, a phthalocyanine compound such as phthalocyanine ($H_2Pc$) or copper phthalocyanine (CuPc), can be given.

The light emitting layer may have a structure in which color display is codncuted by providing each pixel with light emitting layers having different emission wavelength ranges. Typically, light emitting layers each corresponding to color of R (red), G (green), and B (blue) are formed. In this case, color purity can be improved and a pixel portion can be prevented from having a mirror surface (reflection) by providing the emission side of the pixel with a filter which transmits light of an emission wavelength range. By providing a filter, a circularly polarizing plate or the like, which is conventionally required, can be omitted, and the loss of light emitted from the light emitting layer can be eliminated. Further, change in hue, which occurs when a pixel portion (display screen) is obliquely seen, can be reduced.

Various materials can be used for a light emitting material. As a low molecular weight organic light emitting material, 4-dicyanomethylene-2-methyl-6-[2-(1,1,7,7-tetramethyljulolidine-9-yl)ethenyl]-4H-pyran (abbreviation: DCJT); 2-tert-butyl-4-dicyanomethylene-6-[2-(1,1,7,7-tetramethyljulolidine-9-yl)ethenyl]-4H-pyran (abbreviation: DCJTB); periflanthene; 2,5-dicyano-1,4-bis[2-(10-methoxy-1,1,7,7-tetramethyljulolidine-9-yl)ethenyl]benzene; N,N'-dimethylquinacridon (abbreviation: DMQd); coumarin 6; coumarin 545T; tris(8-quinolinolato)aluminum (abbreviation: $Alq_3$); 9.9'-bianthryl; 9,10-diphenylanthracene (abbreviation: DPA); 9,10-bis(2-naphthyl)anthracene (abbreviation: DNA); and the like can be used. Another substance may also be used.

On the other hand, a high molecular weight organic light emitting material is physically stronger than a low molecular weight organic light emitting material and is superior in durability of the element. In addition, a high molecular weight organic light emitting material can be formed by coating method, and therefore, an element can be relatively easily manufactured. The structure of a light emitting element using a high molecular weight organic light emitting material has basically the same structure as in the case of using a low molecular weight organic light emitting material, that is, a cathode, an organic light emitting layer, and an anode are stacked in this order from the cathode side. However, a two-layer structure is employed in many cases when a light emitting layer using a high molecular weight organic light emitting material is formed. This is because it is difficult to form such a stacked structure as in the case of using a low molecular weight organic light emitting material. Specifically, the light emitting element using a high molecular weight organic light emitting material has a structure in which a cathode, a light emitting layer, a hole transport layer, and an anode are stacked in this order from the cathode side.

The emission color is determined depending on a material forming a light emitting layer; therefore, a light emitting element exhibiting a desired luminescence can be formed by selecting a material for the light emitting layer. As a high molecular weight electroluminescent material which can be used for forming a light emitting layer, a polyparaphenylene-vinylene-based material, a polyparaphenylene-based material, a polythiophene-based material, or a polyfluorene-based material can be given.

As the polyparaphenylene-vinylene-based material, a derivative of poly(paraphenylenevinylene) [PPV], poly(2,5-dialkoxy-1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV]; and the like can be given. As the polyparaphenylene-based material, a derivative of polyparaphenylene [PPP], poly(2,5-dialkoxy-1,4-phenylene) [RO-PPP]; poly(2, 5-dihexoxy-1,4-phenylene); and the like can be given. As the polythiophene-based material, a derivative of a polythiophene [PT], poly(3-alkylthiophene) [PAT]; poly(3-hexylthiophen) [PHT]; poly(3-cyclohexylthiophen) [PCHT]; poly (3-cyclohexyl-4-methylthiophene) [PCHMT]; poly(3,4-dicyclohexylthiophene) [PDCHT]; poly[3-(4-octylphenyl)-thiophene] [POPT]; poly[3-(4-octylphenyl)-2,2 bithiophene] [PTOPT]; and the like can be given. As the polyfluorene-based material, a derivative of polyfluorene [PF], poly(9,9-dialkylfluorene) [PDAF]; poly(9,9-dioctylfluorene) [PDOF]; and the like can be given.

When a high molecular weight organic light emitting material having hole transport property is interposed between an anode and a high molecular weight organic light emitting material having light emitting property, hole injection property from the anode can be improved. Generally, the high molecular weight organic light emitting material having hole transport property which is dissolved in water along with an acceptor material is applied by spin coating or the like. In addition, the high molecular weight light emitting material having hole injection properties is insoluble in an organic solvent; therefore, it can be formed over the above described high molecular weight organic light emitting material having light emitting property. As the high molecular weight organic light emitting material having hole transport property, a mixture of PEDOT and camphor-sulfonic acid (CSA) that serves as an acceptor material, a mixture of polyaniline [PANI] and polystyrene sulfonic acid [PSS] that serves as an acceptor material, and the like can be given.

The light emitting layer can be made to have a structure emitting single color or white light. When a white light emitting material is used, color display can be made possible by applying a structure in which a filter (a coloring layer) which transmits light having a specific wavelength is provided on the light emitting side of a pixel.

In order to form a light emitting layer that emits white light, for example, $Alq_3$, $Alq_3$ partly doped with Nile red that is a red light emitting pigment, $Alq_3$, p-EtTAZ, TPD (aromatic diamine) are stacked sequentially by a evaporation method to obtain white light. In a case that an electroluminescent layer is formed by a coating method using spin coating, it is preferably baked by vacuum heating after the coating. For example, an aqueous solution of poly(ethylene dioxythiophene)/poly(styrene sulfonic acid) solution (PEDOT/PSS) functioning as a hole injection layer may be entirely applied and baked. Then, a polyvinyl carbazole (PVK) solution doped with a luminescent center pigment (1,1,4,4-tetraphenyl-1,3-butadiene (TPB); 4-dicyanomethylene-2-methyl-6-(p-dimethylamino-styryl)-4H-pyran (DCM1); Nile red; coumarin 6; or the like) functioning as a light emitting layer, may be entirely applied and baked.

The light emitting layer may be formed as a single layer. For example, a 1,3,4-oxadiazole derivative (PBD) having electron transport property may be dispersed in polyvinyl carbazole (PVK) having hole transporat property. Further, white light emission can be obtained by dispersing PBD of 30 wt % as an electron transporting agent and dispersing an appropriate amount of four kinds of pigments (TPB, coumarin 6, DCM1, and Nile red). In addition to the light emitting element from which white light emission can be obtained as shown here, a light emitting element which can provide red light emission, green light emission, or blue light emission can be formed by appropriately selecting a material of the light emitting layer.

When a high molecular weight organic light emitting material having hole transport property is interposed between an anode and a high molecular weight organic light emitting material having light emitting property, hole injection property from the anode can be improved. Generally, the high molecular weight organic light emitting material having hole transport property which is dissolved in water along with an acceptor material is applied by spin coating or the like. In addition, the high molecular weight organic light emitting material having hole injection properties is insoluble in an organic solvent; therefore, it can be formed over the above described organic light emitting material having light emitting property. As the high molecular weight organic light emitting material having hole transport property, a mixture of PEDOT and camphor-sulfonic acid (CSA) that serves as an acceptor material, a mixture of polyaniline [PANI] and polystyrene sulfonic acid [PSS] that serves as an acceptor material, and the like can be given.

Further, a triplet excitation light emitting material such as a metal complex or the like as well as a singlet excitation light-emitting material may be used for the light emitting layer. For example, among pixels emitting red, green, and blue light, a pixel emitting red light whose luminance is reduced by half in a relatively short time is formed of a triplet excitation light emitting material, and the others are formed of a singlet excitation light emitting material. A triplet excitation light emitting material has a feature that the material has a good luminous efficiency and consumes less power to obtain the same luminance. That is, when a triplet excitation light emitting material is used for a red pixel, only small amount of current needs to be supplied to a light emitting element. Thus, the reliability can be improved. A pixel emitting red light and a pixel emitting green light may be formed of a triplet excitation light emitting material and a pixel emitting blue light may be formed of a singlet excitation light emitting material to achieve low power consumption. Low power consumption can be further achieved by forming a light emitting element which emits green light, which is highly detected by humans, with a triplet excitation light emitting material.

A metal complex used as a dopant can be given as an example of a triplet excitation light emitting material, and a metal complex having platinum that is a third transition series element as a central metal, a metal complex having iridium as a central metal, and the like are known. A triplet excitation light emitting material is not limited to the compounds. A compound having the above described structure and an element belonging to any of the Groups 8 to 10 of the periodic table as a central metal can also be used.

The above described materials for forming the light emitting layer are just examples. A light emitting element can be formed by appropriately stacking functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or a light emitting region, modification such as providing an electrode layer for the purpose or providing a dispersed light emitting material is acceptable as long as it does not deviate from the spirit of the present invention.

A light emitting element formed with the above described materials emits light when a bias is applied in a forward direction. A pixel of a display device formed with a light emitting element can be driven by a simple matrix mode or an active matrix mode. In any event, each pixel emits light by applying a forward bias thereto at a specific timing; however, the pixel is in a non-light-emitting state for a certain period. The reliability of a light emitting element can be improved by applying a reverse bias at the non-light-emitting time. As for a light emitting element, there is a deterioration mode in which emission intensity is decreased under specific driving conditions or a deterioration mode in which a non-light-emitting region is enlarged in a pixel and luminance is apparently decreased. However, progression of deterioration can be slowed down by alternating current driving where bias is applied in a forward and reverse direction. Thus, the reliability of a light emitting device can be improved. Additionally, either digital driving or analog driving can be applied.

Figure 16A:
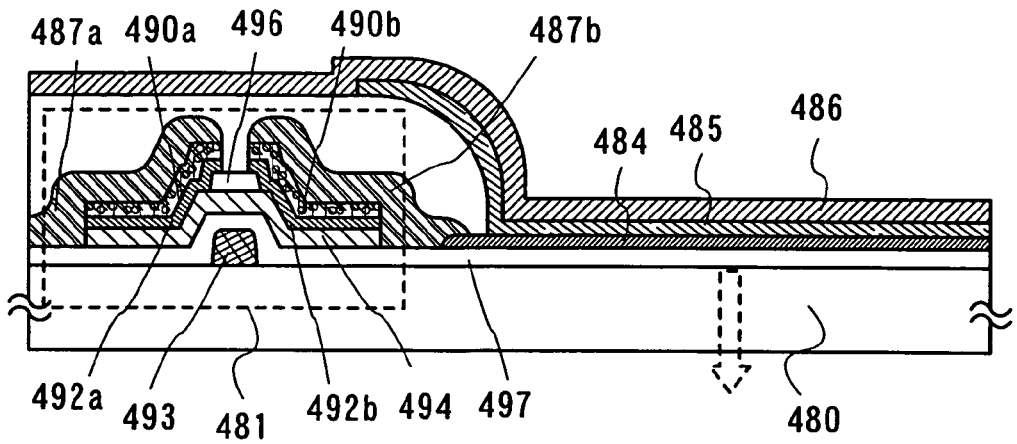
FIGS. 16A to 16C are diagrams describing a method for manufacturing a display device according to the present invention.
Figure 16B:
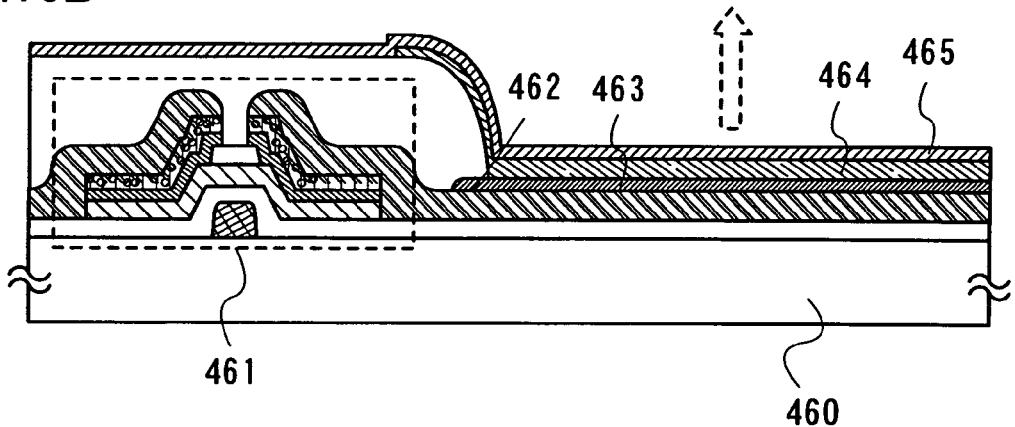
Figure 16C:
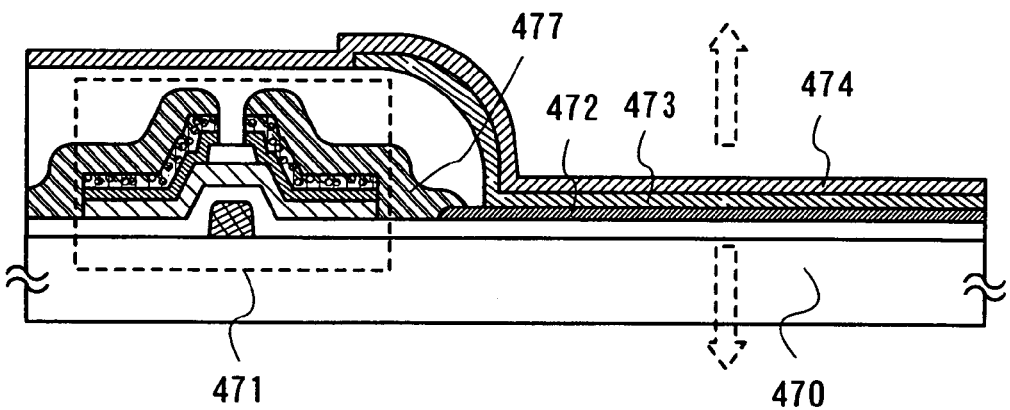

A color filter (coloring layer) may be formed over the sealing substrate opposite to the substrate having an element although not shown in FIGS. 16A to 16C. The color filter (coloring layer) can be selectively formed by a droplet discharge method. By using the color filter (coloring layer), high-definition display can also be performed. This is because a broad peak can be modified to be sharp in light emission spectrum of each RGB.

The case of forming a material exhibiting each luminescence of R, G, and B is shown above; however, full color display can be performed by forming a material displaying a single color and combining a color filter and a color conversion layer. The color filter (coloring layer) or the color conversion layer may be formed over, for example, a sealing substrate and may be attached to a substrate. As described above, any of the material exhibiting a single color, the color filter (coloring layer) and the color conversion layer can be formed by a droplet discharge method.

It is needless to say that display may be performed in monochrome. For example, an area color type display device may be manufactured by using single color emission. The area color type is suitable for a passive matrix type display portion, and characters and symbols can be mainly displayed.

In the above described structure, it is possible to use a low work function material as a cathode, for example, Ca, Al, CaF$_2$, MgAg, AlLi, or the like is desirable. Any of a single layer type, a stacked layer type, a mixed layer type having no interface between layers can be used for the electroluminescent layer. The electroluminescent layer may be formed by a singlet material, a triplet material, or a mixture of the materials; or a charge-injection transport material and a light emitting material including an organic compound or an inorganic compound, which includes one layer or a plurality of layers selected from a low molecular weight organic compound material, a middle molecular weight organic compound (which means an organic compound having no sublimation property, and the number of molecules is 20 or less, or the length of linked molecules is 10 μm or less), and a high molecular weight organic compound, which are categorized in accordance with the number of molecules. They may be combined with an electron injection-transport inorganic compound or a hole injection-transport inorganic compound. The first electrode layer 484, the second electrode layer 465, the first electrode layer 472, and the second electrode layer 474 are formed by using a transparent conductive film which transmits light. For example, a transparent conductive film in which zinc oxide (ZnO) of 2 to 20% is mixed in indium oxide is used, in addition to ITO or ITSO. A plasma treatment in oxygen atmosphere or a heat treatment in vacuum atmosphere may preferably be performed before forming the first electrode layer 484, the first electrode layer 463, and the first electrode layer 472. The partition wall (also referred to as a bank) is formed by using a material containing silicon, an organic material and an organic compound material. In addition, a porous film may also be used. However, when a photosensitive material or a non-photosensitive material such as acrylic or polyimide is used, the side face thereof has a shape in which a radius curvature changes continuously, and an upper layer thin film is formed without disconnection due to a step, which is preferable. This embodiment mode can be freely combined with Embodiment Mode 1 and Embodiment Mode 2.

Embodiment Mode 5

Then, a mode in which a driver circuit for driving is mounted on a display panel manufactured by Embodiment Modes 2 to 4 will be described.

First, a display device employing a COG mode is described with reference to FIG. 22A. A pixel portion 2701 displaying information on characters, images or the like is provided over a substrate 2700. A substrate provided with a plurality of driver circuits is divided into rectangles, and the driver circuits (also referred to as a driver IC) 2751 after being divided is mounted on the substrate 2700. FIG. 22A shows a mode of mounting a plurality of driver ICs 2751 and mounting FPCs 2750 on the end of the driver ICs 2751. In addition, the divided size may be made almost the same as the length of a pixel portion on a signal line side, and as a single driver IC, a tape may be mounted on the end of the driver IC.

A TAB mode may also be adopted. In that case, a plurality of tapes may be attached and driver ICs may be mounted on the tape as shown in FIG. 22B. Similarly to the case of the COG mode, a single driver IC may be mounted on a single tape. In that case, a metal piece or the like for fixing the driver IC may be attached together in terms of intensity.

A plurality of the driver ICs to be mounted on the display panel are preferably formed over a rectangular substrate in terms of improving the productivity.

In other words, a plurality of circuit patterns including a driver circuit portion and an input-output terminal as a unit, are formed over the substrate, and may be divided and taken out. In view of a side length of the pixel portion or the pixel pitch, the driver IC may be formed to be a rectangular having a long side of 15 to 80 mm and a short side of 1 to 6 mm. Alternatively, the driver IC may be formed to have a length of a side length of the pixel portion or a total length of a side length of the pixel portion and a side length of each driver circuit.

An advantage of the external dimension of an IC chip of the driver IC is the length of the long side. When a driver IC having a long side of from 15 to 80 mm is used, the number of driver ICs necessary for mounting in accordance with the pixel portion is less than that in the case of using an IC chip. Therefore, a yield in manufacturing can be improved. The shape of a substrate used as a parent body is not limited, thus, the productivity is not impaired when a driver IC is formed over a glass substrate. This is a great advantage compared with the case of taking IC chips out of a circular silicon wafer.

When a scanning line driver circuit 3702 is integrated over the substrate as shown in FIG. 25B, the driver IC provided with a signal line driver circuit is mounted on a region outside a pixel portion 3701. The driver IC is a signal line driver circuit. In order to form a pixel portion corresponding to RGB full color, 3072 signal lines are required for an XGA class and 4800 signal lines are required for a UXGA class. The signal lines formed in such a number are divided into several blocks on an end of the pixel portion 3701 to form leading lines. The signal lines are gathered corresponding to the pitches of output terminals of the driver ICs.

The driver IC is preferably made of a crystalline semiconductor formed over a substrate. The crystalline semiconductor is preferably formed by being irradiated with continuous wave laser light. Therefore, a continuous wave solid laser or gas laser is used as an oscillator for generating the laser light. There are few crystal defects when a continuous wave laser is used, and as a result, a transistor can be formed by using a polycrystalline semiconductor layer with crystals having a large grain size. In addition, high-speed driving is possible since mobility or response speed is good, and it is possible to further improve the operating frequency of an element than that of a conventional element. Therefore, high reliability can be obtained since there are few of characteristics variations. Note that the channel length direction of a transistor and a scanning direction of laser light may be directed in the same direction to further improve the operating frequency. This is because the highest mobility can be obtained when the channel length direction of the transistor and the scanning direction of the laser light with respect to the substrate are almost parallel (preferably, from −30° to 30°) in a step of laser crystallization by a continuous wave laser. The channel length direction coincides with the flowing direction of a current, in other words, a direction in which an electric charge moves in a channel formation region. The thus manufactured transistor has an active layer formed with a polycrystalline semiconductor layer in which crystal grains are extended in the channel direction, and this means that a crystal grain boundary is formed almost along the channel direction.

In order to perform laser crystallization, it is preferable that the laser light is focused, and the shape of the laser light (beam spot) thereof preferably has the same width as that of a short side of the driver ICs, approximately from 1 to 3 mm. In addition, in order to secure the enough and effective energy density for an object to be irradiated with laser light, an irradiation region of the laser light preferably has a linear shape. However, the term "linear" used here refers to not a line in a strict sense but a rectangle or an oblong with a large aspect ratio. For example, the linear shape refers to a rectangle or an oblong with an aspect ratio of 2 or more (preferably from 10 or more to 10000 or less). Thus, it is possible to provide a method for manufacturing a display device in which productivity is improved by making a beam spot width of the shape of the laser light equal to that of a short side of the driver ICs.

As shown in FIGS. 22A and 22B, driver ICs may be mounted as both a scanning line driver circuit and a signal line driver circuit. In this case, it is preferable that the design of the driver ICs used on the scanning line side is different from that of the driver ICs used on the signal line side.

In the pixel portion, the signal line and the scanning line intersect to form a matrix, and a transistor is arranged in each intersection portion. One feature of the present invention is that a TFT having an amorphous semiconductor or a semiamorphous semiconductor as a channel portion is used as the transistor arranged in the pixel portion. The amorphous semiconductor is formed by a method such as plasma CVD or sputtering. It is possible to form the semiamorphous semiconductor at a temperature of 300° C. or less by plasma CVD. A film thickness necessary to form a transistor is formed in a short time even in a case of a non-alkaline glass substrate of an outer size of, for example, 550×650 mm. Such feature of the manufacturing technique is effective in manufacturing a display device having a large screen. In addition, a semiamorphous TFT can obtain electric field effect mobility of from 2 to 10 cm$^2$/V-sec by forming a channel formation region by an SAS. When the present invention is applied, a fine wiring having a short channel width can be stably formed without a defect such as a short circuit since a pattern can be formed with a desired shape and with good controllability. A TFT having electric characteristics required to operate pixels sufficiently can be formed. Therefore, this TFT can be used as a switching element of a pixel and as an element constituting the scanning line driver circuit. Thus, a display panel in which system-on-panel is realized can be manufactured.

A scanning line driver circuit can also be integrated over the substrate by using a TFT having a semiconductor layer formed using an SAS. When a TFT having a semiconductor layer formed using an AS is used, both a scanning line driver circuit and a signal line driver circuit may be mounted as a driver IC.

In this case, it is preferable that the design of the driver IC used as the scanning line side is different from that of the driver IC used on the signal line side. For example, although the withstand voltage of approximately 30 V is required for a transistor constituting a scanning line driver IC, a driving frequency of 100 kHz or less is also required, and therefore, relatively high-speed operation is not required. Accordingly, it is preferable that the channel length (L) of the transistor constituting the scanning line driver IC is set to be sufficiently long. On the other hand, although the transistor of the signal line driver IC requires the withstand voltage of only about 12 V, it requires a driving frequency of about 65 MHz at 3V, and therefore, high-speed operation is required. Therefore, the channel length of a transistor constituting a driver is preferably set to be with a micrometer rule. By using the present invention, a microscopic pattern can be formed with good controllability, and thus, it can be formed with a micrometer rule.

The method for mounting driver ICs is not especially limited, and a known COG mode, wire bonding method, or TAB mode can be used.

By adjusting the thickness of a driver IC to the thickness of a counter substrate, the height of the driver IC is approximately equal to the height of the counter substrate, thereby contributing to the reduction in thickness of a whole display device. Also, by forming each substrate by using the same material, heat stress is not generated even when a temperature of the display device is changed and the characteristics of a circuit manufactured using a TFT are not impaired. Additionally, by mounting driver circuits with driver ICs longer than IC chips, as shown in this embodiment mode, the number of the driver ICs mounted on one pixel portion can be reduced.

As described above, the driver circuits can be incorporated into a display panel.

Embodiment Mode 6

An example of a protective circuit included in a display device of the present invention will be described.

Figure 24A:
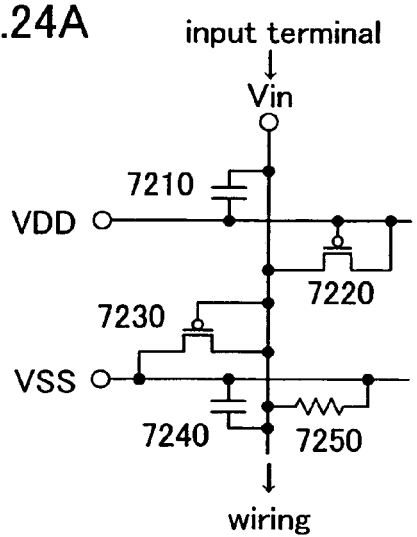
FIGS. 24A to 24E are diagrams each showing a protective circuit to which the present invention is applied.
Figure 24D:
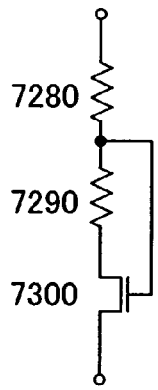

As shown in FIGS. 22A and 22B, a protective circuit 2713 is formed between an external circuit and an internal circuit. The protective circuit is formed of one or a plurality of elements selected from a TFT, a diode, a resistor element, a capacitor element, and the like. Several configurations of a protective circuit and the operation thereof are described below. First, the configuration of an equivalent circuit of a protective circuit which is disposed between an external circuit and an internal circuit and which corresponds to one input terminal is described with reference to FIGS. 24A to 24E. The protective circuit shown in FIG. 24A includes p-channel thin film transistors 7220 and 7230, capacitor elements 7210 and 7240, and a resistor element 7250. The resistor element 7250 has two terminals, one is supplied with an input voltage Vin (hereinafter referred to as Vin) and the other is supplied with a low-potential voltage VSS (hereinafter referred to as VSS).

Figure 24B:
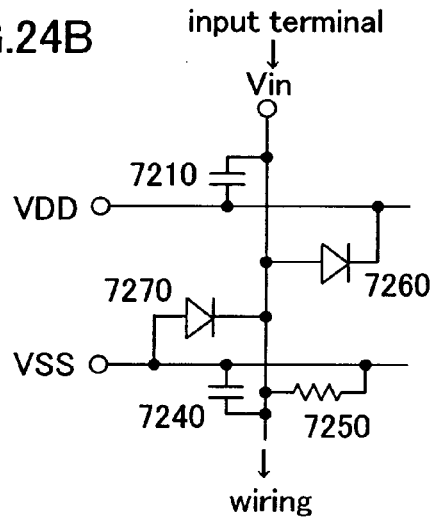
Figure 24E:
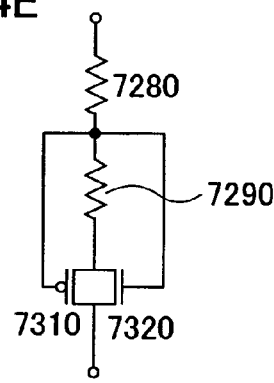
Figure 24C:
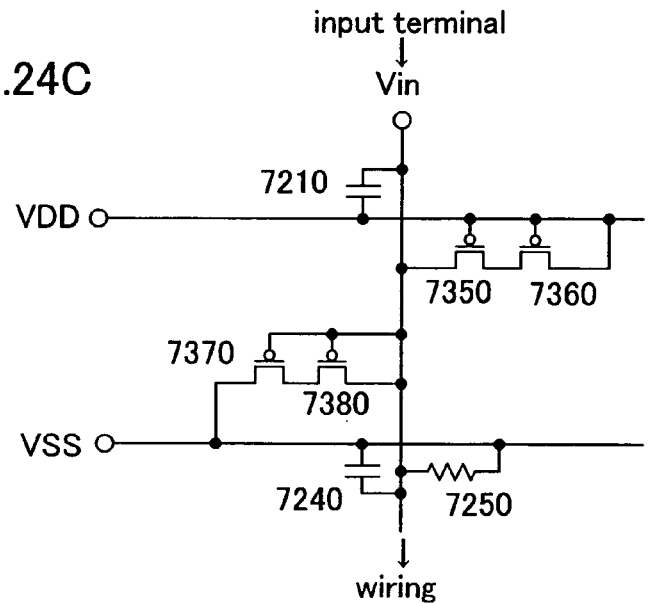

The protective circuit shown in FIG. 24B is an equivalent circuit diagram in which the p-channel thin film transistors 7220 and 7230 are substituted with rectifying diodes 7260 and 7270. A protective circuit shown in FIG. 24C is an equivalent circuit diagram in which the p-channel thin film transistors 7220 and 7230 are substituted with TFTs 7350, 7360, 7370, and 7380. In addition, a protective circuit shown in FIG. 24D includes resistors 7280 and 7290, and an n-channel thin film transistor 7300 as another configuration of the protective circuit. A protective circuit shown in FIG. 24E includes resistors 7280 and 7290, a p-channel thin film transistor 7310, and an n-channel thin film transistor 7320. By providing a protective circuit, a sudden surge of potentials can be prevented, thereby preventing an element from being broken down or damaged, which results in higher reliability. Note that an element having the above described protective circuit is preferably formed using an amorphous semiconductor having high withstand voltage. This embodiment mode can be freely combined with the above described embodiment modes.

This embodiment mode can be used combining with each of Embodiment Mode 1 to 5.

Embodiment Mode 7

A structure of a pixel of a display panel described in this embodiment mode will be described with reference to equivalent circuit diagrams shown in FIGS. 17A to 17F. In this embodiment mode, an example in which a light emitting element (EL element) is used as a display element of a pixel is described.

Figure 17A:
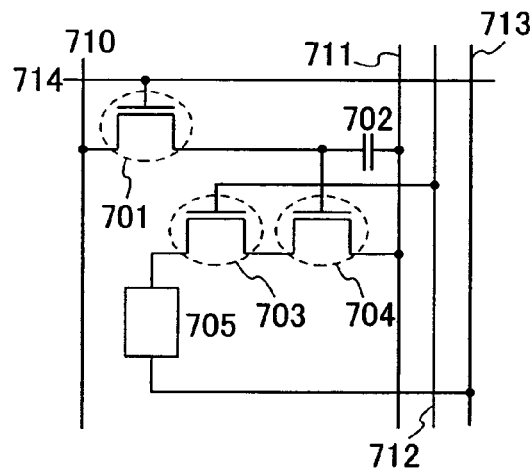
FIGS. 17A to 17F are circuit diagrams describing a structure of a pixel which can be applied to an EL display panel according to the present invention.

In a pixel shown in FIG. 17A, a signal line 710 and power source lines 711, 712, and 713 are arranged in a column direction, and a scanning line 714 is arranged in a row direction. The pixel also includes a switching TFT 701, a driving TFT 703, a current controlling TFT 704, a capacitor element 702 and a light emitting element 705.

Figure 17B:
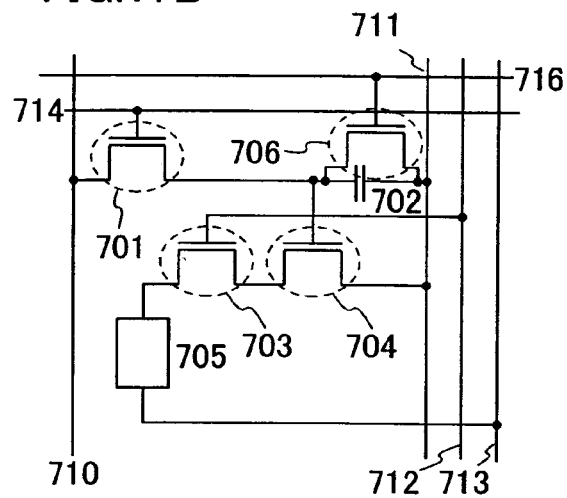
Figure 17C:
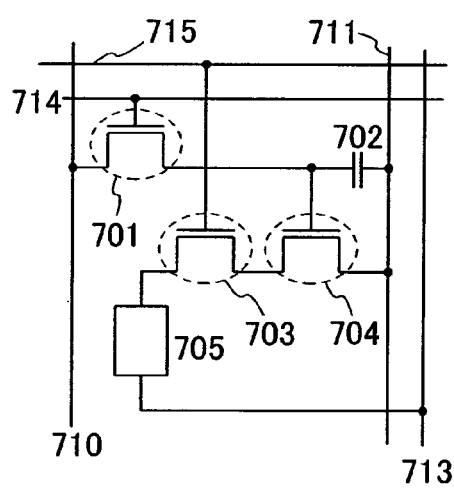
Figure 17D:
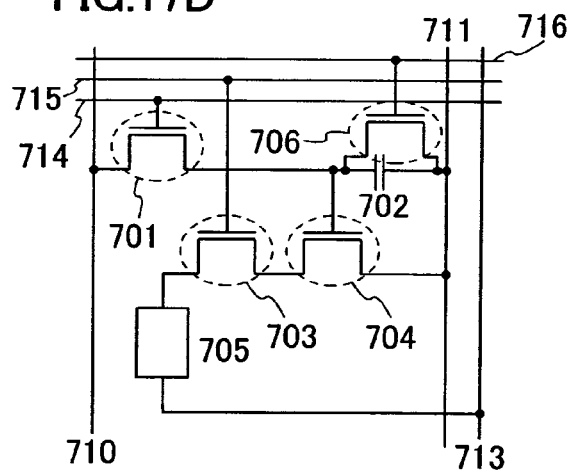

A pixel shown in FIG. 17C has the same structure as the one shown in FIG. 17A, except that a gate electrode of the TFT 703 is connected to a power source line 715 that is arranged in a row direction. That is, the pixels shown in FIGS. 17A and 17C show the same equivalent circuit diagrams. However, each power source line is formed of different conductive layers between the cases where the power source line 712 is arranged in a column direction (FIG. 17A) and where the power source line 715 is arranged in a row direction (FIG. 17C). In order to emphasize the different arrangements of the power source lines to which the gate electrodes of the driving TFTs 703 are connected, the equivalent circuit diagrams are individually illustrated in FIGS. 17A and 17C.

Features of the pixel shown in FIGS. 17A and 17C are that TFT 703 and TFT 704 are connected in series in each pixel, and the channel length $L_3$ and the channel width $W_3$ of the TFT 703 and the channel length $L_4$ and the channel width $W_4$ of the TFT 704 are set to satisfy the relation as follows: $L_3/W_3:L_4/W_4=5$ to 6000:1. For example, when $L_3$, $W_3$, $L_4$, and $W_4$ are set to be 500 μm, 3 μm, 3 μm and 100 μm, respectively, they satisfy 6000:1. By using the present invention, a fine process can be performed, thus, such a wiring having a narrow channel width can be formed stably without defects such as a short circuit. Therefore, a TFT having electronic characteristics that are required for sufficiently operating the pixels as shown in FIGS. 17A and 17C, can be formed, thereby manufacturing a display device with an excellent display function along with high reliability.

The TFT 703 is operated in a saturation region and controls the amount of current flowing to the light emitting element 705, whereas the TFT 704 is operated in a linear region and controls a current supplied to the light emitting element 705. Both TFTs 703 and 704 preferably have the same conductivity type in view of the manufacturing process. For the driving TFT 703, a depletion type TFT may be used instead of an enhancement type TFT. According to the present invention having the above described structure, slight variations in $V_{GS}$ of the TFT 704 does not adversely affect the amount of current flowing to the light emitting element 705, since the TFT 704 is operated in a linear region. That is, the amount of current flowing to the light emitting element 705 is determined by the TFT 703 operated in the saturation region. By the present invention having the above described structure, it is possible to provide a display device in which image quality is improved by improving variations in luminance of the light emitting element due to variation in the TFT characteristics.

The TFT 701 of each pixel shown in FIGS. 17A to 17D controls a video signal input to the pixel. When the TFT 701 is turned on and a video signal is inputted in the pixel, the video signal is held in the capacitor element 702. Although the structures in which each pixel includes the capacitor element 702 are shown in FIGS. 17A and 17C, the present invention is not limited to these structures. When a gate capacitance or the like can serve as a capacitor for holding a video signal, the capacitor element 702 is not necessarily provided.

The light emitting element 705 has a structure in which an electroluminescent layer is sandwiched between a pair of electrodes. A potential difference is maintained between a pixel electrode and a counter electrode (i.e., between an anode and a cathode) so that a forward bias voltage is applied. The electroluminescent layer is formed of various kinds of materials such as an organic material and an inorganic material. Luminescence in the electroluminescent layer includes luminescence that is generated when a singlet excited state returns to a ground state (fluorescence) and luminescence that is generated when a triplet excited state returns to a ground state (phosphorescence).

A pixel shown in FIG. 17B has the same structure as that shown in FIG. 17A, except that a TFT 706 and a scanning line 716 are added. Similarly, a pixel shown in FIG. 17D has the same structure as that shown in FIG. 17C, except that a TFT 706 and a scanning line 716 are added.

The TFT 706 is controlled to be turned on or off by the scanning line 716 which is added. When the TFT 706 is turned on, charges held in the capacitor element 702 are discharged, thereby turning the TFT 706 off. In other words, the supply of current flowing to the light emitting element 705 can be forcibly stopped by providing the TFT 706. Therefore, a lighting period can start at the same time with or immediately after a writing period starts before signals are written into all the pixels, in the structures shown in FIGS. 17B and 17D, thus, the duty ratio can be improved.

Figure 17E:
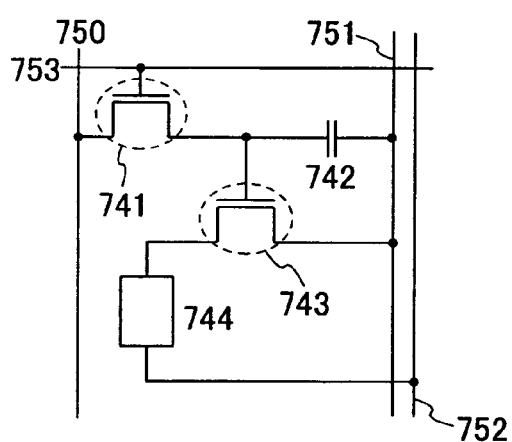
Figure 17F:
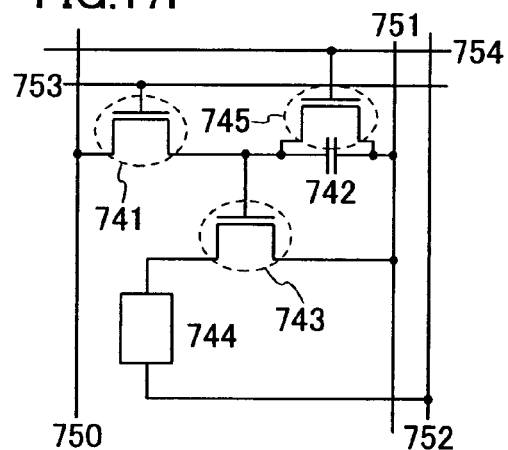

In a pixel shown in FIG. 17E, a signal line 750 and power source lines 751 and 752 are arranged in a column direction, and a scanning line 753 is arranged in a row direction. The pixel also includes a TFT 741 for switching, a TFT 743 for driving, a capacitor element 742 and a light emitting element 744. A pixel shown in FIG. 17F has the same structure as that shown in FIG. 17E, except that a TFT 745 and a scanning line 754 are added. Further, in the structure shown in FIG. 17F, a duty ratio can be improved by providing the TFT 745.

As described above, a wiring or the like can be formed stably and precisely without a defect in formation by using the present invention, which results in a TFT having excellent electronic characteristics and high reliability. The present invention can be applicable to an applied technology for improving a displaying function of a pixel in accordance with an intended purpose.

This embodiment mode can be used combing with each of Embodiment Mode 1, 2, 4 to 6.

Embodiment Mode 8

Figure 10:
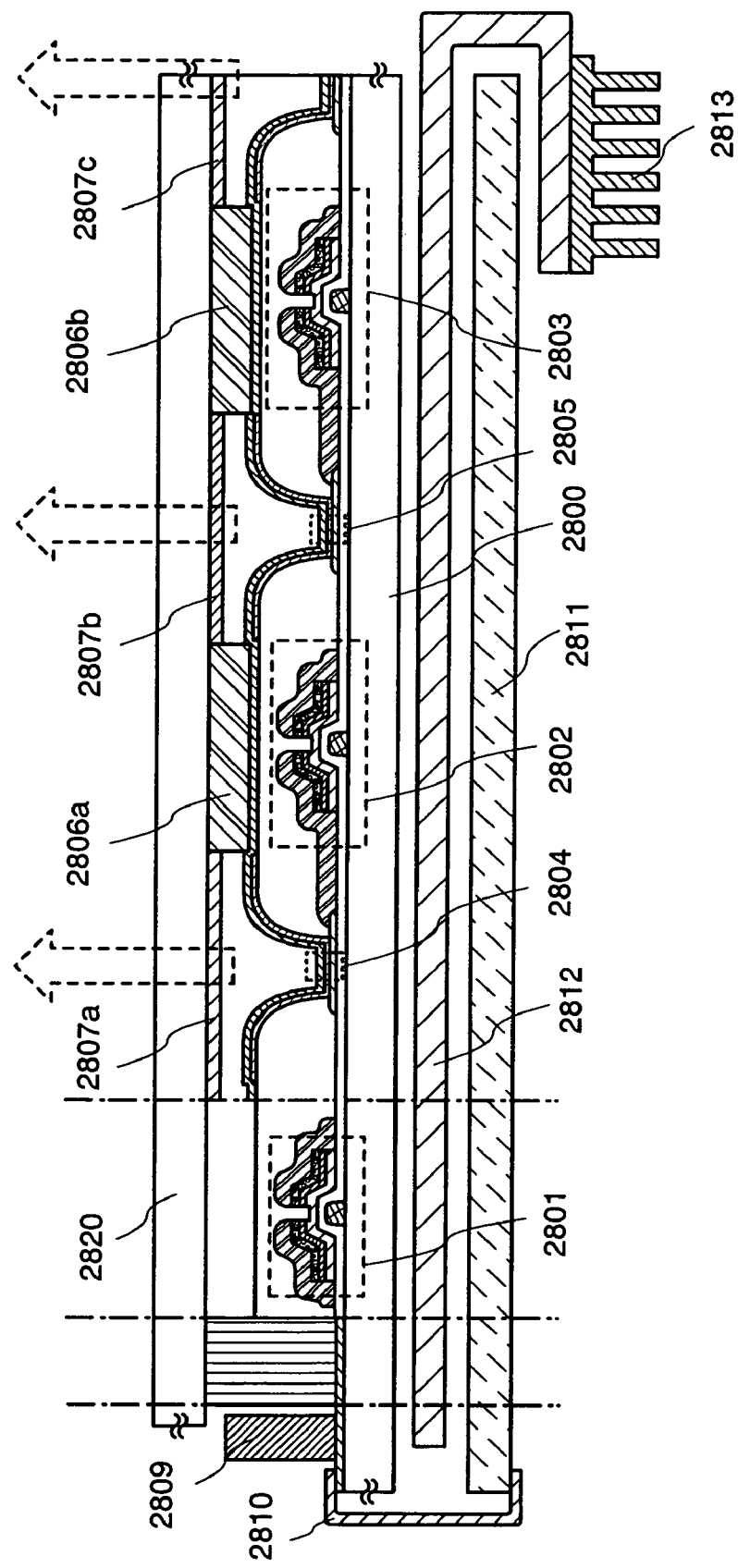
FIG. 10 is a cross-sectional view describing a structure example of an EL display module according to the present invention.

This embodiment mode will be described with reference to FIG. 10. FIG. 10 shows an example in which an EL display module is constructed by using a TFT substrate 2800 manufactured by applying the present invention. In FIG. 10, a pixel portion having pixels is formed over the TFT substrate 2800.

In FIG. 10, a protective circuit portion 2801 is provided at outer side of the pixel portion and between a driver circuit and the pixels, which is operated similarly to a TFT formed in the pixels or a diode which is obtained by connecting a gate of the TFT to one of a source or a drain of the TFT. A driver circuit 2809 may be a driver IC formed using a single crystalline semiconductor, a stick driver IC formed over a glass substrate using a polycrystalline semiconductor film, or a driver circuit formed using an SAS.

The TFT substrate 2800 is bonded to a sealing substrate 2820 having spacers 2806a and 2806b formed by a droplet discharge method therebetween. The spacers are preferably provided in order to maintain the constant gap between the two substrates even when the substrates are thin or the area of the pixel portion is enlarged. The space above light-emitting elements 2804 and 2805 connected to TFTs 2802 and 2803 respectively, which is between the TFT substrate 2800 and the sealing substrate 2820, may be filled with a resin material having light transmissivity with respect to at least to light in a visible region to be solidified or be filled with dehydrated nitrogen or an inert gas.

FIG. 10 shows the case where each of the light-emitting elements 2804 and 2805 have a top-emission structure, in which light can be emitted in the direction of arrows. When each pixel is formed to emit a different emission color from each other, such as red, green, and blue emission, multi-color display can be performed. In addition, when coloring layers 2807a, 2807b, and 2807c corresponding to the respective colors are formed on the side of the sealing substrate 2820, color purity of the light emitted outside can be increased. Alternatively, the pixels can be formed to have white light-emitting elements and combined with the coloring layers 2807a, 2807b, and 2807c.

The driver circuit 2809 that is an external circuit, is connected to a connection terminal of a scanning line or a signal line provided at one end of an external circuit substrate 2811 via a wiring substrate 2810. In addition, the driver circuit 2809 may be provided in contact with or close to the TFT substrate 2800, and a heat pipe 2813 and a heat sink 2812 may be provided to increase the heat dissipation effect.

FIG. 10 shows a top-emission EL module; however, a bottom-emission structure or a dual-emission structure in which light is emitted from both top and bottom sides, may be constructed by changing the structure of the light emitting element or the position of the external circuit substrate. In the case of the top-emission structure, a black matrix may be formed by coloring an insulating layer to serve as a partition wall. The partition wall can be formed by a droplet discharge method. The partition wall may be formed by using a resin material such as polyimide mixed with a colorant-based black resin, carbon black or the like, or stacked layers thereof.

In addition, an EL display module can be manufactured to prevent light which enters from outside from being reflected by using a retardation plate or a polarizing plate. As for a top-emission type display device, a partition wall may be colored to be used as a black matrix. This partition wall can be formed by a droplet discharge method using a colorant-based black resin or a resin material such as polyimide mixed with carbon black or the like, or stacked layers thereof. By the droplet discharge method, different materials may be discharged to the same region multiple times to form a partition wall. As a retardation plate and a retardation plate, a $\lambda/4$ plate and a $\lambda/2$ plate may be used to control light. The EL display module has a structure in which the light-emitting element, the sealing substrate (sealing material), the retardation plates ($\lambda/4$ plate and $\lambda/2$ plate), and a polarizing plate are provided in this order over a substrate for a TFT element. Light emitted from the light emitting element travels through these layers to be emitted outside from the polarizing plate. The retardation plates and the polarizing plate may be disposed on the side from which light is emitted, and in the case of a dual-emission type display device which emits light to both sides, they may be disposed on both sides. In addition, an antireflection film may be provided at outer side of the polarizing plate. Accordingly, higher-resolution and more precise images can be displayed.

A sealing structure may be formed by attaching a resin film using a sealing material or an adhesive resin to the TFT substrate 2800 of the side where the pixel portion is formed. Although glass-sealing with a glass substrate is shown in this embodiment mode, various sealing methods can be used, such as resin-sealing with a resin, plastic-sealing with plastic, and film-sealing with a film. A gas-barrier film for preventing penetration of moisture vapor is preferably provided over the surface of the resin film. By adopting the film-sealing structure, further thinning and weight saving can be achieved.

This embodiment mode can be used combining with Embodiment Mode 1, 2, 4 to 7.

EMBODIMENT MODE 9

Figure 14:
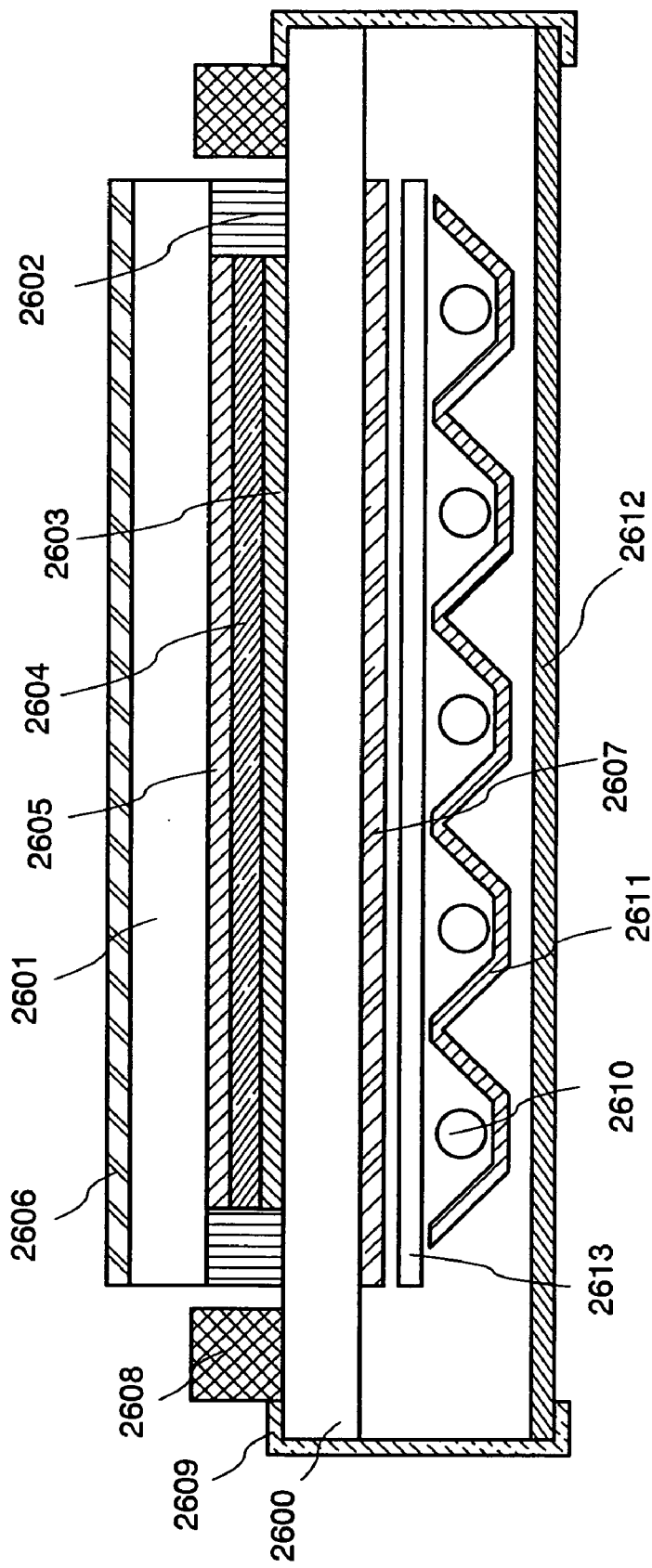
FIG. 14 is a cross-sectional view describing a structure example of a liquid crystal display module according to the present invention.
Figure 15:
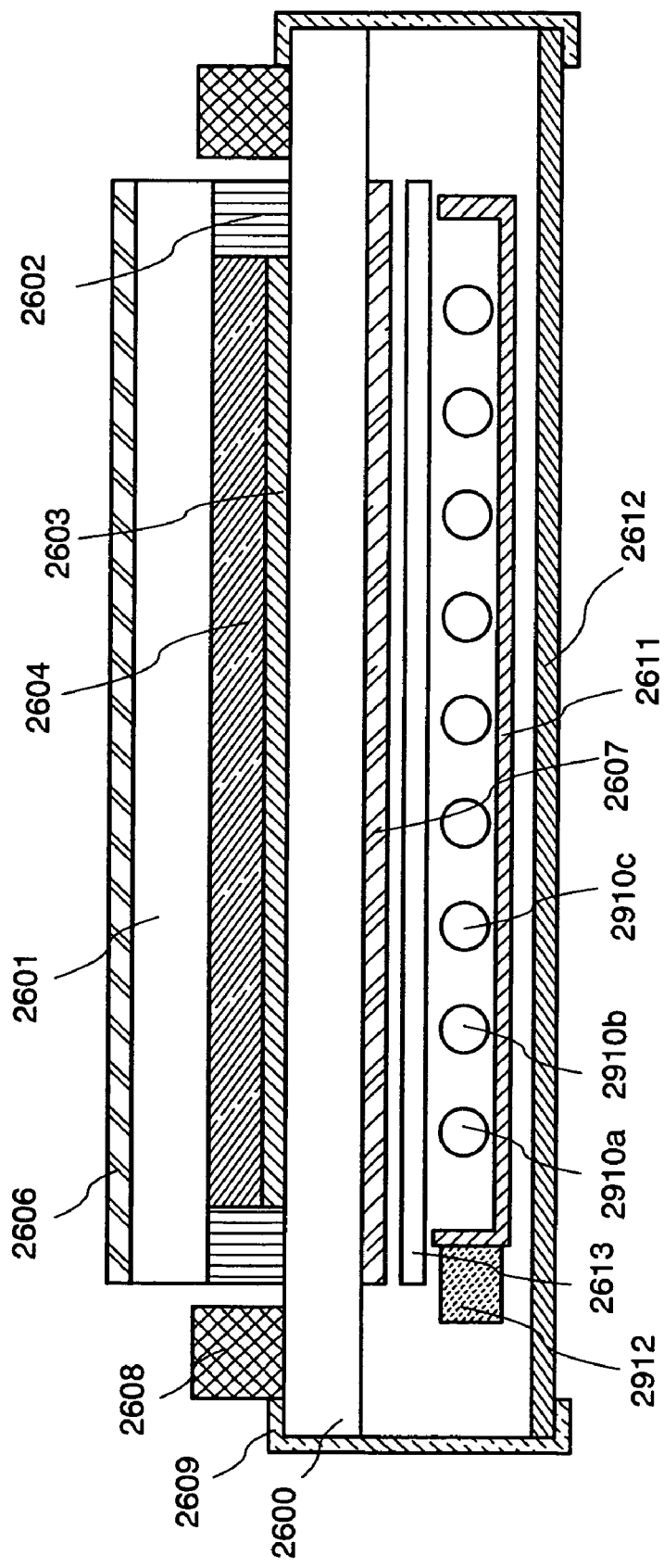
FIG. 15 is a cross-sectional view describing a structure example of a liquid crystal display module according to the present invention.

This embodiment mode will be described with reference to FIG. 14 and FIG. 15. FIG. 14 and FIG. 15 show an example in which a liquid crystal display module is constructed by using a TFT substrate 2600 manufactured by applying the present invention.

FIG. 14 shows an example of a liquid crystal display module. A TFT substrate 2600 and a counter substrate 2601 are bonded together by a sealing material 2602, and a display portion 2603 and a liquid crystal layer 2604 are provided therebetween to form a pixel portion. A coloring layer 2605 is necessary for performing color display, and in a case of an RGB method, a coloring layer corresponding to each color, such as red, green and blue is provided in each pixel. Polarizing plates 2606 and 2607, and a lensfilm 2613 are provided outside of the TFT substrate 2600 and the counter substrate 2601. A light source is constituted by a cold-cathode tube 2610 and a reflecting plate 2611. A circuit substrate 2612 is connected to the TFT substrate 2600 and a driving circuit 2608 by a flexible wiring substrate 2609, and a control circuit, a power supply circuit and the like are incorporated in the circuit substrate 2612. For the liquid crystal display module, a TN (Twisted Nematic) mode, an IPS (In-Plane-Switching) mode, an MVA (Multi-domain Vertical Alignment) mode, an ASM (Axially Symmetric aligned Micro-cell) mode, an OCB mode or the like can be used.

In addition, the display device manufactured by the present invention can have higher performance, by using an OCB mode, which high speed response is possible. FIG. 15 is an example in which the OCB mode is adapted to the liquid crystal display module of FIG. 14, and is an FS-LCD (Field Sequential-LCD). In the FS-LCD, red emission, green emission, and blue emission are carried out in one frame period, and color display can be performed by combining images using time division. Because each emission can be carried out by a light-emitting diode, a cold-cathode tube and the like, color filter is not required. Accordingly, since there is no need to arrange RGB color filter, 9 times as many pixels can be displayed in the same area. On the other hand, since RGB emission is carried out in one frame period, rapid response of liquid crystals becomes necessary. When the FS mode and the OCB mode are adapted to the display device of the present invention, a display device or a liquid crystal television device having even higher performance and higher image quality can be completed.

A liquid crystal layer of the OCB mode has, a so-called $\pi$ cell structure. A $\pi$ cell structure is a structure where the pretilt angles of the liquid crystal modules are aligned symmetrically, against the center plane between the active matrix substrate and the counter substrate. The orientation of the $\pi$ cell structure is a splay orientation when a voltage is not applied to the substrates, and shifts into a bend orientation when a voltage is applied. Further application of voltage brings the liquid crystal molecules in the bend orientation in to an orientation perpendicular to both substrates, which allows light to transmit therebetween. In addition, high speed response that is ten times faster than a conventional TN mode can be achieved by using the OCB mode.

In addition, an HV-FLC and an SS-FLC using ferroelectric liquid crystal (FLC) which can perform high speed operation, can be used as a mode corresponding to the FS mode. Nematic liquid crystal having relatively low viscosity is used for the OCB mode, and smectic liquid crystal is used for the HV-FLC and the SS-FLC, but as a liquid crystal material, an FLC, the nematic liquid crystal, the smectic liquid crystal or the like can be used.

In addition, the speed of high speed optical response of the liquid crystal display module accelerates by making a cell gap of the liquid crystal display device narrower. Further, it can be accelerated by decreasing the viscosity of the liquid crystal material. The above described acceleration is more effective in a case of a pixel in a pixel portion of a TN mode liquid crystal display module, or in a case where the dod pitch is 30 µm or less.

A liquid crystal display module shown in FIG. 15 shows a light transmissive liquid crystal display module in which a red light source 2910a, a green light source 2910b, a blue light source 2910c are provided as a light source. A control portion 2912 is provided to turn on or off the red light source 2910a, the green light source 2910b and blue light source 2910c. By the control portion 2912, luminescence of each color is controlled, light enters the liquid crystal, an image is created by time division, thereby performing color display.

By using the present invention as described above, a liquid crystal display module with higher-resolution and high reliability can be manufactured.

This embodiment mode can be used combining with each Embodiment Mode 1, 3, 5 and 6.

EMBODIMENT MODE 10

Figure 21:
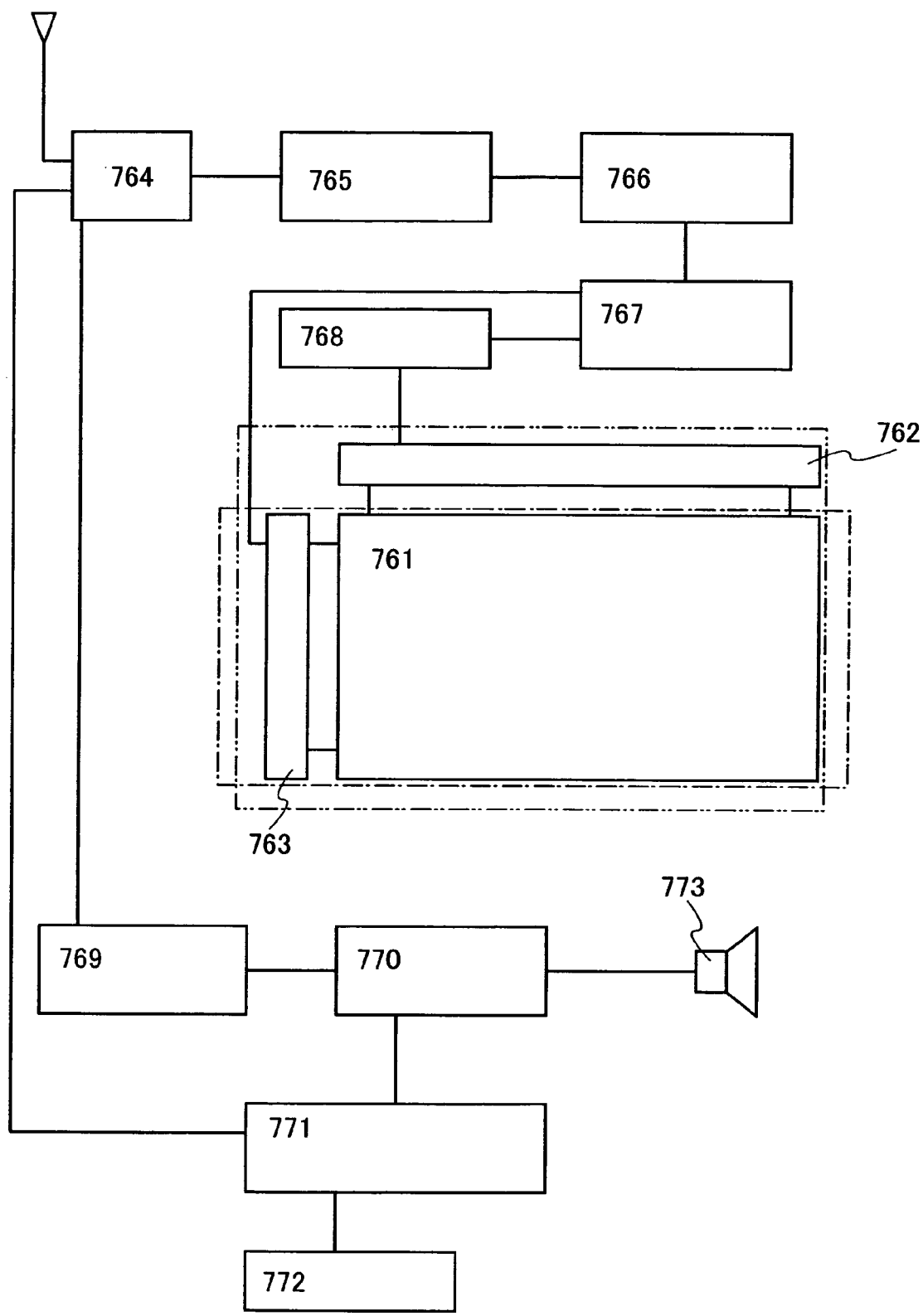
FIG. 21 is a block diagram showing a main structure of an electric device to which the present invention is applied.

A television device can be completed by a display device manufactured by the present invention. FIG. 21 is a block diagram showing a main structure of a television device. There are many types of display panels, such as a type in which only a pixel portion 761 is formed and a scanning line driver circuit 763 and a signal line driver circuit 762 are mounted by a TAB method as shown in FIG. 22B as a structure shown in FIG. 25A; a type in which a TFT is formed, a pixel portion 761 and a scanning line driver circuit 763 are integrated over a substrate, and a signal line derive circuit 762 is separately mounted as a driver IC as shown in FIG. 25B; and a type in which a pixel portion 761, a signal line driver circuit 762 and a scanning line driver circuit 763 are integrated over a substrate as shown in FIG. 25C. Any type of display panels may be used.

In addition, for an input side of the video signal, other structures of an external circuit may include a video signal amplifier circuit 765 which amplifies a video signal among signals received by a tuner 764; a video signal processing circuit 766 which converts signals outputted from the video signal amplifier circuit into chrominance signals corresponding to each color of red, green and blue; a control circuit 767 which converts the video signal into an input specification of a driver IC, and the like. The control circuit 767 outputs signals to both a scanning line side and a signal line side. In a case of digital driving, a structure may be that of providing a signal dividing circuit 768 in the signal line side, and supplying an input digital signal divided into m parts.

An audio signal, among other signals received by the tuner 764, is sent to an audio signal amplifier circuit 769 which is supplied to a speaker 773 through an audio signal processing circuit 770. A control circuit 771 receives control information about a receiving station (reception frequency) or sound volume from an input portion 772 and transmits signals to the tuner 764 and the audio signal processing circuit 770.

Figure 20A:
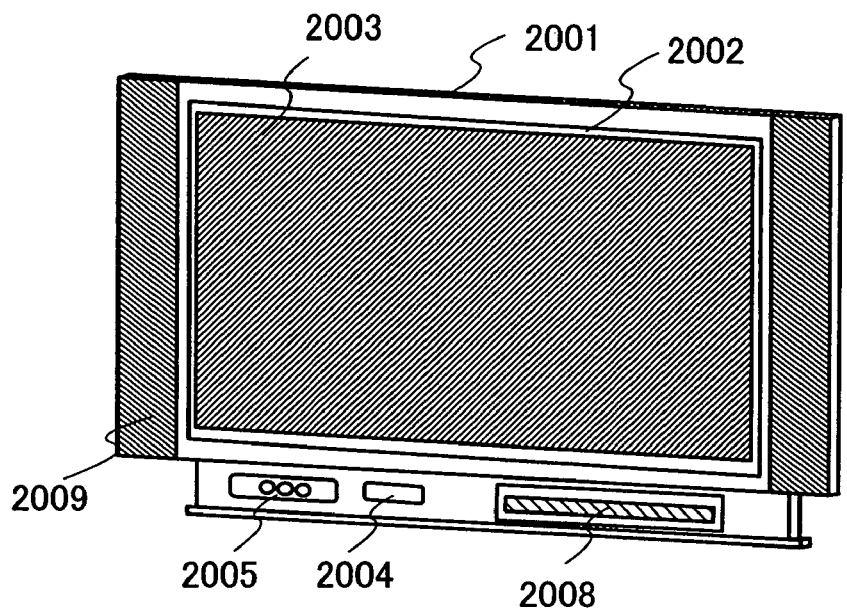
FIGS. 20A and 20B are figures showing electronic devices to which the present invention is applied.
Figure 20A:
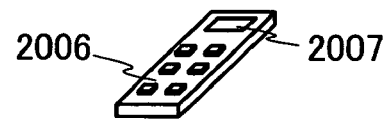
Figure 20B:
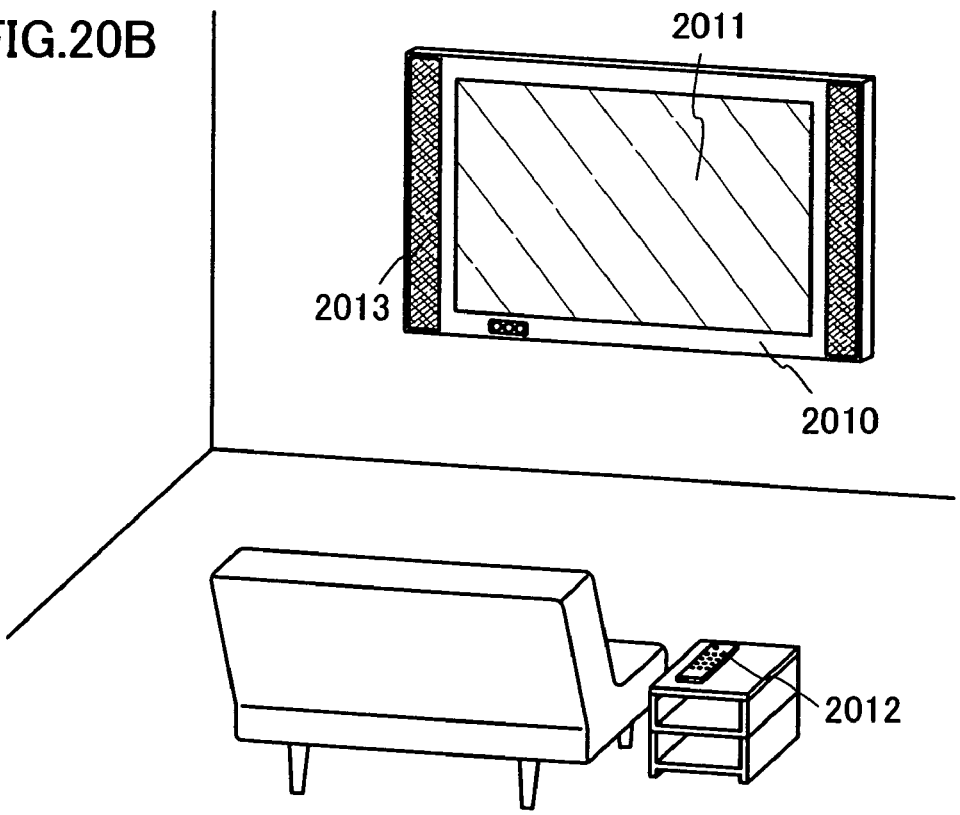

A television device can be completed by incorporating a liquid crystal display module and an EL display module into a housing as shown in FIGS. 20A and 20B. When an EL display module as shown in FIG. 10 is used, an EL television device can be completed. When using a liquid crystal display module as shown in FIG. 14 and FIG. 15, a liquid crystal television device can be completed. A main display screen 2003 is formed by using the display module, and speaker portions 2009, an operation switch, etc., are provided as its accessory equipment. In this manner, a television device can be completed by the present invention.

A display panel 2002 is incorporated into a housing 2001 and through a receiver 2005, general TV broadcast can be received, and one-way (from a sender to a receiver) or two-way (between a sender and a receiver or between receivers) information communication can be carried out by connecting to a communication network by a wired or wireless connection through a modem 2004. The television device can be operated by using a switch built into the housing or a remote control unit 2006. A display portion 2007 for displaying output information may also be provided on the remote control unit.

Further, the television device may include a sub screen 2008 formed using a second display panel to display channels, volume, etc., in addition to the main screen 2003. In this structure, the main screen 2003 may be formed by using an EL display panel having a wide viewing angle and the sub screen may be formed by using a liquid crystal display panel capable of displaying images with low power consumption. In addition, in order to place priority on reducing power consumption, the main screen 2003 may be formed by using a liquid crystal display panel and the sub screen may be formed by using an EL display panel, to have a blinking feature. By the present invention, a display device having high reliability can be manufactured even when a large size substrate is used and a large number of TFTs or electronic parts are used.

FIG. 20B shows a television device having a large display portion with a size of, for example, 20 to 80 inches. The television device includes a housing 2010, a display portion 2011, a remote control unit 2012 that is an operation unit, speakers 2013 and the like. The present invention is applied to the manufacturing of the display portion 2011. The television device shown in FIG. 20B can be hung on the wall, and does not require a large space for placing the television device.

It is needless to say that the present invention is not limited to a television device and can be applied to various uses, for example, a large-size display medium such as an information display board in a train station or an airport, etc., or an advertisement display board on the street, as well as a monitor of a personal computer.

EMBODIMENT MODE 11

Various display devices can be manufactured by applying the present invention. In other words, the present invention can be applied to various electronic appliances that incorporate such display devices as the display portion.

Such electronic appliances include video cameras, digital cameras, projectors, heat mounted displays (goggle type displays), car navigation systems, car stereos, personal computers, game machines, portable information terminals (such as mobile computers, portable phones, or electronic books), image reproducing devices provided with a recording medium (specifically, device for reproducing information recorded on a recording medium such as a Digital Versatile Disc (DVD) and having a display that can display the reproduced image), and the like. Examples of such electronic appliances are shown in FIGS. 19A to 19D.

Figure 19A:
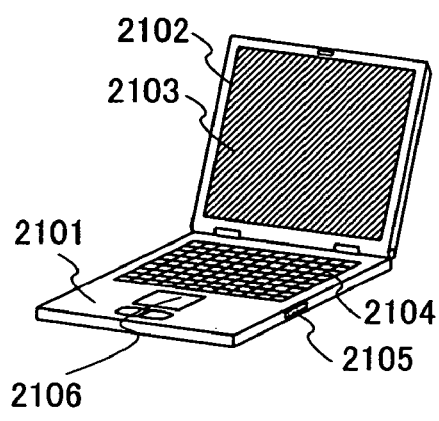
FIGS. 19A to 19D are figures showing electronic devices to which the present invention is applied.

FIG. 19A is a personal computer which includes a main body 2101, a housing 2102, a display portion 2103, a keyboard 2104, an external connection port 2105, a pointing mouse 2106, etc. The present invention is applied to manufacture the display portion 2103. By using the present invention, highly reliable and high-quality images can be displayed even when the personal computer is downsized, and wirings and the like become finer and more complex.

Figure 19B:
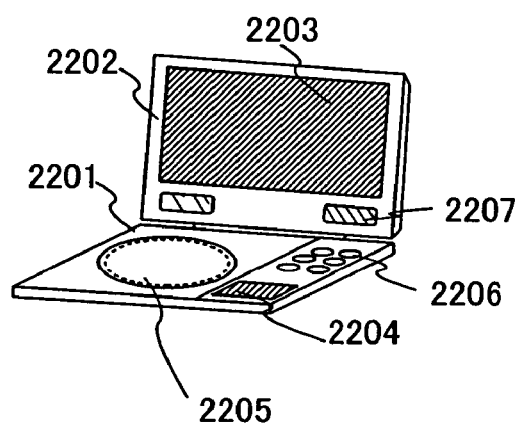

FIG. 19B shows an image reproducing device equipped with a recording medium (specifically, DVD reproducing device), which includes a main body 2201, a housing 2202, a display portion A 2203, a display portion B 2204, a recording medium (DVD, etc.) reading portion 2205, an operating key 2206, a speaker portion 2207, etc. The display portion A 2203 mainly displays image data while the display portion B 2204 mainly displays text data. The present invention is applied to the manufacturing of the display portions A 2203 and B 2204. By applying the present invention to the manufacturing of the display portions A 2203 and B 2204, highly reliable and high-quality images can be displayed even when the image reproducing device is downsized, and wirings and the like become finer and more complex.

Figure 19C:
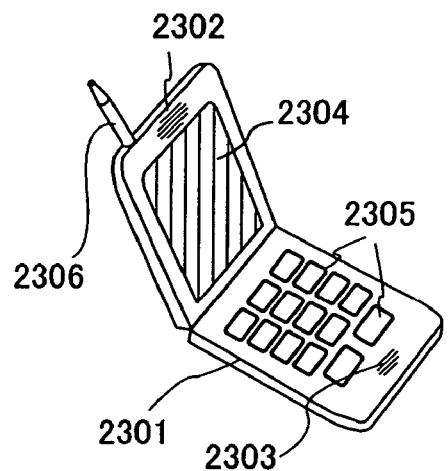

FIG. 19C is a portable phone which includes a main body 2301, an audio output portion 2302, an audio input portion 2303, a display portion 2304, operating switches 2305, an antenna 2306, etc. By applying the display device manufactured by the present invention to the display portion 2304, highly reliable and high-quality images can be displayed even when the portable phone is downsized, and wirings and the like become finer and more complex.

Figure 19D:
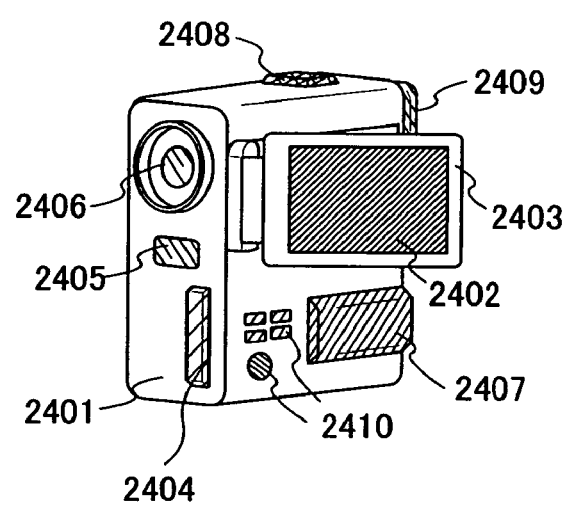

FIG. 19D is a video camera which includes a main body 2401, a display portion 2402, a housing 2403, an external connection port 2404, a remote control receiving portion 2405, an image receiving portion 2406, a battery 2407, an audio input portion 2408, operating keys 2409, etc. The present invention can be applied to the display portion 2402. By applying the display device manufactured by the present invention to the display portion 2402, highly reliable and high-quality images can be displayed even when a video camera is downsized, and wirings and the like become finer and more complex. This embodiment mode can be freely combined with the embodiment modes described above.

EMBODIMENT MODE 12

By the present invention, a semiconductor device functioning as a chip (also referred to as a wireless chip, a wireless processor, a wireless memory or a wireless tag) having a processor circuit can be formed. The semiconductor device of the present invention is used for various purposes. The semiconductor device can be used for, for example, bills, coins, portfolios, certificates, bearer bonds, packing containers, documents, recording mediums, personal belongings, vehicles, foods, clothing, health goods, livingware, chemicals, electronic appliances, etc.

Figure 28A:
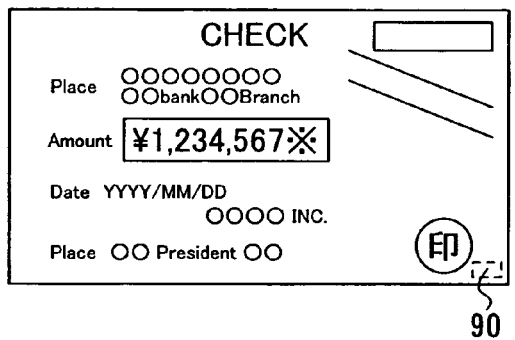
FIGS. 28A to 28G are figures showing semiconductor devices to which the present invention is applied.
Figure 28B:
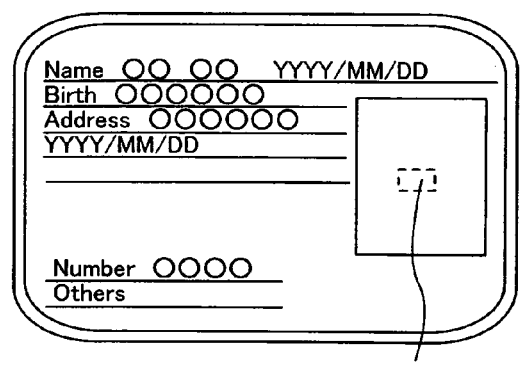
Figure 28C:
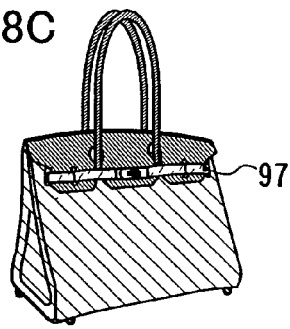
Figure 28D:
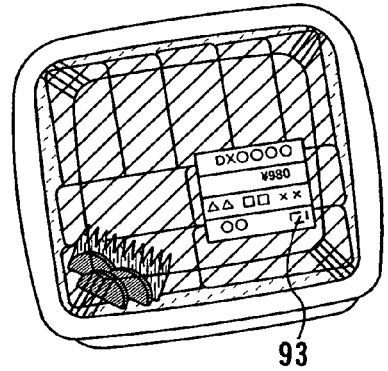
Figure 28E:
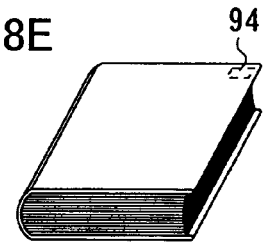
Figure 28F:
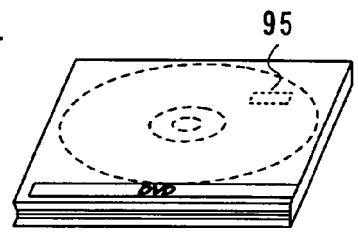
Figure 28G:
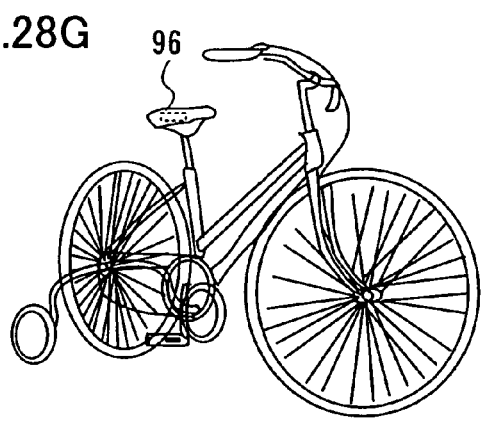

Bills and coins refer to money circulating in the market, and include currency that pass as currency in a certain area, such as cash vouchers and memorial coins. Portfolios refer to checks, certificates, promissory notes, and the like, which can be provided with a chip 90 having a processor circuit (FIG. 28A). Certificates refer to a driver's license, a certificate of residence, and the like, which can be provided with a chip 91 having a processor circuit (FIG. 28B). Vehicles refer to ships, wheeled vehicles such as bicycles, and the like, which can be provided with a chip 96 having a processor circuit (FIG. 28G). Bearer bonds refer to stamps, rice coupons, various merchandise coupons, and the like. Packing containers refer to wrapping paper for a lunch box, plastic bottles, and the like, which can be provided with a chip 93 having a processor circuit (FIG. 28D). Documents refer to books, and the like, which can be provided with a chip 94 having a processor circuit (FIG. 28E). Recording mediums refer to a DVD software, a video tape, and the like, which can be provided with a chip 95 having a processor circuit (FIG. 28F). Personal belongings refer to a bag, a pair of glasses, and the like, which can be provided with a chip 97 having a processor circuit (FIG. 28C). Foods refer to food goods, drinks, and the like. Clothing refers to clothes, footwear, and the like. Health goods refer to medical appliances, health appliances, and the like. Livingware refers to furniture, lighting equipment, and the like. Chemicals refer to medical products, pesticides, and the like. Electric appliances refer to liquid crystal display devices, EL display devices, television devices (TV sets or flat-screen televisions), cellular phones, and the like.

By providing a chip having a processor circuit to such things as bills, coins, portfolios, certificates, bears bonds, counterfeits can be prevented. Further, efficiency improvement for an inspection system or a system used in a rental shop can be attempted by providing a chip to packing containers, documents, recording mediums, personal belongings, vehicles, foods, livingware, electric appliances, etc. By providing a chip having a processor circuit to vehicles, health goods, chemicals, etc., counterfeits or theft can be prevented, and can prevent medicine from being taken by mistake. A chip having a processor circuit is provided to the foregoing items by sticking it to their surfaces or embedding it therein. For example, for a book, the chip may be embedded in a page or embedded in an organic resin when a packaging is made from organic resin.

Furthermore, by applying a chip having a processor circuit that is possible to be formed by the present invention, to a product management system or a distribution system, increased sophistication of a system can be attempted. For example, by providing a chip having a processor circuit on a tag, the information about the distribution process and delivery destination on the tag can be read by a reader/writer provided along a conveyor belt, and makes product inspection or baggage distribution easier.

Figure 29:
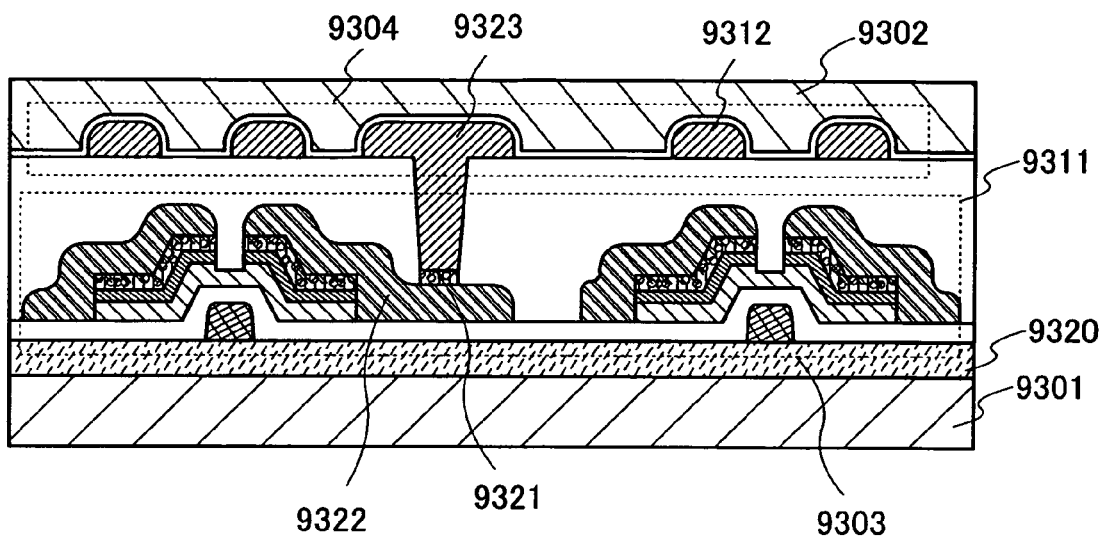
FIG. 29 is a diagram showing a semiconductor device to which the present invention is applied.

A structure of a chip having a processor circuit that is possible to be formed by the present invention is described with reference to FIG. 29. The chip having a processor circuit includes thin film integrated circuit 9303 and an antenna 9304 connected to the thin film integrated circuit 9303. The thin film integrated circuit and the antenna are sandwiched and held between a covering material 9301 and a covering material 9302. The thin film integrated circuit 9303 may be bonded to the covering materials by using an adhesive agent. In FIG. 29, one side of the thin film integrated circuit 9303 is bonded to the covering material 9301 with an adhesive agent 9320.

The thin film integrated circuit 9303 is formed in the same manner as a TFT shown in any of the embodiment modes described above, and is provided on the covering material by a known peeling process. The TFT in the thin film integrated circuit 9303 is connected to the antenna 9304, and in this embodiment mode, a source or drain electrode layer 9322 of the TFT in the thin film integrated circuit 9303, and a wiring layer 9323 in the antenna 9304, are formed by having a buffer layer including at least one pore 9321 of the present invention therebetween. Since the porous buffer layer 9321 is conductive, it can connect the source or drain electrode layer 9322 and the wiring layer 9323 electrically. Also because a portion of the wiring layer 9323 is formed to fill pores of the buffer layer including at least one pore 9321, the source or drain electrode layer 9322 and the wiring layer 9323 are formed with good adhesiveness. A semiconductor element used in the thin film integrated circuit 9303 is not limited to the foregoing semiconductor element. For example, in addition to a TFT, a memory element, a diode, a photoelectric conversion element, a resistance element, a coil, a capacitor element, an inductor, etc. can be used.

As shown in FIG. 29, an interlayer insulating film 9311 is formed on the TFT of the thin film integrated circuit 9303, and the antenna 9304 connected to the TFT through the interlayer insulating film 9311 is formed. In addition, a barrier film 9312 formed of a silicon nitride film, or the like, is formed over the interlayer insulating film 9311 and the antenna 9304.

The antenna 9304 is formed by a droplet discharge method where droplets containing a dielectric material such as gold, silver or copper is discharged, dried and baked. Forming the antenna by the droplet discharge method enables the number of steps and cost corresponding to the steps to be decreased. In addition, the antenna 9304 can be formed by a dispenser method or a printing method (screen printing, etc.).

For the covering materials 9301 and 9302, it is preferable to use a stacked film formed of such materials as a film (made of polypropylene, polyester, vinyl, polyvinyl fluoride, polyvinyl chloride, etc.), a paper of a fibrous material, a base material film (polyester, polyamide, an inorganic evaporation film, papers, etc.) and an adhesive synthetic resin film (an acrylic-based synthetic resin, an epoxy-based synthetic resin, etc.). A film is to go through a thermocompression bonding process with a subject. During the process, an adhesion layer provided in the uppermost surface of the film, or a layer provided in the outermost layer (which is not the adhesion layer) is melted by a heat treatment, and bonded with the subject by applying pressure.

Also by using a flammable pollution-free material such as paper, fiber, carbon graphite, etc., as a covering material, the used chip having a processor circuit can be burned out or cut out. In addition, the chip having a processor circuit using these materials is pollution-free, since it does not generate poisonous gas when the chip is burned.

In addition, even though, in FIG. 29, a chip having a processor circuit is provided through the adhesive agent 9320 to the covering material 9301, a chip having a processor circuit may be attached to goods instead of the covering material 9301.

EMBODIMENT

This embodiment shows a result of observing and evaluating a sample in which a conductive layer is formed over a buffer layer including at least one pore.

As a buffer layer including at least one pore, a layer with conductivity having pores was used. On a substrate, an ITO sol-gel solution (containing butyl as a solvent) containing silicon oxide nanoparticles was applied and burned at a temperature of 550° C. for one hour. After burning, a hydrofluoric acid treatment was performed on the ITO layer containing the silicon oxide nanoparticles, and the silicon oxide nanoparticle was dissolved to form an ITO layer with pores. A composition containing Ag as a conductive material was discharged to the ITO layer having the pores to form a conductive layer. By the above described process, a sample (sample 1) in which an ITO layer having pores as a buffer layer including at least one pore formed over a substrate, on which a conductive layer was stacked on the buffer layer including at least one pore, was formed.

Figure 26:
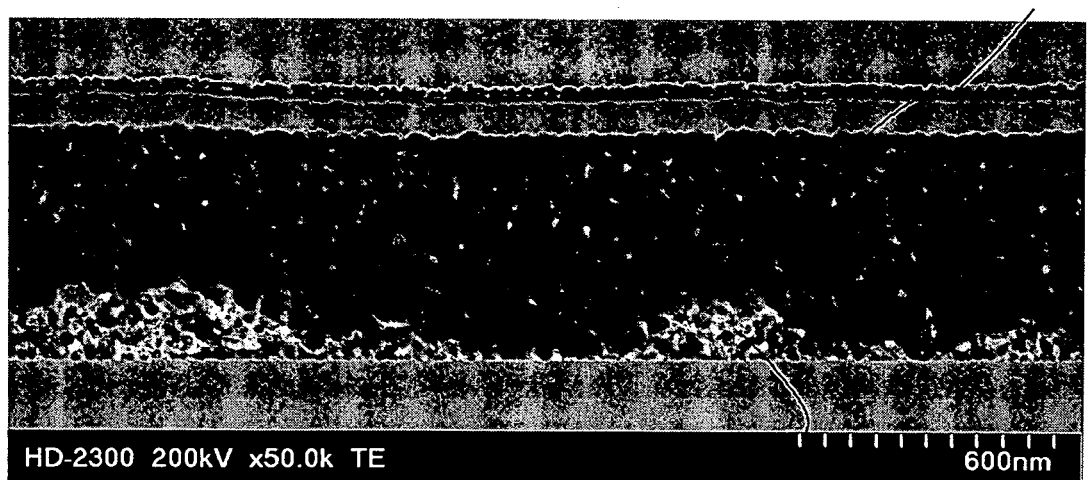
FIG. 26 is a STEM photograph of sample 1 manufactured in Embodiment 1.

A cross-section surface of sample was observed with STEM (Scanning Transmission Electron Microscopy). A STEM photograph is shown in FIG. 26. The white part with unevenness at the bottom is a buffer layer including at least one pore 83 (ITO layer), and the black part in the upper part is a conductive layer 82 (Ag layer). The ITO layer which is the buffer layer including at least one pore 83, has pores and the interface with the conductive layer 82 is very uneven. Ag, which is the conductive layer 82, goes into the pores and the unevenness of the interface, so as to fill them up. This is because the grain diameter of a silicon oxide nanoparticle, which is a material for forming pores (air hole) inside the ITO layer is bigger than that of an Ag nanoparticle, and causes the Ag nanoparticle to enter the pores formed by the silicon oxide nanopaticles. In this embodiment, the grain diameter of a silicon oxide nanoparticle was 50 nm or less, while the grain diameter of an Ag nanopartcle was 5 nm or less. Therefore, it was confirmed that the conductive layer is formed with good adhesiveness, according to the state of the interface between the buffer layer including at least one pore and the conductive layer in FIG. 26.

Subsequently, a peeling test with a tape was carried out on a sample of a stacked layer of a buffer layer including at least one pore and the conductive layer, like the one described above. As the sample, a silicon nitride film was formed over a glass substrate by a sputtering method. In the same manner as sample 1, an ITO layer was formed over the silicon nitride film as a buffer layer including at least one pore, and by discharging a composition containing Ag as a conductive material, a conductive layer was formed. After the conductive layer was processed into a linear form by a resist, a silicon nitride film was formed over it and sample 2 was manufactured. The silicon nitride film, formed so as to sandwich the buffer layer including at least one pore and the conductive layer, was formed to increase the peeling strength by tape and to confirm more noticeably the increase in adhesiveness by the present invention.

Figure 27:
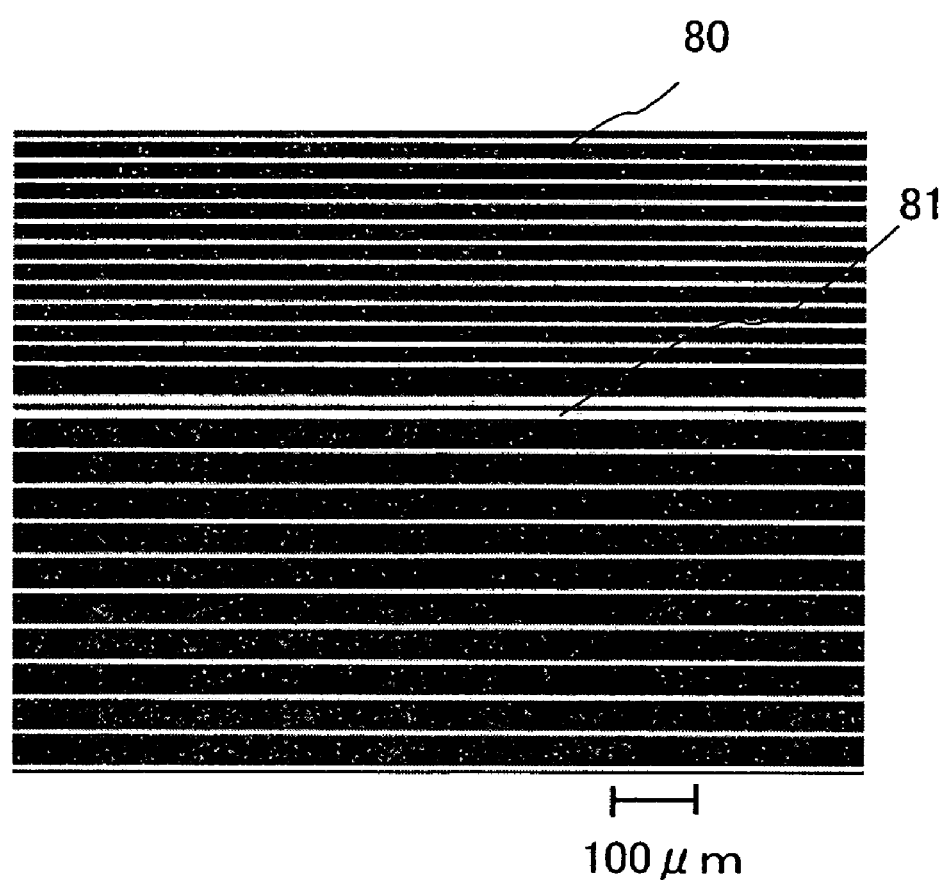
FIG. 27 is a light microscope photograph of sample 2 manufactured in Embodiment 1.

A peeling test with a kapton tape was carried out for sample 2. A light microscope photograph of the sample after the peeling test is shown in FIG. 27. The black line shows a region of a buffer layer including at least one pore 80 (ITO layer), which is without a conductive layer. The white line shows a conductive layer 81 (Ag layer). The conductive layer 81 which was processed to have line width of approximately 30 µm, was not peeled off even with the tape, and the increase in adhesiveness by the buffer layer including at least one pore was confirmed.

According to the above described results, when a conductive layer is formed over a buffer layer including at least one pore, which is also a conductive layer, formed by the present invention, the conductive layer can be formed with increased adhesiveness and good stability. In addition, since the buffer layer including at least one pore has conductivity, it can be electrically conducted to other conductive layers, such as an electrode layer, a wiring layer, and a semiconductor layer. Therefore, electrical defects such as a short circuit does not occur, and a display device with high reliability can be manufactured.

What is claimed is:

1. A semiconductor device comprising:
a first conductive layer;
a second conductive layer; and
a conductive buffer layer including at least one pore provided between the first conductive layer and the second conductive layer,
wherein a portion of the second conductive layer fills a pore of the conductive buffer layer including at least one pore, and
wherein the conductive buffer layer is electrically connected to the first conductive layer and the second conductive layer.

2. A semiconductor device according to claim 1, wherein the conductive buffer layer including at least one pore is formed of a conductive oxide.

3. A semiconductor device comprising:
a semiconductor layer including source and drain regions;
source and drain electrode layers; and
a conductive buffer layer including at least one pore provided between the semiconductor layer and the source and drain electrode layers,
wherein a portion of the source and drain electrode layers fills a pore of the conductive buffer layer including at least one pore, and
wherein the conductive buffer layer is electrically connected to the semiconductor layer and the source and drain electrode layers.

4. A semiconductor device according to claim 3, further comprising a gate electrode layer and a gate insulating layer over the gate electrode layer.

5. A semiconductor device according to claim 3, wherein the conductive buffer layer including at least one pore is formed of a conductive oxide.

6. A display device comprising:
a semiconductor layer including source and drain regions;
source and drain electrode layers;

a conductive buffer layer including at least one pore provided between the semiconductor layer and the source and drain electrode layers; and a pixel electrode layer electrically connected to the source or drain electrode layer, wherein a portion of the source and drain electrode layers fills a pore of the conductive buffer layer including at least one pore, and wherein the conductive buffer layer is electrically connected to the semiconductor layer and the source and drain electrode layers.

7. A display device according to claim 6, further comprising a gate electrode layer and a gate insulating layer over the gate electrode layer.

8. A display device according to claim 6, wherein the conductive buffer layer including at least one pore is formed of a conductive oxide.

9. A display device comprising:

a semiconductor layer including source and drain regions;

source and drain electrode layers;

a conductive buffer layer including at least one pore provided between the semiconductor layer and the source and drain electrode layers;

a first electrode layer electrically connected to the source or drain electrode layer;

an electroluminescent layer over the first electrode layer; and a second electrode layer over the electroluminescent layer, wherein a portion of the source and drain electrode layers fills a pore of the conductive buffer layer including at least one pore, and wherein the conductive buffer layer is electrically connected to the semiconductor layer and the source and drain electrode layers.

10. A display device according to claim 9, further comprising a gate electrode layer and a gate insulating layer over the gate electrode layer.

11. A display device according to claim 9, wherein the conductive buffer layer including at least one pore is formed of a conductive oxide.

12. A television device including a display screen formed using a display device, the display device comprising:

a semiconductor layer including source and drain electrode regions;

source and drain electrode layers;

a conductive buffer layer including at least one pore provided between the semiconductor layer and the source and drain electrode layers; and a pixel electrode layer electrically connected to the source or drain electrode layer, wherein a portion of the source and drain electrode layers fills a pore of the conductive buffer layer including at least one pore, and wherein the conductive buffer layer is electrically connected to the semiconductor layer and the source and drain electrode layers.

13. A television device according to claim 12, further comprising a gate electrode layer and a gate insulating layer over the gate electrode layer.

14. A television device according to claim 12, wherein the conductive buffer layer including at least one pore is formed of a conductive oxide.

15. A television device including a display screen formed using a display device, the display device comprising:

a semiconductor layer including source and drain regions;

source and drain electrode layers;

a conductive buffer layer including at least one pore provided between the semiconductor layer and the source and drain electrode layers;

a first electrode layer electrically connected to the source or drain electrode layer;

an electroluminescent layer over the first electrode layer; and a second electrode layer over the electroluminescent layer, wherein a portion of the source and drain electrode layers fills a pore of the conductive buffer layer including at least one pore, and wherein the conductive buffer layer is electrically connected to the semiconductor layer and the source and drain electrode layers.

16. A television device according to claim 15, further comprising a gate electrode layer and a gate insulating layer over the gate electrode layer.

17. A television device according to claim 15, wherein the conductive buffer layer including at least one pore is formed of a conductive oxide.

* * * * *

UNITED STATES PATENT AND TRADEMARK OFFICE
CERTIFICATE OF CORRECTION

PATENT NO. : 7,582,904 B2　　　　　　　　　　　　　　　　　　　　　　　　Page 1 of 1
APPLICATION NO. : 11/271800
DATED : September 1, 2009
INVENTOR(S) : Fujii et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 901 days.

Signed and Sealed this

Fourteenth Day of September, 2010

David J. Kappos
*Director of the United States Patent and Trademark Office*